(12) United States Patent
Komatsu et al.

(10) Patent No.: US 10,920,120 B2
(45) Date of Patent: *Feb. 16, 2021

(54) CERIA COMPOSITE PARTICLE DISPERSION, METHOD FOR PRODUCING SAME, AND POLISHING ABRASIVE GRAIN DISPERSION COMPRISING CERIA COMPOSITE PARTICLE DISPERSION

(71) Applicant: JGC CATALYSTS AND CHEMICALS LTD., Kawasaki (JP)

(72) Inventors: Michio Komatsu, Kitakyushu (JP);
Yuji Tawarazako, Kitakyushu (JP);
Shinya Usuda, Kitakyushu (JP);
Kazuhiro Nakayama, Kitakyushu (JP);
Shota Kawakami, Kitakyushu (JP)

(73) Assignee: JGC CATALYSTS AND CHEMICALS LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/342,415

(22) PCT Filed: Oct. 6, 2017

(86) PCT No.: PCT/JP2017/036516
§ 371 (c)(1),
(2) Date: Apr. 16, 2019

(87) PCT Pub. No.: WO2018/088088
PCT Pub. Date: May 17, 2018

(65) Prior Publication Data
US 2019/0248668 A1   Aug. 15, 2019

(30) Foreign Application Priority Data

Nov. 14, 2016 (JP) .............................. JP2016-221747
Jan. 27, 2017 (JP) .............................. JP2017-013189

(51) Int. Cl.
*C09K 3/14* (2006.01)
*C09G 1/02* (2006.01)
(Continued)

(52) U.S. Cl.
CPC ............ *C09K 3/1436* (2013.01); *B24B 37/00* (2013.01); *B24B 37/044* (2013.01); *C01B 33/14* (2013.01);
(Continued)

(58) Field of Classification Search
None
See application file for complete search history.

(56) References Cited

U.S. PATENT DOCUMENTS 5,938,837 A   8/1999 Hanawa et al.
2010/0081281 A1   4/2010 Babu et al.
(Continued)

FOREIGN PATENT DOCUMENTS

JP   2746861 B2   5/1998
JP   2009-078935 A   4/2009
(Continued)

OTHER PUBLICATIONS

Seung-Ho Lee et al., "Chemical mechanical polishing of thermal oxide films using silica particles coated with ceria", Journal of Materials Research, vol. 17, Issue 10, 2002, pp. 2744-2749.
(Continued)

*Primary Examiner* — Jiong-Ping Lu
(74) *Attorney, Agent, or Firm* — Oliff PLC

(57) ABSTRACT

A ceria composite particle dispersion has ceria composite particles having an average particle size of 50 to 350 nm and having the features described below. Each ceria composite particle has a mother particle, a cerium-containing silica layer on the surface thereof, and child particles dispersed inside the cerium-containing silica layer, the mother par-
(Continued)

ticles being amorphous silica-based and the child particles being crystalline ceria-based. The child particles have a coefficient of variation (CV value) in a particle size distribution of 14 to 40%. The ceria composite particles have a mass ratio of silica to ceria of 100:11-316. Only the crystal phase of ceria is detected when the ceria composite particles are subjected to X-ray diffraction. The average crystallite size of the crystalline ceria measured by subjecting the ceria composite particles to X-ray diffraction is 10 to 25 nm.

16 Claims, 7 Drawing Sheets

(51) Int. Cl.
*C01F 17/00* (2020.01)
*C01B 33/14* (2006.01)
*B24B 37/00* (2012.01)
*H01L 21/304* (2006.01)
*C01F 17/206* (2020.01)
*H01L 21/321* (2006.01)
*B24B 37/04* (2012.01)
*C09G 1/04* (2006.01)
*H01L 21/306* (2006.01)
*C09G 1/00* (2006.01)

(52) U.S. Cl.
CPC ............ *C01F 17/00* (2013.01); *C01F 17/206* (2020.01); *C09G 1/00* (2013.01); *C09G 1/02* (2013.01); *C09G 1/04* (2013.01); *C09K 3/1463* (2013.01); *H01L 21/304* (2013.01); *H01L 21/30625* (2013.01); *H01L 21/3212* (2013.01); *C01P 2002/60* (2013.01); *C01P 2002/72* (2013.01); *C01P 2004/03* (2013.01); *C01P 2004/04* (2013.01); *C01P 2004/52* (2013.01); *C01P 2004/62* (2013.01); *C01P 2004/64* (2013.01); *C01P 2006/22* (2013.01); *C09K 3/1409* (2013.01)

(56) References Cited

U.S. PATENT DOCUMENTS

| | | | |
|---|---|---|---|
| 2010/0163785 | A1 | 7/2010 | Kroell et al. |
| 2012/0299158 | A1* | 11/2012 | Shinoda .................. C09G 1/02 257/618 |
| 2013/0122705 | A1 | 5/2013 | Babu et al. |
| 2015/0069291 | A1 | 3/2015 | Jung |
| 2015/0252237 | A1 | 9/2015 | Ito et al. |
| 2016/0024350 | A1 | 1/2016 | Jung |
| 2018/0105428 | A1 | 4/2018 | Tawarazako et al. |

FOREIGN PATENT DOCUMENTS

| | | | | |
|---|---|---|---|---|
| JP | 2010-530011 A | | 9/2010 | |
| JP | 2012-503880 A | | 2/2012 | |
| JP | 2013-119131 A | | 6/2013 | |
| JP | 2015-54970 A | | 3/2015 | |
| JP | 2015231029 | * | 12/2015 | ............. B24B 37/00 |
| JP | 2016-127139 A | | 7/2016 | |
| WO | 2014/045939 A1 | | 3/2014 | |
| WO | WO2005035688 | * | 4/2015 | ............... C09K 3/14 |
| WO | 2016/159167 A1 | | 10/2016 | |

OTHER PUBLICATIONS

Nov. 7, 2017 International Search Report issued in International Patent Application No. PCT/JP2017/036516.
Apr. 23, 2020 European Extended Search Report issued in European Patent Application No. 17868653.1.
Zhao et al., "Synthesis, characterization of CeO2@SiO2 nanoparticles and their oxide CMP behavior," Microelectronic Engineering, vol. 87, pp. 1716-1720, 2010.

* cited by examiner (a)

(b)

(a)

(b)

(a)

(b)

CERIA COMPOSITE PARTICLE DISPERSION, METHOD FOR PRODUCING SAME, AND POLISHING ABRASIVE GRAIN DISPERSION COMPRISING CERIA COMPOSITE PARTICLE DISPERSION

TECHNICAL FIELD

The present invention relates to a ceria-based composite fine particle dispersion suitable as an abrasive that may be used to manufacture semiconductor devices or for other purposes. The present invention more specifically relates to a ceria-based composite fine particle dispersion for flattening a film formed on a substrate to be polished by means of chemical mechanical polishing (CMP), a method of manufacturing the same, and a polishing abrasive grain dispersion containing the ceria-based composite fine particle dispersion.

BACKGROUND ART

Semiconductor devices such as a semiconductor substrate and a circuit board realize high performance by achieving a higher density and finer design. So-called chemical mechanical polishing (CMP) is applied to the semiconductor manufacturing step, and is more specifically an essential technique for shallow trench isolation, flattening of an interlayer dielectric film, and formation of contact plugs and Cu damascene interconnects.

In general, an abrasive for CMP includes abrasive grains and chemical components, and the chemical components have a role in promoting polishing through oxidation or corrosion of a coating to be polished. On the other hand, the abrasive grains have a role in polishing through a mechanical action, and colloidal silica, fumed silica, and ceria particles are used as the abrasive grains. In particular, ceria particles show a specifically high polishing rate with respect to a silicon oxide film and are therefore applied to polish in a shallow trench isolation step.

Not only polishing of a silicon oxide film but also polishing of a silicon nitride film is performed in the shallow trench isolation step. In order to facilitate isolation, it is desirable to have a high polishing rate for a silicon oxide film and a low polishing rate for a silicon nitride film, and the ratio between the polishing rates (selected ratio) is also important.

A method of obtaining a smooth surface or an extremely highly accurate surface having few scratches or flaws has conventionally been performed as such a member polishing method by performing a comparatively coarse primary polishing process followed by a fine secondary polishing process.

For instance, methods to be described below have conventionally been proposed for the abrasive that may be used in secondary polishing as such finish polishing.

For instance, Patent Document 1 describes a method of manufacturing cerium oxide ultrafine particles (average particle size: 10 to 80 nm) which are formed of cerium oxide single crystals, including the steps of mixing, with stirring, an aqueous solution of cerous nitrate with a base at such a ratio that the pH value ranges from 5 to 10, then rapidly heating the resulting mixture to a temperature of 70 to 100° C., and aging the mixture at that temperature. Patent Document 1 further describes that this manufacturing method can provide cerium oxide ultrafine particles which are highly uniform in particle size and particle shape.

Non-Patent Document 1 discloses a method of manufacturing ceria-coated silica including manufacturing steps which are similar to those of the method of manufacturing cerium oxide ultrafine particles as described in Patent Document 1. The method of manufacturing ceria-coated silica does not have a burning-dispersion step which is included in the manufacturing method described in Patent Document 1.

Further, Patent Document 2 describes silica-based composite particles including, on surfaces of amorphous silica particles A, a crystalline oxide layer B containing one or more elements selected from zirconium, titanium, iron, manganese, zinc, cerium, yttrium, calcium, magnesium, fluorine, lanthanum, and strontium. Patent Document 2 also describes, as a preferred embodiment, silica-based composite particles including amorphous silica particles A; an amorphous oxide layer C which is formed on surfaces of the amorphous silica particles A, contain elements such as aluminum, and is different from an amorphous silica layer; and a crystalline oxide layer B which is formed on the amorphous oxide layer C and contains one or more elements selected from zirconium, titanium, iron, manganese, zinc, cerium, yttrium, calcium, magnesium, fluorine, lanthanum, and strontium. Patent Document 2 also describes that the silica-based composite particles described above have the crystalline oxide layer B on the surfaces of the amorphous silica particles A to enable improvement of the polishing rate, the silica particles are pre-treated to suppress sintering between the particles during burning, thereby enabling improvement of the dispersibility in a polishing slurry, and further non-use of cerium oxide or considerable reduction of the amount of cerium oxide used can be achieved to thereby provide an inexpensive abrasive having high polishing performance. Patent Document 2 also describes that the silica-based composite particles further having the amorphous oxide layer C between the silica-based particles A and the oxide layer B are particularly effective in suppressing particle sintering and in improving the polishing rate.

CITATION LIST

Patent Documents

Patent Document 1: JP 2,746,861 B
Patent Document 2: JP 2013-119131 A

Non-Patent Documents

Non-Patent Document 1: Seung-Ho Lee, Zhenyu Lu, S. V. Babu and Egon Matijevic, "Chemical mechanical polishing of thermal oxide films using silica particles coated with ceria", Journal of Materials Research, Volume 17, Issue 10, 2002, pp 2744-2749

SUMMARY OF THE INVENTION

Problem to be Solved by the Invention

However, the inventors of the present invention have actually prepared and examined the cerium oxide ultrafine particles described in Patent Document 1 and found that the polishing rate is low and a polished substrate surface is further more likely to have defects (deteriorated surface accuracy, increased number of scratches, and an abrasive remaining on the polished substrate surface).

The inventors of the present invention assume that this is mainly because, as compared to a method of manufacturing ceria particles including a burning step (burning increases the degree of crystallinity of ceria particles), the method of manufacturing cerium oxide ultrafine particles as described in Patent Document 1 does not include a burning step but only crystallizes cerium oxide particles with a liquid phase (aqueous solution containing cerous nitrate) and produced cerium oxide particles have therefore a relatively low degree of crystallinity, and cerium oxide does not adhere to mother particles for lack of burning treatment and remains on a polished substrate surface.

Further, the ceria-coated silica described in Non-Patent Document 1 is not burned and the actual polishing rate is therefore deemed to be low. Furthermore, the ceria-coated silica is not integrated with silica particles through adhesion and therefore comes off easily to decrease the polishing rate and lacks in polishing stability. There is also a concern about particles that may remain on a polished substrate surface.

The inventors of the present invention further found that polishing with the use of the silica-based composite particles in the embodiment including the oxide layer C as described in Patent Document 2 may cause impurities such as aluminum to remain on surfaces of a semiconductor device to adversely affect the semiconductor device.

Further, the ceria particles described in these documents adhere onto mother particles and are easily detached from the mother particles because they do not adhere firmly.

In addition, when polishing is performed using abrasive grains each having crystalline ceria particles formed on a perfectly spherical silica mother particle as described in Patent Document 2, a high silica film polishing rate is achieved by a chemical reaction that takes place simultaneously with a mechanical action of the ceria particles during polishing. However, ceria crystals may be detached, worn out or broken under a high pressure condition to reduce the area of contact between a substrate and ceria, leading to a reduced polishing rate.

The present invention has been made to solve the problems as described above. More specifically, the present invention aims at providing a ceria-based composite fine particle dispersion capable of polishing even a silica film, an Si wafer, and a hard-to-work material at a high rate, simultaneously achieving a high degree of surface accuracy (a small number of scratches, a small number of residual abrasive grains on a substrate, improved substrate Ra value and the like), and further being preferably used in polishing surfaces of semiconductor devices such as a semiconductor substrate and a circuit board when impurities are not contained, a method of manufacturing the same, and a polishing abrasive grain dispersion containing the ceria-based composite fine particle dispersion.

Means for Solving the Problem

The inventors of the present invention have made an intensive study to solve the problems described above and completed the present invention.

The present invention provides the following (1) and (15).
(1) A ceria-based composite fine particle dispersion including ceria-based composite fine particles having an average particle size of 50 to 350 nm and having characteristic features of [1] to [5]:
[1] each of the ceria-based composite fine particles includes a mother particle having a core particle, a cerium-containing silica layer on a surface of the mother particle, and child particles dispersed inside the cerium-containing silica layer, the core particle is primarily composed of amorphous silica, and the child particles are primarily composed of crystalline ceria;
[2] the child particles have a coefficient of variation (CV value) of 14 to 40% in their particle size distribution;
[3] the ceria-based composite fine particles have a mass ratio between silica and ceria of 100:11 to 316;
[4] a ceria crystal phase is only detected when the ceria-based composite fine particles are subjected to X-ray diffractometry; and
[5] an average crystallite size of the crystalline ceria, as measured by subjecting the ceria-based composite fine particles to X-ray diffractometry, is 10 to 25 nm.
(2) The ceria-based composite fine particle dispersion according to (1) above including the ceria-based composite fine particles further having a characteristic feature of [6]:
[6] silicon atoms enter into solid solution in the crystalline ceria included in the child particles.
(3) The ceria-based composite fine particle dispersion according to (2) above, wherein as for cerium atoms and silicon atoms included in the child particles, a relationship of $R_1<R_2$ (where $R_1$ is a distance between cerium and silicon atoms, and $R_2$ is a distance between cerium atoms) is satisfied.
(4) The ceria-based composite fine particle dispersion according to any one of (1) to (3) above, wherein the ceria-based composite fine particles include coarse particles having a size of 0.51 µm or more, whose number measured on dry basis is 100,000,000 particles/cc or less.
(5) The ceria-based composite fine particle dispersion according to any one of (1) to (4) above, wherein impurities are contained in the ceria-based composite fine particles in amounts shown in (a) and (b):
(a) Na, Ag, Al, Ca, Cr, Cu, Fe, K, Mg, Ni, Ti, and Zn are contained in amounts of 100 ppm or less, respectively; and
(b) U, Th, Cl, $NO_3$, $SO_4$, and F are contained in amounts of 5 ppm or less, respectively.
(6) The ceria-based composite fine particle dispersion according to any one of (1) to (5) above, wherein the mother particle has the core particle and projections on its surface, and the projections are primarily composed of silica.
(7) The ceria-based composite fine particle dispersion according to (6) above, wherein each of the projections contained in the mother particle has a width of 5 to 25 nm.
(8) The ceria-based composite fine particle dispersion according to any one of (1) to (7) above, wherein when cation colloidal titration is performed, a streaming potential curve in which a ratio ($\Delta PCD/V$) between an amount of streaming potential change ($\Delta PCD$) and an amount of cation colloidal titrant added at a knick (V) as expressed by formula (1) is in a range of −110.0 to −15.0 is obtained:

$$\Delta PCD/V=(I-C)/V \quad \text{formula (1)}$$

C: streaming potential (mV) at the knick
I: streaming potential (mV) at a starting point of the streaming potential curve; and
V: amount of the cation colloidal titrant added at the knick (ml).
(9) A polishing abrasive grain dispersion including the ceria-based composite fine particle dispersion according to any one of (1) to (8) above.
(10) The polishing abrasive grain dispersion according to (9) above, wherein the polishing abrasive grain dispersion is used for flattening a semiconductor substrate having a silica film formed thereon.
(11) A method of manufacturing a ceria-based composite fine particle dispersion including Steps 1 to 3:
Step 1: a step which includes stirring a silica-based fine particle dispersion containing silica-based fine particles dispersed in a solvent; and continuously or discontinuously adding a cerium metal salt while keeping a temperature at 0 to 20° C., a pH at 7.0 to 9.0 and an oxidation-reduction potential at 50 to 500 mV, respectively, thereby obtaining a precursor particle dispersion containing precursor particles;

Step 2: a step which includes drying the precursor particle dispersion; burning the dried precursor particle dispersion at 950 to 1,200° C. to obtain a burned body; and subjecting the resulting burned body to wet grinding at a pH of 8.6 to 10.8 after addition of a solvent to the burned body, thereby obtaining a dispersion including a burned and ground body: and Step 3: a step which includes subjecting the dispersion including the burned and ground body to centrifugation at a relative centrifugal acceleration of 300 G or more; and subsequently removing precipitated components to obtain the ceria-based composite fine particle dispersion.

(12) The method of manufacturing the ceria-based composite fine particle dispersion according to (11) above, wherein Step 1 is a step which includes stirring the silica-based fine particle dispersion; continuously or discontinuously adding the cerium metal salt while keeping the temperature at 0 to 20° C., the pH at 7.0 to 9.0 and the oxidation-reduction potential at 50 to 500 mV, respectively; and thereafter continuously or discontinuously adding the cerium metal salt while keeping the temperature at 20° C. or more but 98° C. or less, the pH at 7.0 to 9.0 and the oxidation-reduction potential at 50 to 500 mV, respectively, thereby obtaining the precursor particle dispersion.

(13) The method of manufacturing the ceria-based composite fine particle dispersion according to (11) or (12) above, wherein Step 1 is a step which includes stirring the silica-based fine particle dispersion; continuously or discontinuously adding the cerium metal salt while keeping the temperature at 20° C. or more but 98° C. or less, the pH at 7.0 to 9.0 and the oxidation-reduction potential at 50 to 500 mV, respectively; and thereafter continuously or discontinuously adding the cerium metal salt while keeping the temperature at 0 to 20° C., the pH at 7.0 to 9.0 and the oxidation-reduction potential at 50 to 500 mV, respectively, thereby obtaining the precursor particle dispersion.

(14) The method of manufacturing the ceria-based composite fine particle dispersion according to any one of (11) to (13) above, wherein impurities are contained in the silica-based fine particles in Step 1 in amounts shown in (a) and (b):

(a) Na, Ag, Al, Ca, Cr, Cu, Fe, K, Mg, Ni, Ti, and Zn are contained in amounts of 100 ppm or less, respectively; and
(b) U, Th, Cl, $NO_3$, $SO_4$, and F are contained in amounts of 5 ppm or less, respectively.

(15) The method of manufacturing the ceria-based composite fine particle dispersion according to any one of (11) to (14) above, wherein Step 1 is a step which includes stirring the silica-based fine particle dispersion containing the silica-based fine particles having projections with a width of 5 to 25 nm on their surfaces and dispersed in a solvent; and continuously or discontinuously adding the cerium metal salt while keeping the temperature at 3 to 20° C., the pH at 7.0 to 9.0 and the oxidation-reduction potential at 50 to 500 mV, respectively, thereby obtaining the precursor particle dispersion containing the precursor particles and in which the ceria-based composite fine particle dispersion according to (6) or (7) above is obtained.

Effect of the Invention

When used, for example, for polishing as a polishing abrasive grain dispersion, the ceria-based composite fine particle dispersion of the invention can polish even hard-to-work materials including a silica film and an Si wafer at a high rate, and simultaneously achieve a high degree of surface accuracy (a small number of scratches, low surface roughness (Ra) of a polished substrate and the like). The method of manufacturing the ceria-based composite fine particle dispersion according to the invention provides a method of efficiently manufacturing a ceria-based composite fine particle dispersion having the excellent performance described above.

The method of manufacturing the ceria-based composite fine particle dispersion according to the invention can also considerably reduce impurities contained in the ceria-based composite fine particles to achieve a higher purity. The higher-purity ceria-based composite fine particle dispersion obtained by a preferred embodiment of the method of manufacturing the ceria-based composite fine particle dispersion of the invention contains no impurities and can be therefore preferably used to polish surfaces of semiconductor devices such as semiconductor substrates and circuit boards.

Further, the ceria-based composite fine particle dispersion of the invention is effective in flattening semiconductor device surfaces when used as the polishing abrasive grain dispersion, and is particularly suitable for polishing a substrate having a silica insulating film formed thereon.

DESCRIPTION OF EMBODIMENTS

Figure 1:
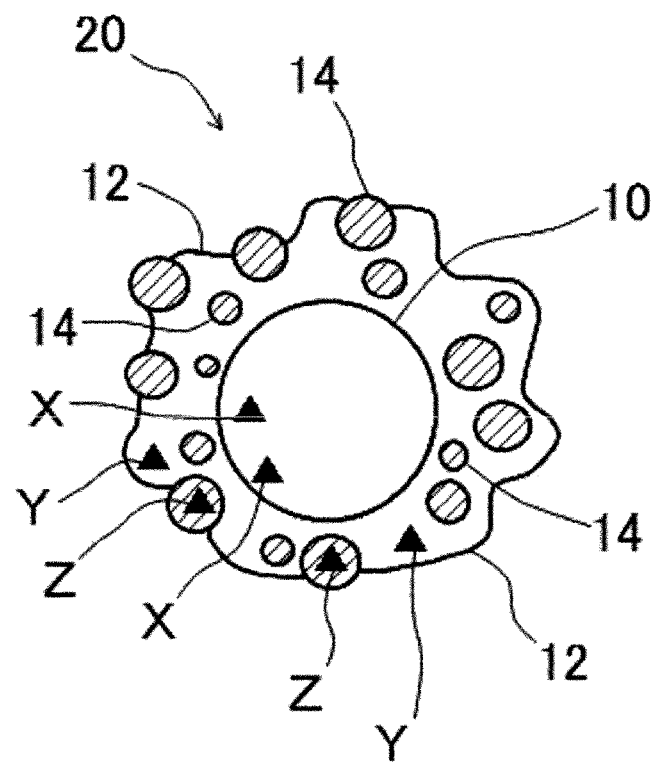
FIG. 1 are each a schematic cross-sectional view of a composite fine particle of the invention.
Figure 1:
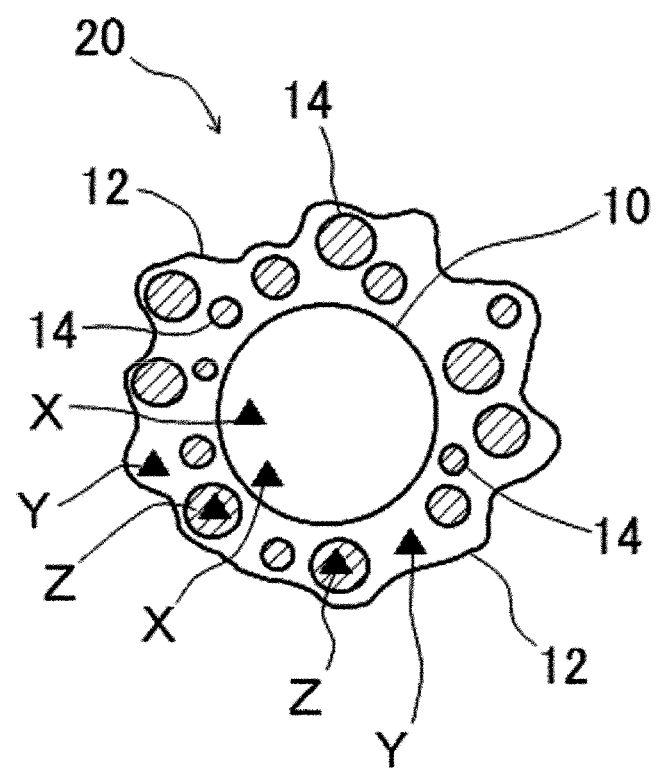

The present invention is now described.

The present invention provides a ceria-based composite fine particle dispersion including ceria-based composite fine particles having an average particle size of 50 to 350 nm and having characteristic features of [1] to [5]:

[1] each of the ceria-based composite fine particles includes a mother particle having a core particle, a cerium-containing silica layer on a surface of the mother particle, and child particles dispersed inside the cerium-containing silica layer, the core particle is primarily composed of amorphous silica, and the child particles are primarily composed of crystalline ceria;

[2] the child particles have a coefficient of variation (CV value) of 14 to 40% in their particle size distribution;

[3] the ceria-based composite fine particles have a mass ratio between silica and ceria of 100:11 to 316;

[4] a ceria crystal phase is only detected when the ceria-based composite fine particles are subjected to X-ray diffractometry; and

[5] an average crystallite size of the crystalline ceria, as measured by subjecting the ceria-based composite fine particles to X-ray diffractometry, is 10 to 25 nm.

The ceria-based composite fine particles having an average particle size of 50 to 350 nm and having the characteristic features of [1] to [5] are hereinafter referred to also as "composite fine particles of the invention."

The ceria-based composite fine particle dispersion as described above is hereinafter referred to also as "dispersion of the invention."

The present invention also provides a method of manufacturing a ceria-based composite fine particle dispersion including Steps 1 to 3 described below:

Step 1: a step which includes stirring a silica-based fine particle dispersion containing silica-based fine particles dispersed in a solvent; and continuously or discontinuously adding a cerium metal salt while keeping a temperature at 0 to 20° C., a pH at 7.0 to 9.0 and an oxidation-reduction potential at 50 to 500 mV, respectively, thereby obtaining a precursor particle dispersion containing precursor particles;

Step 2: a step which includes drying the precursor particle dispersion; burning the dried precursor particle dispersion at 950 to 1,200° C. to obtain a burned body; and subjecting the resulting burned body to wet grinding at a pH of 8.6 to 10.8 after addition of a solvent to the burned body, thereby obtaining a dispersion including a burned and ground body: and Step 3: a step which includes subjecting the dispersion including the burned and ground body to centrifugation at a relative centrifugal acceleration of 300 G or more; and subsequently removing precipitated components to obtain the ceria-based composite fine particle dispersion.

The relative centrifugal acceleration is expressed by a ratio with respect to the acceleration of gravity on the earth denoted by 1 G.

The manufacturing method as described above is hereinafter referred to also as "manufacturing method of the invention."

The dispersion of the invention is preferably manufactured by the manufacturing method of the invention.

The term "the invention" simply used in the following description refers to all of the dispersion of the invention, the composite fine particles of the invention, and the manufacturing method of the invention.

<Composite Fine Particles of the Invention>

The composite fine particles of the invention are now described.

The composite fine particles of the invention have a structure shown in FIG. 1. FIG. 1(a) and FIG. 1(b) are each a schematic cross-sectional view of a composite fine particle. FIG. 1(a) shows a type in which some of child particles are exposed outside, and FIG. 1(b) shows a buried type in which all of child particles are not exposed outside.

As shown in FIG. 1, a composite fine particle 20 of the invention has a mother particle 10, a cerium-containing silica layer 12 on a surface of the mother particle 10, and child particles 14 dispersed inside the cerium-containing silica layer 12.

Figure 2:
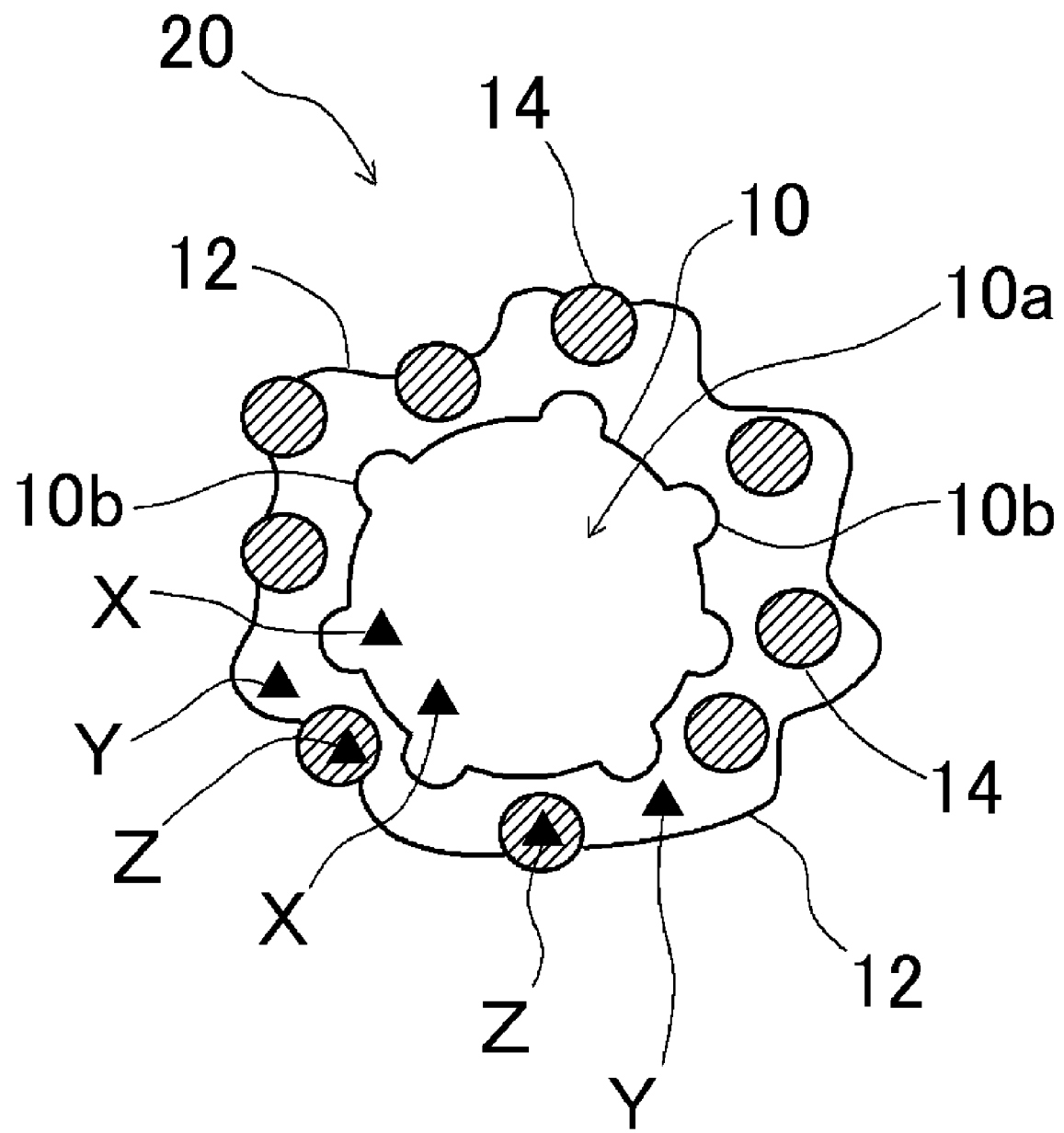
FIG. 2 is a schematic cross-sectional view of an embodiment included in the composite fine particles of the invention.

The composite fine particles of the invention may have a structure shown in FIG. 2. FIG. 2 is a schematic cross-sectional view (schematic view) in an embodiment included in the composite fine particles of the invention. As shown in FIG. 2, a composite fine particle 20 of the invention has a mother particle 10 having a core particle 10a and projections 10b on its surface, a cerium-containing silica layer 12 on a surface of the mother particle 10, and child particles 14 dispersed inside the cerium-containing silica layer 12.

Symbols ▲ in FIGS. 1 and 2 illustrate measurement points X to Z where TEM-EDS analysis to be described later is performed.

Regarding the mechanism by which the cerium-containing silica layer is formed in the composite fine particles of the invention, and the mechanism by which child particles are present in a dispersed manner inside the cerium-containing silica layer, the inventors of the invention assume as described below.

For instance, when a cerium salt solution and an alkali are added in parallel to a silica-based fine particle dispersion (silica sol) obtained by adding ammonia to tetraethyl orthosilicate $(Si(OC_2H_5)_4)$ and performing operations of hydrolysis and polycondensation, or to a silica-based fine particle dispersion obtained by performing operations of neutralization of water glass, desalting, and removal of impurities, the cerium salt solution is neutralized. As a result, silanol groups at the surfaces of silica-based fine particles react with a product (cerium hydroxide or the like) obtained by neutralizing the cerium salt solution to thereby form, for instance, a layer containing $CeO_2 \cdot SiO_2 \cdot SiOH$, and $CeO_2$ ultrafine particles (particle size: 2.5 nm or more but less than 10 nm) (this layer is hereinafter referred to also as "$CeO_2$ ultrafine particle-containing layer" and includes the $CeO_2$ ultrafine particles and the cerium silicate layer) on the surfaces of the silica-based fine particles through a compound such as $Ce(OH) \cdot Si(OH)$. Cerium atoms phase-separated from the cerium silicate layer in the burning step are deposited onto the $CeO_2$ ultrafine particles formed on the surfaces of the silica-based fine particles to cause ceria particles to grow. In order that the ceria particles have a sufficient crystal size (10 to 25 nm) to achieve the required polishing rate, burning at a higher temperature is necessary when the crystallite size obtained by mixing is less than 2.5 nm. However, high temperature treatment causes silica formed by phase separation to serve as an adhesive, whereby the monocrystalline ceria-coated composite particles of the invention cannot be obtained by grinding in the posterior step.

In order to obtain the $CeO_2$ ultrafine particles having a particle size of 2.5 nm or more in the mixing step, the temperature of the silica-based fine particle dispersion at the time of adding a cerium salt is preferably 20° C. or less to suppress reaction with silica. In this process, some of the $CeO_2$ ultrafine particles are already crystallized without heating or aging by keeping the oxidation-reduction potential during mixing in a predetermined range. On the other hand, even when mixing at a temperature of 20° C. or more is followed by heating treatment and aging in a liquid phase, the $CeO_2$ ultrafine particles do not grow to a size of 2.5 nm or more and crystallization is also less likely to occur.

It is assumed that the surfaces of the silica-based fine particles are dissolved by the reaction between silanol groups at the surfaces of the silica-based fine particles and a product (cerium hydroxide or the like) obtained by neutralizing the cerium salt solution, and the dissolved surfaces are affected by oxygen or the like (derived from blown air) to be solidified to form the $CeO_2$ ultrafine particle-containing layer.

After that, when the $CeO_2$ ultrafine particle-containing layer is dried and burned at about 950 to 1,200° C., the $CeO_2$ ultrafine particles which are present inside the $CeO_2$ ultrafine particle-containing layer and have a particle size of 2.5 nm or more but less than 10 nm incorporate therein cerium atoms present in the cerium silicate layer to increase the particle size, thereby finally having crystalline ceria particles (ceria child particles) having grown to an average crystallite size of about 10 to 25 nm. The cerium silicate layer (for example, $CeO_2$—$SiO_2.SiOH$) is turned into the cerium-containing silica layer by thermal decomposition or thermal diffusion. Therefore, the crystalline ceria particles are present in a state of dispersion in the cerium-containing silica layer. The crystalline ceria particles (child particles) formed by such a mechanism are less likely to be aggregated together. A part of cerium contained in the cerium silicate layer is not turned into crystalline ceria particles but remain as such, and the cerium-containing silica layer is therefore formed.

When the mixing temperature exceeds 20° C. and the oxidation-reduction potential is kept in a predetermined range, the reactivity between cerium hydroxide or the like and silica-based fine particles is increased to considerably increase the amount of dissolved silica-based fine particles. As for the silica-based fine particles after mixing, for instance, the particle size is reduced about by half and the volume is reduced by 80 to 90%. Then, the dissolved silica is contained in the $CeO_2$ ultrafine particle-containing layer, and in the above-described example, the $CeO_2$ ultrafine particle-containing layer has a composition in which the silica concentration is about 40% and the ceria concentration is about 60%, and the ratio of silica in the $CeO_2$ ultrafine particle-containing layer is increased. When the ceria child particles are grown to a crystal size of 10 to 25 nm by burning, cerium atoms phase-separated from the cerium silicate layer are deposited onto and grow the ceria child particles, and the ceria particles are coated with silica consequently generated by phase separation (diffusion) of the cerium atoms, whereby the ceria child particles are adhered to the mother particle silica and further covered with the silica coating. When the burning temperature is high, silica covering the ceria coated mother particles serves as an adhesive to promote aggregation of particles, whereby the particles cannot be ground to a monodisperse state in a subsequent grinding step. When the burning temperature is low, grinding is facilitated. However, ceria particles do not grow and a sufficient polishing rate is therefore not obtained.

Further, when the mixing temperature exceeds 20° C. and the oxidation-reduction potential is kept in a predetermined range, the crystallite size after mixing is reduced to 2.5 nm or less, and in order to grow the ceria child particles to a predetermined crystal size by burning, it is necessary to diffuse more cerium atoms from the cerium silicate layer, consequently increasing the silica concentration in the cerium silicate layer, and the silica coating that covers the child particles tends to be increased.

When the mixing temperature during the reaction between the silica-based fine particle dispersion and the cerium metal salt is 0 to 20° C. and the oxidation-reduction potential is kept in a predetermined range, the reactivity between cerium hydroxide or the like and silica-based fine particles is suppressed and the silica-based fine particles are not dissolved so much. As for the silica-based fine particles after mixing, for instance, the particle size is reduced by about 1 to 5% and the volume is reduced by about 3 to 15%. Therefore, in the above-described example, the $CeO_2$ ultrafine particle-containing layer has a composition in which the silica concentration is about 10% and the ceria concentration is about 90%, and the ratio of ceria in the $CeO_2$ ultrafine particle-containing layer is increased to form the cerium-containing silica layer after burning. Further, ceria after mixing has a crystal size of about 2.5 nm or more but less than 10 nm (for example, 6 to 8 nm) and the amount of cerium atoms diffused for crystal growth of the ceria child particles to a predetermined size through burning is therefore small and as a result, a large amount of cerium remains in the cerium silicate layer to cause crystal growth through burning at low temperatures, thereby obtaining ceria particles having a particle size of 10 to 25 nm. Therefore, the case of mixing at 0 to 20° C. has a form in which the cerium-containing silica layer is formed on the surfaces of the mother particles and the ceria child particles are dispersed in this layer.

When the ceria particles have a particle size of 10 nm or more in the mixing step, the ceria particles are aggregated together and uniform ceria particles are not disposed in a monodisperse manner on the surfaces of the mother particles and excellent polishing properties are therefore not obtained.

In general, the silica-based fine particles contained in the composite fine particles of the invention are more likely to have a projection-containing cross-sectional shape irrespective of the shape of the silica-based fine particles used as the material. In the cerium silicate layer formed by mixing, cerium atoms are dispersed by burning but a large part forms the cerium-containing silica layer where cerium atoms remain. On the other hand, the cerium atoms are almost diffused, and as a result, a region (silica) where the cerium concentration is considerably reduced also occurs. This region is inevitably more likely to be formed between ceria child particles, and is integrated with the mother particle or core particle to form a projection. Therefore, the mother particles contained in the composite fine particles are consequently more likely to have a projection-containing shape.

As is easily understood in the drawings of FIGS. 1 and 2, the mother particle 10, the cerium-containing silica layer 12, and the child particles 14 are shown so that they can be clearly distinguished from each other. However, it is assumed that the composite fine particles of the invention are formed by the mechanism as described above, and hence they are present in fact in an integrated manner, and it is difficult to clearly distinguish the mother particle 10, the cerium-containing silica layer 12, and the child particles 14 from each other except using contrast on STEM/SEM images or EDS analysis.

When the composite fine particles of the invention are subjected to cross-sectional STEM-EDS analysis to measure concentrations of Ce and Si elements, it can be confirmed that the composite fine particles have structures shown in FIGS. 1 and 2.

More specifically, when EDS analysis including selective irradiation of specified portions with electron beams using a scanning transmission electron microscope (STEM) is performed and the Ce and Si element concentrations are measured at cross-sectional measurement points X of the composite fine particles of the invention shown in FIGS. 1 and 2, the ratio (percentage) of the Ce molarity to the total of the Ce molarity and the Si molarity (Ce/(Ce+Si)×100) is less than 3%. When the Ce and Si element concentrations are measured at measurement points Z, the ratio (percentage) of the Ce molarity to the total of the Ce molarity and the Si molarity (Ce/(Ce+Si)×100) exceeds 50%. When the Ce and Si element concentrations are measured at measurement points Y, the ratio (percentage) of the Ce molarity to the total of the Ce molarity and the Si molarity (Ce/(Ce+Si)×100) is 3 to 50%.

Therefore, the mother particles 10 and the cerium-containing silica layer 12 in the composite fine particles of the invention can be distinguished from each other by a line where the ratio (percentage) of the Ce molarity to the total of the Ce molarity and the Si molarity (Ce/(Ce+Si)×100) is 3% on an elemental map obtained by STEM-EDS analysis. The cerium-containing silica layer 12 and the child particles 14 in the composite fine particles of the invention can also be distinguished from each other by a line where the ratio (percentage) of the Ce molarity to the total of the Ce molarity and the Si molarity (Ce/(Ce+Si)×100) is 50% on the elemental map obtained by STEM-EDS analysis.

In the specification, STEM-EDS analysis is performed by observing at 800,000×.

The composite fine particles of the invention are in the embodiments shown in FIG. 1 and FIG. 2. Therefore, according to the cross-sectional STEM-EDS analysis and elemental mapping, at least one layer having a relatively high ceria concentration (composed of ceria fine particles) is very often formed between the outermost shell of each composite fine particle and the mother particle (primarily composed of amorphous silica) located in the center.

<Core Particles>

The core particles are now described.

The core particle in each of the composite fine particles of the invention is included in the mother particle. The mother particle may be composed of the core particle. In other words, the mother particle may be the core particle. The mother particle may also be the core particle having projections formed on its surface.

The core particles are primarily composed of amorphous silica and are usually silica-based fine particles. Silica-based fine particles can be preferably used because spherical particles having a narrow particle size distribution width can be easily prepared and particles having a variety of particle sizes can be prepared.

For instance, a method described below can be used to confirm that the core particles are primarily composed of amorphous silica. When an X-ray diffraction pattern is obtained by, for instance, a conventionally known X-ray diffractometer (for example, RINT 1400 manufactured by Rigaku Corporation) after the dispersion containing the composite fine particles of the invention is dried and pulverized with a mortar, the X-ray diffraction pattern does not have peaks of crystalline silica such as Cristobalite. In this way, it can be confirmed that silica contained in the core particles are amorphous. In such a case, the core particles are deemed to be primarily composed of amorphous silica.

Drying of the dispersion of the invention and resin embedding are followed by sputter coating using Pt, and a conventionally known focused ion beam (FIB) device is used to form a cross-sectional sample. When an FFT pattern is obtained by subjecting, for instance, the formed cross-sectional sample to fast Fourier transform (FFT) analysis using a conventionally known TEM device, a diffraction diagram of crystalline silica such as Cristobalite does not appear. In this way, it can be confirmed that silica contained in the core particles is amorphous. In such a case, the core particles are deemed to be primarily composed of amorphous silica.

Another exemplary method includes a method which involves forming a cross-sectional sample in the same manner and observing as to whether there are lattice fringes due to the atomic arrangement of the mother particles using a conventionally known TEM device. When silica is crystalline, lattice fringes corresponding to the crystal structure are observed, while when silica is amorphous, no lattice fringes are observed. In this way, it can be confirmed that silica contained in the core particles is amorphous. In such a case, the core particles are deemed to be primarily composed of amorphous silica.

The average particle size of the core particles has a value which is smaller than the mother particles to be described later by a size of the projections. The same method as the method of measuring the average particle size of the mother particles to be described later is applied to measure the average particle size of the core particles.

The core particles preferably have a narrow average particle size distribution width.

The shape of the core particles is not particularly limited, and the core particles may have, for example, a spherical shape, a bale shape, a short fiber shape, a tetrahedral shape (triangular pyramid shape), a hexahedral shape, an octahedral shape, a plate-like shape, an amorphous shape, or a porous shape.

The core particles may have a spherical shape. The spherical shape means that the percentage of the number of particles having a ratio between their shorter diameter and longer diameter of 0.8 or less with respect to all the core particles is 10% or less. In the core particles, the percentage of the number of particles having a ratio between the shorter diameter and the longer diameter of 0.8 or less with respect to all the core particles is more preferably 5% or less and even more preferably 0%.

The ratio between the shorter diameter and the longer diameter is measured by the same method as the method (image analysis method) of measuring the ratio between the shorter diameter and the longer diameter of the composite fine particles of the invention to be described later. When projections primarily composed of silica are formed on spherical core particles having a narrow average particle size distribution width, mother particles also having a narrow average particle size distribution width are easily obtained.

<Projections>

The projections are now described.

The projections in each of the composite fine particles of the invention are included in the mother particle. However, the mother particle may not include the projections. In other words, the mother particle may only be composed of the core particle. The mother particle may also be the core particle having projections formed on its surface.

The projections are preferably bound to the surface of the core particle.

Figure 3:
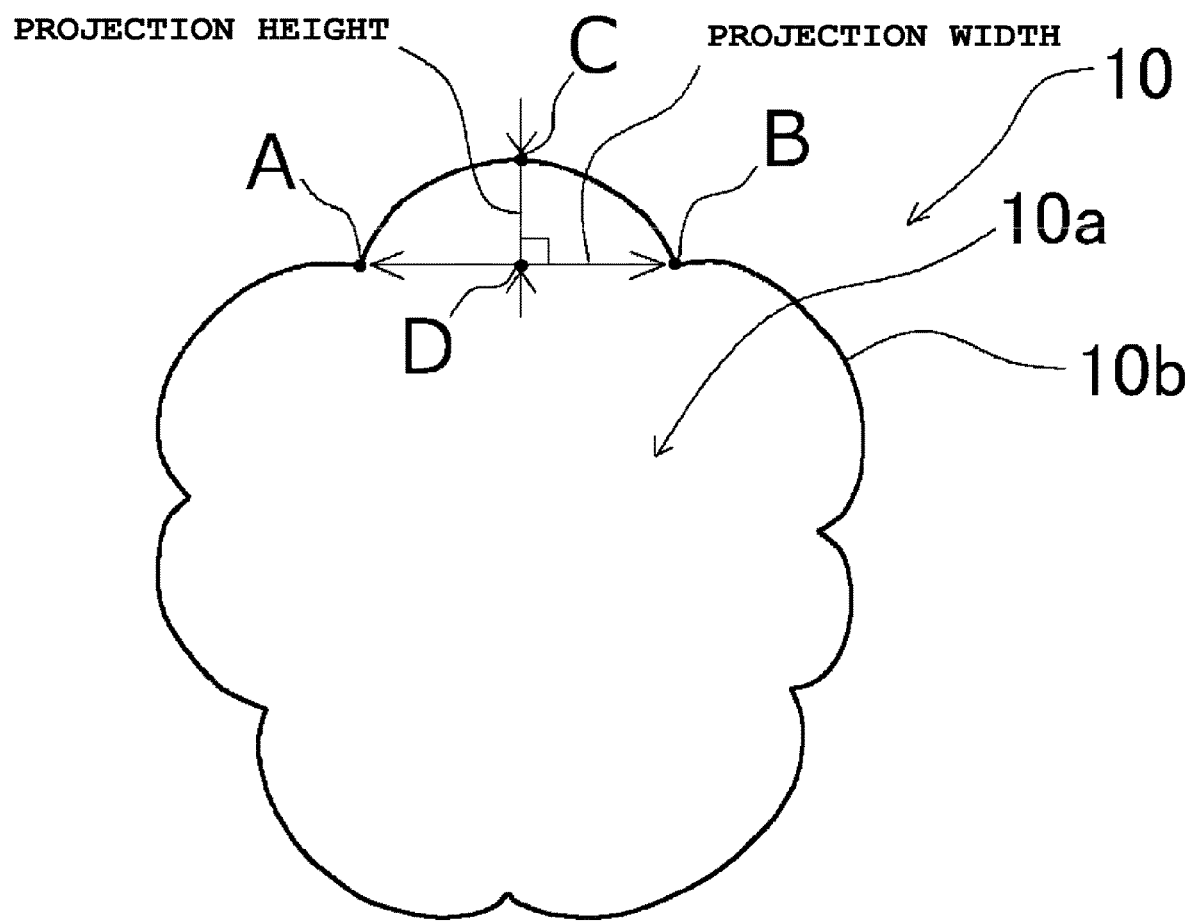
FIG. 3 is a schematic cross-sectional view of a mother particle in an embodiment included in the composite fine particles of the invention.

The projections in each of the composite fine particles of the invention are described with reference to FIG. 3. FIG. 3 is a schematic cross-sectional view of a mother particle in a composite fine particle of the invention. As described above, when a line where the ratio (percentage) of the Ce molarity to the total of the Ce molarity and the Si molarity (Ce/(Ce+Si)×100) is 3% is determined on an elemental map obtained by STEM-EDS analysis, a mother particle having a contour shape as shown in FIG. 3 can be obtained. When the start point and the end point of a curve indicating a projection are denoted by point A and point B, respectively, the length of a portion indicated by the curve AB does not exceed one-quarter of the circumferential length of a maximum circle inscribed in the projected outline of the contour of the mother particle.

The projections each have sufficiently small height and width as compared to the particle size of the composite fine particles of the invention.

The width of one projection means a linear distance between the point A and the point B shown in FIG. 3.

The width of the projections in the mother particles means a value obtained by simply averaging linear distance measurements of arbitrary 50 projections between the point A and the point B.

As shown in FIG. 3, the height of one projection means a maximum length of a line segment CD orthogonal to the line AB.

The height of the projections in the mother particles means a value obtained by simply averaging height measurements (maximum length of the line segment CD orthogonal to the linear line AB) of arbitrary 50 projections.

The shape of the projections are not particularly limited but the projections may have a particulate shape such as a tetrahedral shape or a spherical shape.

The projections may be crystalline or amorphous. Alternatively, a gel-like substance may adhere to the surface of the core particle to form the projections. The projections at the surface of the mother particle are preferably bound to the surface of the core particle.

This is because if the projections or a non-smooth face is included, differences in height of the child particles (differences in the distance connecting the center of the core particle with the outermost surface of each child particle) occur by forming the child particles on the surface of the core particle.

The projections preferably have a width of 5 to 25 nm. When the projection width is 25 nm or more, the child particles are more likely to be buried in the projections, and in this case, the polishing effect tends to be reduced. When the projection width is 5 nm or less, the effect obtained by the projections tends to be reduced.

The height of the projections is not particularly limited as long as the projections are higher in height than the surface of the core particle. It is preferably recommended to have a height of 5 to 25 nm.

The projections are preferably primarily composed of silica.

The expression "primarily composed of" means that the content is 90 mass % or more. In other words, the silica content in the projections is 90 mass % or more. The content is preferably 95 mass % or more, more preferably 98 mass % or more, and even more preferably 99.5 mass % or more.

In the description of the invention to be given below, unless otherwise specified, the expression "primarily composed of" is used for the meaning described above.

The projections are primarily composed of silica, which can be confirmed by analyzing the presence of Si components on the elemental map obtained by subjecting the projections to STEM-EDS analysis.

<Mother Particles>

The mother particles are now described.

The mother particle in each of the composite fine particles of the invention includes the core particle and may only be composed of the core particle.

The shape of the mother particles is not particularly limited, and the mother particles may have, for example, a spherical shape, a bale shape, a short fiber shape, a cocoon shape, a tetrahedral shape (triangular pyramid shape), a hexahedral shape, an octahedral shape, a plate-like shape, an amorphous shape, a porous shape, an okoshi (Japanese puffed rice cake)-like shape, a crenated shape, or a raspberry-like shape (projections or particulate portions are scattered over the surfaces of spherical particles or approximately spherical particles).

The mother particles may have a spherical shape. The spherical shape means that the above-described percentage of the number of particles having a ratio between their shorter diameter (DS) and longer diameter (DL) of 0.8 or less is 10% or less. The percentage of the particle number is determined by subjecting 50 mother particles to measurement. The percentage of the number of mother particles having a ratio between the shorter diameter and the longer diameter of 0.8 or less is more preferably 5% or less and even more preferably 0%.

When the mother particle in the composite fine particle of the invention is formed of a core particle and projections at its surface, it is assumed that the appearance has an okoshi-like shape, a crenated shape, or a raspberry-like shape (projections or particulate portions are scattered over the surfaces of spherical particles or approximately spherical particles).

Irrespective of the shape of the silica-based fine particles used as the material, the silica mother particles in the composite fine particles of the invention are likely to have a projection-containing cross-sectional shape such as an okoshi-like shape, a crenated shape, or a raspberry-like shape.

As described above, when the composite fine particles of the invention are subjected to STEM-EDS analysis to measure the Ce and Si element concentrations in the cross-sections of the composite fine particles of the invention shown in FIG. 1, each of the mother particles is in a portion where the ratio (percentage) of the Ce molarity to the total of the Ce molarity and the Si molarity (Ce/(Ce+Si)×100) is less than 3%.

As will be described later, the composite fine particles of the invention have an average particle size in the range of 50 to 350 nm and the mother particles have necessarily a smaller average particle size than 350 nm. In the present application, the average particle size of the mother particles is deemed to be the same as the average particle size of the silica-based fine particles contained in the silica-based fine particle dispersion used in Step 1 included in the manufacturing method of the invention to be described later. The composite fine particles of the invention in which the mother particles have an average particle size of 30 to 330 nm are advantageously used.

When the dispersion of the invention obtained by using the mother particles having an average particle size of 30 to 330 nm as its material is used as an abrasive, occurrence of scratches due to polishing is reduced. When the dispersion obtained using the mother particles having an average particle size of less than 30 nm is used as an abrasive, the polishing rate tends not to reach a practical level. When the mother particles have an average particle size exceeding 330 nm, the polishing rate also tends not to reach a practical level and such mother particles also tend to deteriorate the surface accuracy of the substrate to be polished. The mother particles more preferably have monodisperse properties.

The average particle size of the mother particles is measured as described below.

First, observation is performed by STEM-EDS analysis at 800,000× and a line where the ratio (percentage) of the Ce molarity to the total of the Ce molarity and the Si molarity (Ce/(Ce+Si)×100) is 3% is determined to specify the mother particles. Next, the maximum diameter of the mother particle is deemed as the major axis and its length is measured and the measured value is taken as a longer diameter (DL). A point dividing the major axis length on the major axis into two halves is determined. Two points of intersection of a line orthogonal to the major axis at the point with the periphery of the particle are determined, and the distance between the two points is measured and taken as a shorter diameter (DS). A geometric mean value of the longer diameter (DL) and the shorter diameter (DS) is determined and taken as the particle size of the mother particle.

The particle size of 50 mother particles is thus measured and a value obtained by simply averaging particle size measurements is taken as the average particle size.

When a mother particle is formed of a core particle and projections, the core particle is primarily composed of amorphous silica and has a considerably large mass as compared to the projections, and the mother particle is therefore primarily composed of amorphous silica.

The mother particles are primarily composed of amorphous silica and may contain other components, for example, La, Ce, and Zr in amounts of 10 mass % or less, respectively, or crystalline silica and impurity elements.

For instance, the elements of Na, Ag, Al, Ca, Cr, Cu, Fe, K, Mg, Ni, Ti, Zn, and Zr (hereinafter often referred to as "specific impurity group 1") are contained in the mother particles in amounts of desirably 5,000 ppm or less, desirably 1,000 ppm or less, preferably 100 ppm or less, more preferably 50 ppm or less, even more preferably 25 ppm or less, still more preferably 5 ppm or less, and even still more preferably 1 ppm or less, respectively. The elements of U, Th, Cl, $NO_3$, $SO_4$, and F (hereinafter often referred to as "specific impurity group 2") are preferably contained in the mother particles in amounts of 5 ppm or less, respectively.

The contents of the specific impurity group 1 or the specific impurity group 2 in the mother particles and the composite fine particles of the invention to be described below, and in the silica-based fine particles to be described later mean the contents with respect to the dry amount.

Each of the contents with respect to the dry amount means a value of the ratio (percentage) of the weight of a measured element (in the specific impurity group 1 or the specific impurity group 2) to the mass of solids contained in a measured object (mother particle, composite fine particle of the invention or the silica-based fine particle to be described later). If there is no incorporation due to contamination or the like, the impurities of the mother particles approximately coincide with the impurities of the silica-based fine particles.

The silica-based fine particles or silica fine particles generally prepared using water glass as a material contain the specific impurity group 1 and the specific impurity group 2 derived from the water glass used as the material in a total amount of about a few thousand ppm.

In the case of a dispersion containing the above-described silica-based fine particles or silica fine particles dispersed in a solvent, it is possible to perform ion exchange treatment to reduce the contents of the specific impurity group 1 and the specific impurity group 2. Also in such a case, however, the specific impurity group 1 and the specific impurity group 2 remain in a total amount of a few ppm to a few hundred ppm. Therefore, when the silica-based fine particles or silica fine particles prepared from the water glass material are used, impurities are also reduced by acid treatment or the like.

In contrast, in the case of a dispersion in which silica-based fine particles or silica fine particles synthesized from an alkoxysilane material are dispersed in a solvent, in general, the element contents in the specific impurity group 1 are preferably 100 ppm or less, and more preferably 20 ppm or less, respectively, and the element contents and the anion contents in the specific impurity group 2 are preferably 20 ppm or less, and more preferably 5 ppm or less, respectively.

In the invention, the amounts of Na, Ag, Al, Ca, Cr, Cu, Fe, K, Mg, Ni, Ti, Zn, Zr, U, Th, Cl, $NO_3$, $SO_4$, and F contained in the mother particles (core particles) are expressed by values determined through measurement using methods described below, respectively.

* Na and K: atomic absorption spectrometry
* Ag, Al, Ca, Cr, Cu, Fe, Mg, Ni, Ti, Zn, Zr, U, and Th: ICP-MS (inductively coupled plasma mass spectrometry)
* Cl: potentiometric titration
* $NO_3$, $SO_4$, and F: ion chromatography <Child Particles>

The child particles primarily composed of crystalline ceria in the composite fine particles of the invention (hereinafter referred to also as "ceria child particles") are dispersed in the cerium-containing silica layer formed on the mother particles.

A mother particle in a composite fine particle of the invention may contain a core particle and only include a core particle. However, when a mother particle in a composite fine particle of the invention has a core particle and projections on its surface, ceria child particles are mainly present in the form of (a), (b), or (c) described below:

(a) a form in which a child particle is bound to a projection of a mother particle through a part of a cerium-containing silica layer;

(b) a form in which a child particle is bound to both a projection and a projection-free portion in a mother particle through a part of a cerium-containing silica layer; and (c) a form in which a child particle is bound to a projection-free portion of a mother particle through a part of a cerium-containing silica layer.

These forms (a), (b), and (c) are desirably present simultaneously because when the dispersion of the invention is used as a polishing abrasive grain dispersion, each mother particle has an uneven surface and hence at the time of polishing, child particles in the form (a) first come into contact with a substrate to be polished and polishing is performed. Even if detachment, abrasion, or breakage of such child particles in the form (a) occurs due to polishing pressure, next ceria child particles in the form (b), and then ceria child particles in the form (c) come into contact with the substrate to be polished to enable the contact area to be kept at a high level, whereby efficient polishing can be performed at a stable polishing rate.

The dispersion of the invention containing the composite fine particles of the invention in which the child particles in these forms (a), (b), and (c) are present simultaneously can be easily obtained by the manufacturing method of the invention to be described below.

Further, the ceria child particles may be stacked in the cerium-containing silica layer. The shape is not particularly limited and examples thereof include a perfectly spherical shape, an elliptical shape, and a rectangular shape.

Furthermore, the particle size distribution may be uniform or sharp. The ceria child particles may each have an uneven surface due to mother particles having projections or a non-smooth shape formed therein.

Some of the ceria child particles are buried in the cerium-containing silica layer and others are partially exposed from the cerium-containing silica layer.

As described above, when the composite fine particles of the invention are subjected to STEM-EDS analysis to measure the Ce and Si element concentrations in the cross-sections of the composite fine particles of the invention shown in FIGS. 1 and 2, each child particle is in a portion where the ratio (percentage) of the Ce molarity to the total of the Ce molarity and the Si molarity (Ce/(Ce+Si)×100) exceeds 50%.

The child particles primarily composed of crystalline ceria in the invention are dispersed in the cerium-containing silica layer formed on the mother particles, and have a coefficient of variation (CV value) of 14 to 40% in their particle size distribution. Namely, the child particles have a large particle size distribution width. When the dispersion of the invention which contains the ceria child particles having such a large particle size distribution width is used as a polishing abrasive grain dispersion, at the beginning of polishing, child particles having a larger particle size come into contact with a substrate to be polished and polishing is performed. Then, even if detachment, abrasion, or breakage of such child particles occurs due to polishing pressure, next child particles having a smaller particle size come into contact with the substrate to be polished to enable the contact area to be kept at a high level, whereby efficient polishing can be performed at a stable polishing rate.

According to the invention, the child particles dispersed in the cerium-containing silica layer have a coefficient of variation (CV value) of 14 to 40%, preferably 16 to 35%, and more preferably 18 to 30% in their particle size distribution.

According to the invention, the average particle size distribution of the child particles is measured as described below.

First, the composite fine particles of the invention are observed at 800,000× by STEM-EDS analysis and a line where the ratio (percentage) of the Ce molarity to the total of the Ce molarity and the Si molarity (Ce/(Ce+Si)×100) is 50% is determined to specify the child particles. Next, the maximum diameter of the child particle is deemed as the major axis and its length is measured and the measured value is taken as a longer diameter (DL). A point dividing the major axis length on the major axis into two halves is determined. Two points of intersection of a line orthogonal to the major axis at the point with the periphery of the particle are determined, and the distance between the two points is measured and taken as a shorter diameter (DS). A geometric mean value of the longer diameter (DL) and the shorter diameter (DS) is determined and taken as the particle size of the child particle.

The particle size distribution can be obtained by measuring the particle size of 100 or more child particles in this way.

According to the invention, the coefficient of variation (CV value) of the child particles in their particle size distribution is calculated by obtaining a standard deviation and a number average value from the particle size distribution obtained as described above which is used as a population, then dividing the standard deviation by the number average value, and multiplying the resulting value by 100 (more specifically, standard deviation/number average value × 100).

The child particles preferably have an average particle size of 10 to 25 nm, and more preferably 14 to 23 nm.

When the child particles have an average particle size exceeding 25 nm, there is a tendency that sintering or coagulation of the precursor particles having such ceria child particles occurs after burning in Step 2 and grinding is also difficult. Such a ceria-based composite fine particle dispersion is not preferred because when used for polishing, the ceria-based composite fine particle dispersion causes scratches on a polished member. There is a tendency that, when also used for polishing, the child particles having an average particle size of less than 10 nm do not easily achieve a sufficient polishing rate for practical use.

According to the invention, the average particle size of the child particles means a number average value in the particle size distribution obtained as described above.

The child particles may be stacked. In other words, a plurality of child particles may be radially present from the center of the mother particle inside the cerium-containing silica layer.

Further, the child particles may be buried in the cerium-containing silica layer or be partially exposed to the outside of the cerium-containing silica layer. However, the child particles are desirably buried in the cerium-containing silica layer because when the child particles are buried in the cerium-containing silica layer, the surface of each ceria-based composite fine particle is made closer to the silica surface and therefore the storage stability and the polishing stability are improved and the amount of abrasive grains remaining on a polished substrate is reduced.

The shape of the child particles is not particularly limited. The child particles may have, for example, a perfectly spherical shape, an elliptical shape, or a rectangular shape. When the dispersion of the invention is used for polishing and a high polishing rate is to be obtained, the child particles preferably have a non-spherical shape and more preferably a rectangular shape.

The child particles dispersed in the cerium-containing silica layer disposed on the surfaces of the mother particles may be in a monodisperse state, a state in which the child particles are stacked on each other (namely, a state in which the plurality of child particles are stacked on each other in the thickness direction of the cerium-containing silica layer), or a state in which the plurality of child particles are linked together.

According to the invention, the child particles are primarily composed of crystalline ceria.

For instance, the dispersion of the invention is dried to obtain a solid and the obtained solid is pulverized with a mortar to obtain the composite fine particles of the invention, which are then subjected to X-ray analysis using a conventionally known X-ray diffractometer (for example, RINT 1400 manufactured by Rigaku Corporation). If a ceria crystal phase is only detected on an X-ray diffraction pattern obtained, it can be confirmed from this that the child particles are primarily composed of crystalline ceria. In such a case, the child particles are deemed to be primarily composed of crystalline ceria. The crystal phase of ceria is not particularly limited and an example thereof includes Cerianite.

The child particles are primarily composed of crystalline ceria (crystalline cerium oxide) and may contain other components, for example, elements other than cerium. Further, a hydrous cerium compound may be contained as a polishing co-catalyst.

However, as described above, the ceria crystal phase is only detected when the composite fine particles of the invention are subjected to X-ray diffractometry. In other words, even if a crystal phase other than ceria is included, the crystal phase other than ceria is out of detection range in X-ray diffractometry due to its low content or a solid solution in ceria crystals.

The average crystallite size of the ceria child particles is calculated using the full width at half maximum at a maximum peak that appears on the chart obtained by subjecting the composite fine particles of the invention to X-ray diffractometry. For instance, a (111) plane has an average crystallite size of 10 to 25 nm (full width at half maximum: 0.86 to 0.34°), preferably 14 to 23 nm (full width at half maximum: 0.62 to 0.37°), and more preferably 15 to 22 nm (full width at half maximum: 0.58 to 0.38°). In many cases, the (111) plane has a maximum peak intensity but another crystal plane, for example, a (100) plane may have a maximum peak intensity. The average crystallite size can be calculated in the same manner also in this case, and the average crystallite size in this case may be the same as the average crystallite size of the above-described (111) plane.

The (111) plane (2θ=around 28°) is taken as an example to describe below a method of measuring the average crystallite size of child particles.

First of all, the composite fine particles of the invention are pulverized with a mortar and an X-ray diffraction pattern is obtained by, for instance, a conventionally known X-ray diffractometer (for example, RINT 1400 manufactured by Rigaku Corporation). Then, the full width at half maximum of a peak of the (111) plane (2θ=around 28°) in the resulting X-ray diffraction pattern is measured and the average crystallite size can be determined by the Scherrer equation shown below:

$$D = K\lambda/\beta \cos\theta$$

D: average crystallite size (angstrom)
K: Scherrer constant (K=0.94 in this invention)
λ: X-ray wavelength (1.5419 angstroms, Cu lamp)
β: full width at half maximum (rad)
θ: angle of reflection In the composite fine particles of the invention, silicon atoms preferably enter into solid solution in the crystalline ceria as a main component of the child particles. The expression "enter into solid solution" generally means that two or more elements (which may be metal or non-metal elements) are dissolved in each other to form a uniform solid phase as a whole, and the solid solution obtained by this process is classified into a substitutional solid solution and an interstitial solid solution. A substitutional solid solution may easily take place between atoms having atomic radii close to each other. Ce and Si have atomic radii considerably different from each other and at least a substitutional solid solution is therefore less likely to take place. In the Cerianite crystal structure, the coordination number of Ce seen from the center of Ce is 8 but should be 7 when Si is, for instance, substituted with Ce at a ratio of 1:1. However, it is assumed that a preferred embodiment of the composite fine particles of the invention is of an interstitial type because analysis results of the preferred embodiment of the composite fine particles of the invention show that the average coordination number of Ce seen from the center of Ce is 8.0 and further the average coordination number of Si is 1.2. Furthermore, it is also assumed from the analysis results of the preferred embodiment of the composite fine particles of the invention that the preferred embodiment of the composite fine particles of the invention is of an interstitial solid solution type because the interatomic distance between Ce and Si is smaller than that between Ce and Ce. More specifically, as for cerium atoms and silicon atoms included in the child particles, a relationship of $R_1 < R_2$ (where $R_1$ is a distance between cerium and silicon atoms, and $R_2$ is a distance between cerium atoms) is preferably satisfied.

It has conventionally been known that, as compared to the case of using other inorganic oxide particles, a specifically high polishing rate is exhibited when polishing a silica film-coated substrate or a glass substrate using ceria particles as abrasive grains. It is pointed out that one of the reasons why the ceria particles exhibit a particularly high polishing rate on the silica film-coated substrate is that trivalent cerium contained in the ceria particles have high chemical reactivity with respect to the silica coating on the substrate to be polished. Cerium in cerium oxide may have valences of 3 and 4 but high-purity cerium oxide particles that may be used as a semiconductor abrasive are obtained through a process which includes burning a high-purity cerium salt such as cerium carbonate at a high temperature of 700° C. Therefore, cerium in burned type ceria particles mainly has a valence of 4 and the trivalent cerium content is not enough even if trivalent cerium is contained.

In the preferred embodiment of the composite fine particles of the invention, Si atoms are deemed to enter into interstitial solid solution in $CeO_2$ crystals in the child particles (ceria fine particles) present on the outermost surface side. It is assumed that Si atoms enter into solid solution to cause crystal distortion of $CeO_2$ crystals, whereby the number of oxygen defects is increased even through burning at high temperatures to generate a large amount of trivalent cerium which is chemically active to $SiO_2$, thus accelerating chemical reactivity of $CeO_2$, resulting in the high polishing rate as described above. Doping with La or Zr is also possible to increase the trivalent cerium content.

The interatomic distances of cerium atoms and silicon atoms expressed by $R_1$ and $R_2$, respectively, refer to average interatomic distances obtained by measurement according to the method to be described in Examples to be referred to later.

<Cerium-Containing Silica Layer>

The composite fine particles of the invention have the cerium-containing silica layer on the surfaces of the mother particles. The child particles are dispersed inside the cerium-containing silica layer.

By having such a structure, the child particles are less likely to come off under pressure during grinding or polishing at the time of manufacture, and even if some of the child particles come off, most of the child particles do not come off but are present in the ceria-containing silica layer and the polishing performance is therefore not reduced.

As described above, when the composite fine particles of the invention are subjected to STEM-EDS analysis to measure the Ce and Si element concentrations in the cross-sections of the composite fine particles of the invention shown in FIGS. 1 and 2, the cerium-containing silica layer is in a portion where the ratio (percentage) of the Ce molarity to the total of the Ce molarity and the Si molarity (Ce/(Ce+Si)×100) is 3 to 50%.

According to an image (TEM image) obtained through observation of the composite fine particles of the invention with a transmission electron microscope, an image of the child particles densely appears on the surfaces of the mother particles but a part of the cerium-containing silica layer appears as a relatively light image on the periphery and outside of the child particles, namely, on the surface side of the composite fine particles. It can be confirmed that the Si molarity is very high when the Si molarity and the Ce molarity of this portion are determined by subjecting the portion to STEM-EDS analysis. More specifically, the ratio (percentage) of the Ce molarity to the total of the Ce molarity and the Si molarity (Ce/(Ce+Si)×100) is 3 to 50%.

The cerium-containing silica layer preferably has an average thickness of 10 to 40 nm and more preferably 12 to 30 nm.

The average thickness of the cerium-containing silica layer is determined by drawing arbitrary twelve straight lines each connecting the center of the mother particle of the composite fine particle of the invention with its outermost shell, measuring the distance from the line where the ratio (percentage) of the Ce molarity to the total of the Ce molarity and the Si molarity (Ce/(Ce+Si)×100) is 3% and which is determined on an elemental map obtained by STEM-EDS analysis as described above to the outermost shell of the composite fine particle of the invention (distance on a line passing through the center of the mother particle), and simply averaging the measurements. The center of the mother particle means the point of intersection between the major axis and the minor axis as described above.

It is assumed that the cerium-containing silica layer in the composite fine particles of the invention promotes binding force between the child particles that have grown after dispersion in the cerium-containing silica layer in the burning step (ceria fine particles primarily composed of crystalline ceria) and the mother particles. Therefore, the ceria-based composite fine particle dispersion is obtained by, for instance, subjecting the dispersion including the burned and ground body obtained by burning to dry preliminary grinding when necessary in the step of obtaining the dispersion of the invention, then performing wet grinding, and further performing centrifugation, but it is deemed that the cerium-containing silica layer has the effect of preventing the child particles from being detached from the mother particles. In this case, there is no problem of local detachment of the child particles, and the whole surfaces of the child particles may not be coated with a part of the cerium-containing silica layer. The child particles need only have sufficient strength to prevent the child particles from being detached from the mother particles in the grinding step.

It is deemed that, when the dispersion of the invention is used as an abrasive, having such a structure is effective in having a high polishing rate and less deterioration in surface accuracy and scratches.

Further, in the composite fine particles of the invention, at least a part of the surface of each child particle is coated with the cerium-containing silica layer and —OH groups of silica are therefore present on the outermost layer (outermost shell) of each composite fine particle of the invention. Therefore, it is deemed that when used as an abrasive, the composite fine particles of the invention repel each other due to electric charges of —OH groups at the polished substrate surface, and as a result, are less attached to the polished substrate surface.

In general, ceria has a different potential from silica, a polished substrate and a polishing pad, and the negative zeta potential decreases while the pH changes from the alkaline range toward the vicinity of the neutral range, and a weakly acidic region has an opposite positive potential. Therefore, at the acidic pH in polishing, ceria is more likely to be attached to the polished substrate and the polishing pad due to differences in magnitude of the potential and the polarity, to thereby remain on the polished substrate and the polishing pad. On the other hand, the composite fine particles of the invention have silica at the outermost shell as described above, and the potential therefore has a negative charge due to silica, and the pH maintains a negative potential in the range from the alkaline pH to the acidic pH, and as a result, abrasive grains are less likely to remain on the polished substrate and the polishing pad. When grinding is performed while keeping the pH at 8.6 to 10.8 during grinding treatment in Step 2 in the manufacturing method of the invention, a part of silica (silica in the cerium-containing silica layer) at the surfaces of the composite fine particles of the invention is dissolved. The dissolved silica is deposited onto the composite fine particles (abrasive grains) of the invention by adjusting the dispersion of the invention manufactured under the conditions described above at a pH of less than 7 when applied to polishing. Therefore, the surfaces of the composite fine particles of the invention can have a negative potential. When the potential is low, a silicate may be added to appropriately reinforce the cerium-containing silica layer.

It is also possible to adjust the potential with an organic polymer such as polyacrylic acid in order to adjust the potential of the child particles. However, according to the invention, silica having softly adhered to the surfaces serves to adjust the potential, so that use of organic substances is reduced and substrate defects due to organic substances (residual organic substances) are less likely to occur. The silica having softly adhered to the surfaces is not subjected to a burning step and therefore forms a low-density, and easily soluble flexible silica layer. The easily soluble silica layer has an adhesive action relative to a substrate and has the effect of improving the polishing rate. The easily soluble silica layer can be confirmed by maintaining the dispersion of the invention at a pH of 9 and measuring the silica concentration in the solution after solid-liquid separation.

In the dispersion of the invention, silica is present in a variety of modes, and there are also cases in which silica does not make up the composite fine particles of the invention but is dispersed or dissolved in a solvent, or is present in a state of adhesion to the surfaces of the composite fine particles of the invention.

<Composite Fine Particles of the Invention>

The composite fine particles of the invention are now described.

As described above, the composite fine particles of the invention are characterized in that: [1] each of the ceria-based composite fine particles includes a mother particle having a core particle, a cerium-containing silica layer on a surface of the mother particle, and child particles dispersed inside the cerium-containing silica layer, the core particle is primarily composed of amorphous silica, and the child particles are primarily composed of crystalline ceria; [2] the child particles have a coefficient of variation (CV value) of 14 to 40% in their particle size distribution; [4] a ceria crystal phase is only detected when the ceria-based composite fine particles are subjected to X-ray diffractometry; and [5] an average crystallite size of the crystalline ceria, as measured by subjecting the ceria-based composite fine particles to X-ray diffractometry, is 10 to 25 nm.

The composite fine particles of the invention are further ceria-based composite fine particles having an average particle size of 50 to 350 nm, which are characterized in that [3] the ceria-based composite fine particles have a mass ratio between silica and ceria of 100:11 to 316.

The mass ratio between silica ($SiO_2$) and ceria ($CeO_2$) in the composite fine particles of the invention is 100:11 to 316, preferably 100:30 to 230, more preferably 100:30 to 150, and even more preferably 100:60 to 100:120. The mass ratio between silica and ceria is deemed to be approximately equal to the mass ratio between the mother particles and the child particles. If the amount of the child particles with respect to that of the mother particles is too small, the mother particles or the composite fine particles may be bound together to generate coarse particles. In such a case, the abrasive containing the dispersion of the invention (polishing slurry) may generate defects (reduction in surface accuracy including an increase in number of scratches) on a surface of a polished substrate. If the amount of ceria with respect to that of silica is too large, costs are not only increased but risk of resources is also increased. The particles are further bound together. As a result, this may cause troubles such as an increase in substrate surface roughness (an increase in surface roughness Ra), an increase in number of scratches, and further free ceria remaining on a substrate, and attachment to wastewater piping or the like of a polishing device.

Silica to be treated when calculating the above-described mass ratio between silica ($SiO_2$) and ceria ($CeO_2$) means all of silica ($SiO_2$) contained in the composite fine particles of the invention. Therefore, the silica amount means the total amount of the silica component making up the mother particles, the silica component contained in the cerium-containing silica layer formed on the surfaces of the mother particles, and the silica component that may be contained in the child particles.

The amounts (mass %) of silica ($SiO_2$) and ceria ($CeO_2$) contained in the composite fine particles of the invention are determined as follows: The solids concentration in the dispersion of the invention is first determined by weighing after loss on ignition at 1,000° C.

Next, the amount (mass %) of cerium (Ce) contained in a specified amount of the composite fine particles of the invention is determined by ICP plasma emission spectrometry and is calculated in terms of oxide mass % ($CeO_2$ mass % or the like). Then, $SiO_2$ mass % can be calculated assuming that the component other than $CeO_2$ making up the composite fine particles of the invention is $SiO_2$.

In the manufacturing method of the invention, the mass ratio between silica and ceria can also be calculated from the amounts of silica source materials and ceria source materials introduced to prepare the dispersion of the invention. This can be applied to a case which does not include a process in which ceria and silica are dissolved and removed, and in such a case, there is a good coincidence between the amounts of ceria and silica used, and analysis values.

The composite fine particles of the invention have an uneven surface because the cerium-containing silica layer is formed on and firmly bound to the surfaces of the mother particles, and the particulate crystalline ceria (child particles) is dispersed in the cerium-containing silica layer.

The particle size distribution of the composite fine particles of the invention may be of a particle-linked type or a monodisperse type but a particle-linked type is desirable because the area of contact with a substrate can be kept at a high level and the polishing rate is high. The particle-linked type means that two or more mother particles are bound to each other at a part of each particle, and up to 3 particles are preferably linked together. It is assumed that the mother particles are firmly bound together by making at least one (and preferably both) of the mother particles adhere at their contact points or having a solidification history through the intervention of ceria. The particle-linked type include a case in which mother particles are bound together and then a cerium-containing silica layer is formed on the surface thereof, and a case in which a cerium-containing silica layer is formed on the surface of a mother particle before the mother particle is bound to another mother particle.

The linked type allows a large area of contact with a substrate, whereby the polishing energy can be transmitted to the substrate with high efficiency. Therefore, the polishing rate is high.

The composite fine particles of the invention is preferably of a particle-linked type in which the percentage of the number of particles having a ratio between their shorter diameter and longer diameter, as measured by the image analysis method, of less than 0.80 (preferably 0.67 or less) is 45% or more.

It is deemed that particles having a ratio between their shorter diameter and longer diameter, as measured by the image analysis method, of less than 0.80 are of a particle-linked type.

The shape of the composite fine particles of the invention is not particularly limited but the composite fine particles may be of a particle-linked type or of a single particle (non-linked particle) type, and are usually of a mixed type thereof.

When the composite fine particle dispersion containing the composite fine particles is used for polishing and importance is to be placed on improvement of the polishing rate on a substrate to be polished, the percentage of the number of particles having a ratio between their shorter diameter and longer diameter, as measured by subjecting the composite fine particles to the image analysis method, of less than 0.80 (preferably 0.67 or less) is 45% or more (more preferably 51% or more).

When importance is likewise to be placed on a lower surface roughness level on a substrate to be polished, the percentage of the number of particles having a ratio between their shorter diameter and longer diameter, as measured by subjecting the composite fine particles to the image analysis method, of 0.80 or more (preferably 0.9 or more) is 40% or more, and more preferably 51% or more.

The particles of the particle-linked type mean particles (aggregated particles) in which chemical bonding occurs between particles to such an extent that redispersion is not possible to cause the particles to be linked together. The single particle means that a plurality of particles are not linked together and are not aggregated irrespective of the particle morphology.

When importance is to be placed on the improvement of the polishing rate on a substrate to be polished, Embodiment 1 described below can be illustrated as the composite fine particle dispersion of the invention.

Embodiment 1

Dispersion of the invention characterized in that the percentage of the number of particles having a ratio between their shorter diameter and longer diameter, as measured by subjecting the composite fine particles of the invention to the image analysis method, of less than 0.8 is further 45% or more.

When importance is to be placed on a lower surface roughness level on a substrate to be polished, Embodiment 2 described below can be illustrated as the composite fine particle dispersion of the invention.

Embodiment 2

Dispersion of the invention characterized in that the percentage of the number of particles having a ratio between their shorter diameter and longer diameter, as measured by subjecting the composite fine particles of the invention to the image analysis method, of 0.8 or more is further 40% or more.

A method of measuring the ratio between the shorter diameter and the longer diameter by means of the image analysis method is described. In a projection image obtained by shooting the composite fine particles of the invention with a transmission electron microscope at a magnification of 300,000× (or 500,000×), the maximum diameter of a particle is deemed as the major axis and its length is measured and the measured value is taken as a longer diameter (DL). A point dividing the major axis length on the major axis into two halves is determined. Two points of intersection of a line orthogonal to the major axis at the point with the periphery of the particle are determined, and the distance between the two points is measured and taken as a shorter diameter (DS). Then, the ratio between the shorter diameter and the longer diameter (DS/DL) is determined.

The percentage (%) of the number of particles having the ratio between the shorter diameter and the longer diameter of less than 0.80 or 0.80 or more is determined in arbitrary 50 particles observed in the projection image.

The composite fine particles of the invention are more preferably of the above-described particle-linked type but may have another shape, and contain, for example, spherical particles.

The number of coarse particles that may be contained in the dispersion of the invention and have a particle size of 0.51 µm or more, as measured by dry amount, is preferably 100,000,000 particles/cc or less. The number of coarse particles is preferably 100,000,000 particles/cc or less, and more preferably 80,000,000 particles/cc or less. Coarse particles having a particle size of 0.51 µm or more may cause flaws due to polishing and further deteriorate the surface roughness of the polished substrate. When the polishing rate is usually high, although the polishing rate is high, a large number of flaws tend to occur due to polishing to deteriorate the surface roughness of the substrate. However, when the composite fine particles of the invention are of the particle-linked type, a high polishing rate is obtained, and if the number of coarse particles having a particle size of 0.51 µm or more is 100,000,000 particles/cc or less, the number of flaws due to polishing can be reduced with a surface roughness improved to a low level.

The method of measuring the number of coarse particles that may be contained in the dispersion of the invention is as follows.

A sample is diluted with pure water to 0.1 mass %. A 5-ml portion is collected and poured into a conventionally known coarse particle number counter. Then, the number of coarse particles having a particle size of 0.51 µm or more is determined. This measurement is performed three times. A simple mean value is determined and is multiplied by 1,000. The resulting value is taken as a value of the number of coarse particles having a particle size of 0.51 µm or more.

The composite fine particles of the invention preferably have a specific surface area of 4 to 100 $m^2/g$, and more preferably 20 to 70 $m^2/g$.

A method of measuring the specific surface area (BET specific surface area) is now described.

First, a dried sample (0.2 g) is placed in a measurement cell and subjected to degassing treatment at 250° C. for 40 minutes in a nitrogen gas stream. The sample is maintained at the liquid nitrogen temperature in a gas mixture stream of 30 vol % nitrogen and 70 vol % helium to cause equilibrium adsorption of nitrogen onto the sample. Next, the temperature of the sample is gradually increased to room temperature while flowing the gas mixture, the amount of nitrogen detached during this process is detected, and the specific surface area of the sample is measured from a previously prepared calibration curve.

The BET specific surface area measuring method (nitrogen adsorption method) as described above can be performed using, for example, a conventionally known surface area measuring device.

Unless otherwise specified, the specific surface area in the invention means a value obtained through measurement using the method described above.

The composite fine particles of the invention preferably have an average particle size of 50 to 350 nm and more preferably 100 to 300 nm. The composite fine particles of the invention preferably have an average particle size ranging from 50 to 350 nm, because the polishing rate is increased when the composite fine particles are used as an abrasive.

The average particle size of the composite fine particles according to the invention means the number average value of the average particle size measured by the image analysis method.

A method of measuring the average particle size by means of the image analysis method is described. In a projection image obtained by shooting the composite fine particles of the invention with a transmission electron microscope at a magnification of 300,000× (or 500,000×), the maximum diameter of a particle is deemed as the major axis and its length is measured and the measured value is taken as a longer diameter (DL). A point dividing the major axis length on the major axis into two halves is determined. Two points of intersection of a line orthogonal to the major axis at the point with the periphery of the particle are determined, and the distance between the two points is measured and taken as a shorter diameter (DS). A geometric mean value of the longer diameter (DL) and the shorter diameter (DS) is determined and taken as the average particle size of the composite fine particles.

The average particle size of 50 or more composite particles is measured as described above to calculate their number average value.

The elements of the specific impurity group 1 are preferably contained in the composite fine particles of the invention in amounts of 100 ppm or less, respectively. The elements of the specific impurity group 1 are contained in the composite fine particles in amounts of more preferably 50 ppm or less, even more preferably 25 ppm or less, still more preferably 5 ppm or less, and even still more preferably 1 ppm or less, respectively.

The elements of the specific impurity group 2 are preferably contained in the composite fine particles of the invention in amounts of 5 ppm or less, respectively. The method described above can be applied as the method of reducing the amounts of the elements in the specific impurity group 1 and the specific impurity group 2 contained in the composite fine particles of the invention.

The amounts of the elements in the specific impurity group 1 and the specific impurity group 2 contained in the composite fine particles of the invention can be measured by the same method as in the case of measuring those in the specific impurity group 1 and the specific impurity group 2 contained in the above-described mother particles.

<Dispersion of the Invention>

The dispersion of the invention is now described.

The dispersion of the invention includes the above-mentioned composite fine particles of the invention dispersed in a dispersion solvent.

The dispersion of the invention contains water and/or an organic solvent as the dispersion solvent. Water such as pure water, ultrapure water, or ion exchanged water is preferably used as the dispersion solvent. Further, the dispersion of the invention is advantageously used as a polishing slurry by adding one or more additives for controlling the polishing performance, which are selected from the group consisting of a polishing accelerator, a surfactant, a pH adjuster, and a pH buffer.

An organic solvent can be used as the dispersion solvent included in the dispersion of the invention. Examples of the organic solvent include alcohols such as methanol, ethanol, isopropanol, n-butanol, and methyl isobutyl carbinol; ketones such as acetone, 2-butanone, ethyl amyl ketone, diacetone alcohol, isophorone, and cyclohexanone; amides such as N, N-dimethylformamide, and N,N-dimethylacetamide; ethers such as diethyl ether, isopropyl ether, tetrahydrofuran, 1,4-dioxane, and 3,4-dihydro-2H-pyran; glycol ethers such as 2-methoxyethanol, 2-ethoxyethanol, 2-butoxyethanol, and ethylene glycol dimethyl ether; glycol ether acetates such as 2-methoxyethyl acetate, 2-ethoxyethyl acetate, and 2-butoxyethyl acetate; esters such as methyl acetate, ethyl acetate, isobutyl acetate, amyl acetate, ethyl lactate, and ethylene carbonate; aromatic hydrocarbons such as benzene, toluene and xylene; aliphatic hydrocarbons such as hexane, heptane, isooctane, and cyclohexane; halogenated hydrocarbons such as methylene chloride, 1,2-dichloroethane, dichloropropane, and chlorobenzene; sulfoxides such as dimethyl sulfoxide; and pyrrolidones such as N-methyl-2-pyrrolidone, and N-octyl-2-pyrrolidone. These may be mixed with water for use.

The solids concentration in the dispersion of the invention is preferably in the range of 0.3 to 50 mass %.

When cation colloidal titration is performed, the dispersion of the invention preferably provides a streaming potential curve in which the ratio ($\Delta PCD/V$) between the amount of streaming potential change ($\Delta PCD$) and the amount of cation colloidal titrant added at a knick (V) as expressed by formula (1) is in the range of $-110.0$ to $-5.0$.

$$\Delta PCD/V = (I-C)/V \quad \text{formula (1)}$$

C: streaming potential (mV) at the knick
I: streaming potential (mV) at a starting point of the streaming potential curve; and
V: amount of the cation colloidal titrant added at the knick (ml).

Cationic colloidal titration is performed by adding the cation colloidal titrant to 80 g of the dispersion of the invention which is adjusted to a solids concentration of 1 mass %. A 0.001 N polydiallyldimethylammonium chloride solution is used as the cation colloidal titrant.

The streaming potential curve obtained by the cation colloidal titration is a graph that takes the amount (ml) of cationic titrant added on the x-axis and the streaming potential
(mV) of the dispersion of the invention on the y-axis.

The knick is a point (inflection point) where the streaming potential abruptly changes in the streaming potential curve obtained by the cation colloidal titration. Then, the streaming potential at the inflection point is denoted by C (mV) and the amount of cation colloidal titrant added at the inflection point is denoted by V (ml).

The starting point of the streaming potential curve shows a streaming potential in the dispersion of the invention before titration. More specifically, a point where the amount of cation colloidal titrant added is 0 is taken as the starting point. The streaming potential at the starting point is denoted by I (mV).

When $\Delta PCD/V$ has a value of $-110.0$ to $-5.0$, the polishing rate of an abrasive is further improved when the dispersion of the invention is used as the abrasive. It is deemed that $\Delta PCD/V$ reflects the degree to which the child particles are coated with the cerium-containing silica layer at the surfaces of the composite fine particles of the invention and/or the degree to which the child particles are exposed at the surfaces of the composite fine particles or the presence of easily detachable silica. The inventors of the invention assume that when $\Delta PCD/V$ has a value within the above-defined range, the child particles are less likely to be detached in wet grinding, and the polishing rate is also high. When $\Delta PCD/V$ has a larger absolute value than $-110.0$ to the contrary, the surfaces of the composite fine particles are entirely covered with the cerium-containing silica layer and the child particles are therefore less likely to come off in the grinding step. However, silica is less likely to be detached during polishing to reduce the polishing rate. On the other hand, it is deemed that the child particles are more likely to come off when $\Delta PCD/V$ has a smaller absolute value than $-5.0$. The inventors of the invention assume that when $\Delta PCD/V$ is within the above-defined range, the surfaces of the child particles are properly exposed during polishing, leading to less coming off of the child particles, and the polishing rate is further improved. $\Delta PCD/V$ is more preferably $-100.0$ to $-5.0$, and even more preferably $-100.0$ to $-10.0$.

When the pH value is in the range of 3 to 8, the dispersion of the invention preferably has a negative streaming potential before starting cation colloidal titration, that is, when the titer is 0. This is because when the streaming potential keeps a negative potential, the abrasive grains (ceria-based composite fine particles) are less likely to remain on a polished substrate also showing a negative surface potential.

<Manufacturing Method of the Invention>

The manufacturing method of the invention is now described. The manufacturing method of the invention includes Step 1 to Step 3 to be described below.

<Step 1>

A silica-based fine particle dispersion containing silica-based fine particles dispersed in a solvent is prepared in Step 1.

In this specification, "Step 1" is often called "mixing step."

Although there is no particular limitation in the embodiment of the silica-based fine particles, the silica-based fine particles preferably have the same average particle size and shape as those in the core particles described above. Further, the silica-based fine particles are primarily composed of amorphous silica as in the core particles described above. Herein, "primarily composed of" is also defined as in the case of the core particles.

In Step 1, a silica-based fine particle dispersion which contains silica-based fine particles each having 5 to 25 nm wide projections on its surface and dispersed in a solvent may be used as a material.

Even if the silica-based fine particles used as the material have any shape, the cross-sectional structure of the mother particles contained in the composite fine particles of the invention is in general more likely to have a projection-containing shape due to the generation mechanism of the composite fine particles of the invention, but when the silica-based fine particles used as the material have a projection-containing shape, projections are more easily formed.

Such silica-based fine particle dispersions and their manufacturing methods are known, for example, in JP 4,907,317 B, JP 4,963,825 B, JP 2009-78936 A, JP 5,137,521 B, JP 4,949,209 B, JP 2009-137791 A, JP 5,700,944 B, JP 5,860,587 B, JP 5,587,957 B and the like.

Of these, JP 2015-63451 A prepares a solution in which a silica fine particle dispersion primarily composed of silica having a narrow particle size distribution width is adjusted to a pH of 9 or less. Then, the solution is mixed with particles having a different potential, for example, particles having a particle size ten times smaller than that of the mother particles to form projections, and particles for forming the projections on the silica fine particles are aggregated by adjusting the pH to less than 6 for heteroaggregation. In this process, a binder for promoting particle binding, such as a silicate solution, water glass, or tetraalkoxysilane hydrolysate is preferably incorporated in advance.

JP 5,137,521 B prepares silica-based fine particles having a few nanometer silica projections by adding sodium aluminate to silica having a narrow particle size distribution width to form a silica alumina layer at a part of each surface, and further coating the silica alumina layer with silica. According to this method, the projections are less high than those in JP 2015-63451 A but the projections formed are firmly bound onto the silica fine particles.

Furthermore, J P 2010-58985 A prepares projection-containing silica-based fine particles by adding methyltrimethoxysilane to silica fine particles for hydrolysis to form a hydrolysate layer of the methyltrimethoxysilane at a part of the surface of each of the silica fine particles, and further forming a silica layer.

The average particle size of the silica-based fine particles is measured as described below.

First, ceria-based composite fine particles contained in the ceria-based composite fine particle dispersion obtained by the manufacturing method of the invention are collected and observed at 800,000× according to the STEM-EDS analysis, and a line where the ratio (percentage) of the Ce molarity to the total of the Ce molarity and the Si molarity (Ce/(Ce+Si)×100) is 3% is determined to specify silica-based fine particles. Next, the maximum diameter of the silica-based fine particle is deemed as the major axis and its length is measured and the measured value is taken as a longer diameter (DL). A point dividing the major axis length on the major axis into two halves is determined. Two points of intersection of a line orthogonal to the major axis at the point with the periphery of the particle are determined, and the distance between the two points is measured and taken as a shorter diameter (DS). A geometric mean value of the longer diameter (DL) and the shorter diameter (DS) is determined and taken as the particle size of the silica-based fine particle.

The particle size of 50 silica-based fine particles is thus measured and a value obtained by simply averaging particle size measurements is taken as the average particle size of the silica-based fine particles.

When it is clear from the charged materials or other composition analysis that there is clearly no line where (Ce/(Ce+Si)×100) is 3% or more, the EDS analysis may be omitted.

When the dispersion of the invention to be applied to polish a semiconductor device or the like is to be prepared by the manufacturing method of the invention, a silica-based fine particle dispersion in which silica-based fine particles prepared by hydrolyzing alkoxysilane are dispersed in a solvent is preferably used as the silica-based fine particle dispersion. When a conventionally known silica-based fine particle dispersion other than the above (silica-based fine particle dispersion prepared by using a water glass material or the like) is used as a material, the silica-based fine particle dispersion is preferably subjected to acid treatment and further deionization treatment before use. In this case, the amounts of Na, Ag, Al, Ca, Cr, Cu, Fe, K, Mg, Ni, Ti, Zn, U, Th, Cl, $NO_3$, $SO_4$, and F contained in the silica-based fine particles are reduced. More specifically, the amounts may be reduced to 100 ppm or less.

To be more specific, fine particles satisfying conditions (a) and (b) below are advantageously used as the silica-based fine particles in the silica-based fine particle dispersion serving as the material.
(a) Na, Ag, Al, Ca, Cr, Cu, Fe, K, Mg, Ni, Ti, and Zn are contained in amounts of 100 ppm or less, respectively; and
(b) U, Th, Cl, $NO_3$, $SO_4$, and F are contained in amounts of 5 ppm or less, respectively.

Particles of which the reactivity with cerium (the weight of the silica-based fine particles dissolved per ceria weight) is suitable are advantageously used as the silica-based fine particles. When the cerium metal salt is added in the mixing step in Step 1 according to the manufacturing method of the invention, a part of silica in the silica-based fine particles is dissolved in cerium hydroxide or the like to reduce the size of the silica-based fine particles, whereby a cerium-containing silica layer precursor containing cerium fine crystals is formed on the surfaces of the dissolved silica-based fine particles. When the silica-based fine particles are composed of amorphous silica having high reactivity with cerium, the cerium-containing silica layer precursor has a large thickness to increase the thickness of the cerium-containing silica layer formed by burning or the silica content in the layer is excessively increased to make grinding in the grinding step difficult. When the silica-based fine particles are composed of amorphous silica having excessively low reactivity with cerium, a cerium-containing silica layer is not sufficiently formed and the ceria child particles easily come off. When the reactivity with cerium is suitable, excessive dissolution of silica is suppressed and the cerium-containing silica layer has a suitable thickness to prevent the child particles from coming off, and grinding is facilitated because the strength is assumed to be higher than the strength between the composite fine particles. Accordingly, such a case is desirable.

In Step 1, a silica-based fine particle dispersion containing silica-based fine particles dispersed in a solvent is stirred; and a cerium metal salt is continuously or discontinuously added while keeping the temperature at 0 to 20° C., the pH at 7.0 to 9.0 and the oxidation-reduction potential at 50 to 500 mV, respectively, thereby neutralizing the cerium metal salt to obtain a precursor particle dispersion containing precursor particles.

When the silica-based fine particles have projections, the temperature of the silica-based fine particle dispersion at the time of adding the cerium metal salt is preferably 3 to 20° C.

The dispersion medium in the silica-based fine particle dispersion preferably contains water, and an aqueous silica-based fine particle dispersion (aqueous sol) is preferably used.

The solids concentration in the silica-based fine particle dispersion is preferably 1 to 40 mass % in terms of $SiO_2$. When the solids concentration is too low, the silica concentration in the manufacturing step is reduced, thus leading to lower productivity.

For instance, when the temperature of the reaction between the silica-based fine particles and the cerium metal salt in Step 1 is set to 40 to 50° C. in the manufacturing method of the invention, the reactivity between ceria and silica is increased to make dissolution of the silica-based fine particles to proceed. As a result, the particle size of the $CeO_2$ ultrafine particles in the precursor particles obtained by drying in the intermediate process in Step 2 is reduced to less than 2.5 nm. This indicates that, when silica is reacted with ceria in a liquid phase in the high temperature range, silica inhibits growth of ceria particles, whereby the average particle size of dried ceria is reduced to less than 2.5 nm.

It is possible to obtain ceria child particles having an average crystallite size of 10 nm or more from the precursor particles as described above by adjusting the burning temperature to 1,200° C. or more. In this case, however, there is a problem in that grinding is difficult because a cerium-containing silica layer is not formed but a silica coating is formed, and the ceria child particles are more likely to be firmly coated with the silica coating. Therefore, by suitably controlling the reaction between silica and ceria in a liquid phase while keeping the reaction temperature at 0 to 20° C., the average crystallite size of the $CeO_2$ ultrafine particles in the precursor particles after drying can be adjusted to 2.5 nm or more to have easily grinding particles. Because the average crystallite size after drying is large, the burning temperature to increase the average crystallite size of the ceria child particles to 10 nm or more can be reduced, whereby the thickness of the cerium-containing silica layer formed by burning is not excessively increased to facilitate grinding.

It is possible to extract impurities with a cation exchange resin, an anion exchange resin, a mineral acid or an organic acid and, if necessary, deionize the silica-based fine particle dispersion using an ultrafiltration membrane. The silica-based fine particle dispersion from which impurity ions were removed by deionization treatment is more preferred because a silicon-containing hydroxide is easily formed on its surface. The deionization treatment is not limited thereto.

In Step 1, the silica-based fine particle dispersion as described above is stirred, and the cerium metal salt is continuously or discontinuously added while keeping the temperature at 0 to 20° C., the pH at 7.0 to 9.0, and the oxidation-reduction potential at 50 to 500 mV, respectively. When the oxidation-reduction potential is low, deposition to silica-based fine particles is difficult because of formation of bar-like crystals.

Further, when the oxidation-reduction potential is not adjusted in a predetermined range, the $CeO_2$ ultrafine particles formed in the mixing step are less likely to be crystallized, and heating and aging after mixing do not promote crystallization of the non-crystallized $CeO_2$ ultrafine particles. Therefore, burning at high temperatures is necessary to crystallize to a predetermined size in the burning in Step 2 and grinding is made difficult.

The type of the cerium metal salt is not limited, and a chloride, a nitrate, a sulfate, an acetate, a carbonate, and a metal alkoxide of cerium can be used. Specific examples thereof include cerous nitrate, cerium carbonate, cerous sulfate, and cerous chloride. Of these, trivalent cerium salts such as cerous nitrate, cerous chloride and cerium carbonate are preferred because a crystalline cerium oxide, cerium hydroxide and the like are produced from a solution supersaturated at the same time as neutralization, and are promptly aggregated and deposited to silica-based fine particles to finally form $CeO_2$ ultrafine particles in a monodisperse manner. Further, the trivalent cerium salts suitably react with the silica-based fine particles to easily form the cerium-containing silica layer. The trivalent cerium salts are also preferred because trivalent cerium having high reactivity with the silica film formed on a substrate to be polished is easily formed in ceria crystals. However, sulfate ions, chloride ions and nitrate ions included in the metal salts exhibit corrosive properties. Therefore, it is necessary to perform cleaning as desired in the post-process after mixing to remove the ions to 5 ppm or less. On the other hand, a carbonate and an alkoxide can be preferably used because the former is released during mixing as carbonic acid gas and the latter is decomposed into alcohol.

The cerium metal salt is added to the silica-based fine particle dispersion such that the mass ratio between silica and ceria in the resulting ceria-based composite fine particles falls within the range of 100:11 to 316, as in the above-described composite fine particles of the invention.

The temperature at the time of stirring after addition of the cerium metal salt to the silica-based fine particle dispersion is preferably 0 to 20° C., more preferably 3 to 20° C. and even more preferably 3 to 18° C. When the temperature is too low, reactivity between ceria and silica is reduced to considerably decrease the solubility of silica and crystallization of ceria is therefore not controlled. As a result, coarse crystalline ceria oxide is generated to cause abnormal growth of $CeO_2$ ultrafine particles at the surfaces of the silica-based fine particles, whereby grinding is not easily performed after burning, and the amount of silica dissolved in the cerium compound is reduced, thus leading to a decrease in silica supplied to the cerium-containing silica layer. It is assumed that immobilization of the ceria child particles on the silica mother particles does not easily occur for lack of silica which serves as a binder between the silica mother particles and the ceria child particles (for lack of silica stacked on the mother particles). When the temperature is too high to the contrary, the solubility of silica is considerably increased to suppress generation of the crystalline ceria oxide. However, a high temperature is required in burning to promote binding between particles, which may hinder grinding, and furthermore, scale is more likely to be formed on the wall surface of the reactor. Such a temperature is thus not preferred. Silica-based fine particles which are not easily soluble in the cerium compound (neutralizing material of the cerium salt) are preferred. In the case of the easily soluble silica-based fine particles, silica suppresses the growth of ceria crystals and the $CeO_2$ ultrafine particles have a particle size of less than 2.5 nm in the mixing step.

When the $CeO_2$ ultrafine particles have a particle size of less than 2.5 nm in the mixing step, it is necessary to increase the burning temperature to adjust the particle size of ceria after burning to 10 nm or more. In this case, the mother particles may be firmly coated with the cerium-containing layer, thus making grinding difficult. The solubility can be suppressed by using the easily soluble silica-based fine particles as the material after drying at 100° C. or more.

The stirring time of the silica-based fine particle dispersion is preferably 0.5 to 24 hours, and more preferably 0.5 to 18 hours. Too short a stirring time is not preferred because the $CeO_2$ ultrafine particles are aggregated to hinder reaction with silica at the surfaces of the silica-based fine particles and composite fine particles which are not easily ground tend to be formed. Even when the time is too long to the contrary, a reaction for forming the $CeO_2$ ultrafine particle-containing layer does not further proceed, which is not economical. The silica-based fine particle dispersion may be aged at 0 to 80° C. as desired after addition of the cerium metal salt because aging has the effect of promoting reaction of the cerium compound and at the same time, adhering the $CeO_2$ ultrafine particles which did not adhere to but were separated from the silica-based fine particles onto the silica-based fine particles.

When the cerium metal salt is added to the silica-based fine particle dispersion and stirred, the silica-based fine particle dispersion has a pH of 7.0 to 9.0, and preferably 7.6 to 8.6. In this process, it is preferred to perform pH adjustment by adding an alkali or the like. Examples of the alkali that may be used include known alkalis. More specifically, exemplary alkalis include an aqueous ammonia solution, and other aqueous solutions of alkali hydroxides, alkaline-earth metals and amines, but the alkali is not limited thereto.

When the cerium metal salt is added to the silica-based fine particle dispersion and stirred, the oxidation-reduction potential of the fine particle dispersion is adjusted to 50 to 500 mV. The oxidation-reduction potential is preferably adjusted to 100 to 300 mV because when a trivalent cerium metal salt is used as the material, the oxidation-reduction potential of the fine particle dispersion is reduced during mixing.

Crystallization of the generated $CeO_2$ ultrafine particles is promoted by keeping the oxidation-reduction potential in this range. When the oxidation-reduction potential is 50 mV or less or takes a negative value, plate- or rod-like ceria single particles or composite ceria particles tend to be generated instead of deposition of the cerium compound onto the surfaces of the silica-based fine particles. Further, the $CeO_2$ ultrafine particle-containing layer is not formed because of reduction of the reactivity of cerium hydroxide or the like with the silica-based fine particles. Even if the $CeO_2$ ultrafine particle-containing layer is formed, the silica content in the $CeO_2$ ultrafine particle layer is excessively reduced. Therefore, the cerium-containing silica layer containing the ceria child particles therein is not formed after burning, and the ceria child particles tend to be positioned so as to be exposed at the surfaces of the silica mother particles.

Examples of the method of keeping the oxidation-reduction potential in the above-defined range include a method of adding an oxidizing agent such as hydrogen peroxide and a method of blowing air, oxygen, and ozone. When these methods are not performed, the oxidation-reduction potential tends to have a negative value or be reduced to 50 mV or less.

The dispersion containing particles (precursor particles) serving as the precursor of the composite fine particles of the invention (precursor particle dispersion) can be obtained by Step 1 as described above. In this step, it is possible to obtain particles in which the average crystallite size of the $CeO_2$ ultrafine particles contained in the precursor particles is 2.5 nm or more but less than 10 nm. When the reactivity between silica and ceria is too high, the average crystallite size of the $CeO_2$ ultrafine particles contained in the precursor particles tend to be less than 2.5 nm. Therefore, burning at an excessively high temperature is necessary in Step 2 to have ceria particles with an average crystallite size of 10 nm or more. As a result, adhesion between particles may be strengthened to make grinding difficult.

As described above, in Step 1, it is preferred to stir the silica-based fine particle dispersion; continuously or discontinuously adding the cerium metal salt while keeping the temperature at 0 to 20° C., the pH at 7.0 to 9.0 and the oxidation-reduction potential at 50 to 500 mV, respectively, and thereafter continuously or discontinuously adding the cerium metal salt while keeping the temperature at 20° C. or more but 98° C. or less, the pH at 7.0 to 9.0 and the oxidation-reduction potential at 50 to 500 mV, respectively, thereby obtaining the precursor particle dispersion.

In other words, although treatment is performed at the temperature of 0 to 20° C. in Step 1, the treatment is preferably followed by another treatment at the temperature changed to 20° C. or more but 98° C. or less, thereby obtaining the precursor particle dispersion.

This is because the dispersion of the invention containing the composite fine particles of the invention in which the coefficient of variation of the child particles in the particle size distribution takes a suitable value is easily obtained by performing Step 1 as described above.

When the treatment is performed at the temperature in the range of 20° C. or more but 98° C. or less, suitable values of pH and oxidation-reduction potential and their adjusting methods are the same as those in the case of treating at the temperature of 0 to 20° C.

It is preferred to obtain the precursor particle dispersion by treating at the temperature of 20° C. or more but 98° C. or less before treating at the temperature of 0 to 20° C. to the contrary. More specifically, it is preferred to stir the silica-based fine particle dispersion; continuously or discontinuously adding the cerium metal salt while keeping the temperature at 20° C. or more but 98° C. or less, the pH at 7.0 to 9.0 and the oxidation-reduction potential at 50 to 500 mV, respectively, and thereafter continuously or discontinuously adding the cerium metal salt while keeping the temperature at 0 to 20° C., the pH at 7.0 to 9.0 and the oxidation-reduction potential at 50 to 500 mV, respectively, thereby obtaining the precursor particle dispersion.

This is because the dispersion of the invention containing the composite fine particles of the invention in which the coefficient of variation of the child particles in the particle size distribution takes a suitable value is easily obtained by performing Step 1 as described above.

When the treatment is performed at the temperature in the range of 20° C. or more but 98° C. or less, suitable values of pH and oxidation-reduction potential and their adjusting methods are the same as those in the case of treating at the temperature of 0 to 20° C.

Even when mixing is performed by changing the temperature during the mixing, the composite fine particles have the same generation mechanism as described above if the step in which mixing is performed at the temperature of 0 to 20° C. is included.

When the reaction is performed in the range of 0 to 20° C., $CeO_2$ ultrafine particles having a large size are generated because of reduced reactivity of cerium with silica. However, if the cerium metal salt is then added while keeping the mixing temperature in the range of 20° C. or more but 98° C. or less, the reactivity of cerium with silica is increased to promote dissolution of the silica, and the silica therefore inhibits crystal growth of ceria to generate $CeO_2$ ultrafine particles having a smaller size. The $CeO_2$ ultrafine particles and the ceria child particles can thus have a wide particle size distribution width by setting the reaction temperature in the mixing step (Step 1) at 0 to 20° C. as an essential condition and adding the cerium metal salt while changing the reaction temperature to the range of 20° C. or more but 98° C. or less. As long as the step of adding the cerium metal salt at the mixing temperature ranging from 0 to 20° C. is included, the reaction at the temperature in the range of 20° C. or more but 98° C. or less may be performed before or after the reaction at 0 to 20° C., and the temperature may be changed three times or more.

In the step of reacting at 0 to 20° C. in the case of treating at two or more reaction temperatures, the cerium metal salt is preferably added in an amount of 10 to 90 mass % with respect to the total amount of addition of the cerium metal salt because when the amount of addition exceeds this range, the amounts of the $CeO_2$ ultrafine particles and the ceria child particles having a larger (or smaller) size are reduced and the particle size distribution does not therefore have a large width.

The precursor particle dispersion obtained in Step 1 may be further diluted or concentrated with pure water or ion exchanged water before being subjected to the subsequent Step 2.

The solids concentration in the precursor particle dispersion is preferably 1 to 27 mass %.

The precursor particle dispersion may be subjected as desired to deionization treatment using a cation exchange resin, an anion exchange resin, an ultrafiltration membrane, an ion-exchange membrane, and centrifugation.

<Step 2>

In Step 2, the precursor particle dispersion is dried and then burned at 950 to 1,200° C.

The drying method is not particularly limited. A conventionally known dryer can be used to perform drying. Specific examples of the dryer that can be used include a compartment dryer, a band dryer, and a spray dryer.

Advantageously, it is recommendable to adjust the precursor particle dispersion before drying to a pH of 6.0 to 7.0 because surface activity can be suppressed when the precursor particle dispersion before drying is adjusted to a pH of 6.0 to 7.0.

The burning temperature after drying is 950 to 1,200° C., preferably 1,000 to 1,100° C., more preferably 1,010 to 1,090° C., and most preferably 1,030 to 1,090° C. When burning is performed in the temperature range as described above, ceria crystallization sufficiently proceeds and the cerium-containing silica layer containing the ceria child particles dispersed therein has a suitable thickness, whereby the cerium-containing silica layer is firmly bound to the mother particles and the child particles dispersed in the cerium-containing silica layer are less likely to come off. Further, when burning is performed in the temperature range as described above, cerium hydroxide or the like does not easily remain. When the temperature is too high, abnormal growth of ceria crystals and excessive thickening of the cerium-containing silica layer may take place, and amorphous silica making up the mother particles may be crystallized, and particles may be fused together.

It is also possible to promote the growth of ceria crystals by adding an alkali metal, an alkaline-earth metal, and a sulfate as flux components during burning. However, the flux components may cause metallic contamination or corrosion of a substrate to be polished. Therefore, the flux component content during burning with respect to the dry amount of the precursor particles is preferably 100 ppm or less, more preferably 50 ppm or less, and most preferably 40 ppm or less.

The flux component may be used through a colloidal silica material. Alternatively, the flux component may be used as an alkali that may be used to neutralize the cerium metal salt during mixing. However, when an alkali metal or an alkaline-earth metal is present during mixing, polymerization of the silica-based fine particles is promoted to make the fine particles more compact, and the reactivity between cerium hydroxide or the like and the silica-based fine particles is therefore reduced. Further, the surfaces of the silica-based fine particles are protected by the alkali metal or the alkaline-earth metal, so that the reactivity with cerium hydroxide or the like is suppressed and the cerium-containing silica layer is less likely to be formed. Further, dissolution of silica is suppressed during mixing, so that silicon atoms do not easily enter into solid solution in the ceria child particles.

When burning is performed in the temperature range as described above, silicon atoms enter into solid solution in the crystalline ceria as the main component of the child particles. Therefore, as for cerium atoms and silicon atoms included in the child particles, a relationship of $R_1 < R_2$ (where $R_1$ is a distance between cerium and silicon atoms, and $R_2$ is a distance between cerium atoms) may be satisfied.

In Step 2, a dispersion including a burned and ground body is obtained by adding a solvent to a burned body obtained by burning and performing wet grinding at a pH of 8.6 to 10.8.

The burned body may be subjected to wet grinding after having been subjected to dry grinding.

A conventionally known device can be used as a dry grinder and examples thereof include an attritor, a ball mill, a vibrating mill, and a vibrating ball mill.

A conventionally known device can also be used as a wet grinder, and examples thereof include a batch type bead mill such as a basket mill, continuous type bead mills such as horizontal type, vertical type and annular type bead mills, a sand grinder mill, a ball mill, a rotor/stator type homogenizer, an ultrasonic dispersion type homogenizer, and a wet medium stirring mill (wet grinder) such as an impact grinder where fine particles in a dispersion are made to collide against each other. Examples of the beads that may be used in the wet medium stirring mill include beads made from materials such as glass, alumina, zirconia, steel, flint, and organic resins.

Water and/or an organic solvent is used as a solvent for use in grinding the burned body in a wet process. For example, water such as pure water, ultrapure water, or ion exchanged water is preferably used. The solids concentration in the dispersion including the burned and ground body is not particularly limited, and is preferably in the range of, for example, 0.3 to 50 mass %.

When the burned body is subjected to the wet grinding, the wet grinding is preferably performed while maintaining the solvent at a pH of 8.6 to 10.8. If the pH is kept in this range, it is possible to finally obtain with more ease the ceria-based composite fine particle dispersion that provides a streaming potential curve in which the ratio ($\Delta PCD/V$) between the amount of streaming potential change ($\Delta PCD$) and the amount of cation colloidal titrant added at the knick (V) as expressed by formula (1) is in the range of $-110.0$ to $-15.0$ when cation colloidal titration is performed.

In other words, grinding is preferably performed to such an extent that the dispersion of the invention corresponding to the above-described preferred embodiments is obtained because, as described above, the polishing rate is further improved when the dispersion of the invention corresponding to the preferred embodiments is used as an abrasive. In this regard, the inventors of the invention assume that the cerium-containing silica layer at the surfaces of the composite fine particles of the invention is suitably reduced in thickness and/or the child particles are suitably exposed at a part of the surface of each of the composite fine particles, whereby the polishing rate can be further improved and coming off of the ceria child particles can be controlled. It is further assumed that, silica in the cerium-containing silica layer is dissolved and deposited again during grinding to form an easily soluble flexible silica layer as the outermost layer, and the easily soluble silica layer improves the frictional force by adhesive action to a substrate, thus improving the polishing rate. It is also assumed that the cerium-containing silica layer is thin or comes off and the child particles are therefore more likely to be detached to some extent during polishing. $\Delta PCD/V$ is more preferably $-100.0$ to $-15.0$, and even more preferably $-100.0$ to $-20.0$.

When burned powder is made less hard without passing through the wet grinding process as in Step 2, dry grinding and pulverization are only performed, or the pH is outside the predetermined range even if wet grinding is performed, $\Delta PCD/V$ is less likely to fall within the range of $-100.0$ to $-15$ and further an easily soluble flexible silica layer is not easily formed.

<Step 3>

In Step 3, the dispersion including the burned and ground body that was obtained in Step 2 is centrifuged at a relative centrifugal acceleration of 300 G or more, and subsequently precipitated components are removed to obtain the ceria-based composite fine particle dispersion.

More specifically, the dispersion including the burned and ground body is subjected to classification using a centrifugation process. The relative centrifugal acceleration in the centrifugation process is set to 300 G or more. The ceria-based composite fine particle dispersion can be obtained by removing the precipitated components after the centrifugation process. The upper limit of the relative centrifugal acceleration is not particularly limited and the relative centrifugal acceleration of 10,000 G or less is practically used.

It is necessary in Step 3 to include a centrifugation process satisfying the conditions described above. When the centrifugal acceleration does not satisfy the conditions described above, coarse particles remain in the ceria-based composite fine particle dispersion, which may therefore cause scratches when the ceria-based composite fine particle dispersion is used for polishing as an abrasive using the ceria-based composite fine particle dispersion.

According to the invention, the ceria-based composite fine particles can be obtained by further drying the ceria-based composite fine particle dispersion obtained by the manufacturing method described above. The drying method is not particularly limited, and a conventionally known dryer can be used to perform drying.

The dispersion of the invention can be obtained by the manufacturing method of the invention as described above.

<Polishing Abrasive Grain Dispersion>

A liquid containing the dispersion of the invention can be preferably used as the polishing abrasive grain dispersion (hereinafter referred to also as "polishing abrasive grain dispersion of the invention"). In particular, the liquid can be advantageously used as the polishing abrasive grain dispersion for flattening a semiconductor substrate having an $SiO_2$ insulating film formed thereon. The liquid containing the dispersion of the invention can be also advantageously used as a polishing slurry by adding a chemical component for controlling the polishing performance.

The polishing abrasive grain dispersion of the invention has excellent effects including a high polishing rate in polishing a semiconductor substrate or the like, a small number of flaws (scratches) at a polished surface during polishing, and a small amount of residual abrasive grains on a substrate.

The polishing abrasive grain dispersion of the invention contains water and/or an organic solvent as a dispersion solvent. Water such as pure water, ultrapure water, or ion exchanged water is preferably used as the dispersion solvent. Further, the polishing abrasive grain dispersion of the invention is advantageously used as a polishing slurry by adding one or more additives for controlling the polishing performance, which are selected from the group consisting of a polishing accelerator, a surfactant, a heterocyclic compound, a pH adjuster, and a pH buffer.

<Polishing Accelerator>

Although the polishing accelerator to be used differs depending on the type of a member to be polished, a conventionally known polishing accelerator can be added to the polishing abrasive grain dispersion of the invention when necessary and used as a polishing slurry. Examples of the polishing accelerator as described above include hydrogen peroxide, peracetic acid, urea peroxide, and a mixture thereof. When an abrasive composition containing the polishing accelerator such as hydrogen peroxide is used, the polishing rate can be effectively improved when a member to be polished is made of metal.

Other examples of the polishing accelerator include inorganic acids such as sulfuric acid, nitric acid, phosphoric acid, oxalic acid, and hydrofluoric acid; an organic acid such as acetic acid; a sodium salt, a potassium salt, an ammonium salt, and an amine salt of these acids; and a mixture thereof. When polishing a member composed of composite components using the polishing composition containing the polishing accelerator described above, the polishing rate can be accelerated for specific components of the member to be polished to thereby finally obtain a polished flat surface.

When the polishing abrasive grain dispersion of the invention contains the polishing accelerator, the polishing accelerator content is preferably 0.1 to 10 mass %, and more preferably 0.5 to 5 mass %.

<Surfactant and/or Hydrophilic Compound>

A cationic, anionic, nonionic or amphoteric surfactant or a hydrophilic compound can be added to improve the dispersibility and stability of the polishing abrasive grain dispersion of the invention. Both the surfactant and the hydrophilic compound have the effects of reducing the angle of contact with the surface to be polished and accelerating uniform polishing. The surfactant and/or the hydrophilic compound can be, for instance, selected for use from the group shown below:

Examples of the anionic surfactant include carboxylate salts, sulfonate salts, sulfate ester salts, and phosphate ester salts. Exemplary carboxylate salts include soap, N-acylamino acid salts, polyoxyethylene or polyoxypropylene alkyl ether carboxylate salts, and acylated peptides. Exemplary sulfonate salts include alkyl sulfonate salts, alkylbenzene and alkyl naphthalene sulfonate salts, naphthalene sulfonate salts, sulfosuccinate salts, α-olefin sulfonate salts, and N-acyl sulfonate salts. Exemplary sulfate ester salts include sulfated oils, alkyl sulfate salts, alkyl ether sulfate salts, polyoxyethylene or polyoxypropylene alkyl allyl ether sulfate salts, and alkyl amido sulfate salts. Exemplary phosphate ester salts include alkyl phosphate salts and polyoxyethylene or polyoxypropylene alkyl allyl ether phosphate salts.

Examples of the cationic surfactant include aliphatic amine salts, aliphatic quaternary ammonium salts, benzalkonium chloride salts, benzethonium chloride, pyridinium salts, and imidazolinium salts. Examples of the amphoteric surfactant include carboxybetaine surfactants, sulfobetaine surfactants, aminocarboxylate salts, imidazolinium betaines, lecithins, and alkylamine oxides.

Examples of the nonionic surfactant include ether surfactants, ether ester surfactants, ester surfactants, and nitrogen-containing surfactants. Exemplary ether surfactants include polyoxyethylene alkyl and alkylphenyl ethers, alkyl allyl formaldehyde-condensed polyoxyethylene ethers, polyoxyethylene polyoxypropylene block polymers, and polyoxyethylene polyoxypropylene alkyl ethers. Exemplary ether ester surfactants include polyoxyethylene ethers of glycerin esters, polyoxyethylene ethers of sorbitan esters, and polyoxyethylene ethers of sorbitol esters. Exemplary ester surfactants include polyethylene glycol fatty acid esters, glycerin esters, polyglycerin esters, sorbitan esters, propylene glycol esters, and sucrose esters. Exemplary nitrogen-containing surfactants include fatty acid alkanolamides, polyoxyethylene fatty acid amides, and polyoxyethylene alkylamides. Other exemplary surfactants include fluorosurfactants.

Anionic surfactants or nonionic surfactants are preferred surfactants. Exemplary salts include ammonium salts, potassium salts and sodium salts, and ammonium salts and potassium salts are particularly preferred.

Furthermore, other exemplary surfactants and hydrophilic polymers include esters such as glycerin ester, sorbitan ester, and alanin ethyl ester; ethers such as polyethylene glycol, polypropylene glycol, polytetramethylene glycol, polyethylene glycol alkyl ether, polyethylene glycol alkenyl ether, alkyl polyethylene glycol, alkyl polyethylene glycol alkyl ether, alkyl polyethylene glycol alkenyl ether, alkenyl polyethylene glycol, alkenyl polyethylene glycol alkyl ether, alkenyl polyethylene glycol alkenyl ether, polypropylene glycol alkyl ether, polypropylene glycol alkenyl ether, alkyl polypropylene glycol, alkyl polypropylene glycol alkyl ether, alkyl polypropylene glycol alkenyl ether, and alkenyl polypropylene glycol; polysaccharides such as alginic acid, pectic acid, carboxymethyl cellulose, curdlan, and pullulan; amino acid salts such as glycine ammonium salt and glycine sodium salt; polycarboxylic acids and their salts such as polyaspartic acid, polyglutamic acid, polylysine, polymalic acid, polymethacrylic acid, poly(ammonium methacrylate), poly(sodium methacrylate), polyamide acid, polymaleic acid, polyitaconic acid, polyfumaric acid, poly(p-styrene carboxylic acid), polyacrylic acid, polyacrylamide, aminopolyacrylamide, poly(ammonium acrylate), poly(sodium acrylate), polyamide acid, ammonium salt of polyamide acid, sodium salt of polyamide acid, and polyglyoxylic acid; vinyl polymers such as polyvinyl alcohol, polyvinylpyrrolidone, and polyacrolein; sulfonic acid and its salts such as ammonium methyl taurate, sodium methyl taurate, sodium methyl sulfate, ammonium ethyl sulfate, ammonium butyl sulfate, sodium vinyl sulfonate, sodium 1-allyl sulfonate, sodium 2-allyl sulfonate, sodium methoxymethyl sulfonate, ammonium ethoxymethyl sulfonate, and sodium 3-ethoxypropyl sulfonate; and amides such as propionamide, acrylamide, methylurea, nicotinamide, succinic amide, and sulfanilamide.

When a substrate to be applied for polishing is a glass substrate, any surfactant may be advantageously used. However, when an effect of contamination with an alkali metal, an alkaline-earth metal or a halide is to be avoided in a silicon substrate for a semiconductor integrated circuit or the like, a surfactant of an acid or its ammonium salt is desirably used.

When the polishing abrasive grain dispersion of the invention contains a surfactant and/or a hydrophilic compound, the surfactant and the hydrophilic compound are preferably contained in a total amount of 0.001 to 10 g, more preferably 0.01 to 5 g, and particularly preferably 0.1 to 3 g per L of the polishing abrasive grain dispersion.

The surfactant and/or the hydrophilic compound is contained in an amount of preferably 0.001 g or more per L of the polishing abrasive grain dispersion in order to obtain advantageous effects, and in an amount of preferably 10 g or less per L of the polishing abrasive grain dispersion in order to prevent reduction of the polishing rate.

The surfactants or the hydrophilic compounds may be used alone or in combination of two or more, and different types of surfactants or hydrophilic compounds may also be used in combination.

<Heterocyclic Compound>

When metal is included in the substrate to be polished, a heterocyclic compound may be contained in the polishing abrasive grain dispersion of the invention for the purpose of suppressing erosion of the substrate to be polished through formation of a passive layer or a dissolution inhibiting layer on the metal. The heterocyclic compound is a compound having a heterocycle containing at least one heteroatom. The heteroatom refers to an atom other than carbon atom and hydrogen atom. The heterocycle refers to a cyclic compound having at least one heteroatom. The heteroatom only refers to an atom that forms a constituent portion of a ring system of a heterocycle, and does not refer to an atom that is positioned outside the ring system, or is separated from the ring system by at least one non-conjugated single bond, or forms a part of a further substituent of the ring system. Preferred examples of the heteroatom include, but are not limited to, nitrogen atom, sulfur atom, oxygen atom, selenium atom, tellurium atom, phosphorus atom, silicon atom, and boron atom. Examples of the heterocyclic compound that may be used include imidazole, benzotriazole, benzothiazole, and tetrazole. More specific examples of the heterocyclic compound include, but are not limited to, 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, and 3,5-diamino-1,2,4-triazole.

When the polishing abrasive grain dispersion of the invention contains the heterocyclic compound, the heterocyclic compound content is preferably 0.001 to 1.0 mass %, more preferably 0.001 to 0.7 mass %, and even more preferably 0.002 to 0.4 mass %.

<pH Adjuster>

An acid or a base, or a salt compound thereof can be optionally added to enhance the effects of the above-described additives, thereby adjusting the pH of the polishing composition.

When the polishing abrasive grain dispersion of the invention is adjusted to a pH of 7 or more, an alkaline pH adjuster is used. Sodium hydroxide, ammonia water, ammonium carbonate, and amines such as ethylamine, methylamine, triethylamine, and tetramethylamine are desirably used.

When the polishing abrasive grain dispersion of the invention is adjusted to a pH of less than 7, an acidic pH adjuster is used. For example, hydroxy acids such as acetic acid, lactic acid, citric acid, malic acid, tartaric acid, and glyceric acid, and mineral acids such as hydrochloric acid and nitric acid are used.

<pH Buffer>

The pH buffer may be used to keep the pH of the polishing abrasive grain dispersion of the invention at a constant value. Examples of the pH buffer that may be used include phosphates and borates such as ammonium dihydrogen phosphate, diammonium hydrogen phosphate, and ammonium tetraborate tetrahydrate, and organic acid salts.

An organic solvent can be used as the dispersion solvent in the polishing abrasive grain dispersion of the invention. Examples of the organic solvent include alcohols such as methanol, ethanol, isopropanol, n-butanol, and methyl isobutyl carbinol; ketones such as acetone, 2-butanone, ethyl amyl ketone, diacetone alcohol, isophorone, and cyclohexanone; amides such as N, N-dimethylformamide, and N,N-dimethylacetamide; ethers such as diethyl ether, isopropyl ether, tetrahydrofuran, 1,4-dioxane, and 3,4-dihydro-2H-pyran; glycol ethers such as 2-methoxyethanol, 2-ethoxyethanol, 2-butoxyethanol, and ethylene glycol dimethyl ether; glycol ether acetates such as 2-methoxyethyl acetate, 2-ethoxyethyl acetate, and 2-butoxyethyl acetate; esters such as methyl acetate, ethyl acetate, isobutyl acetate, amyl acetate, ethyl lactate, and ethylene carbonate; aromatic hydrocarbons such as benzene, toluene and xylene; aliphatic hydrocarbons such as hexane, heptane, isooctane, and cyclohexane; halogenated hydrocarbons such as methylene chloride, 1,2-dichloroethane, dichloropropane, and chlorobenzene; sulfoxides such as dimethyl sulfoxide; and pyrrolidones such as N-methyl-2-pyrrolidone, and N-octyl-2-pyrrolidone. These may be mixed with water for use.

The solids concentration in the polishing abrasive grain dispersion of the invention is preferably in the range of 0.3 to 50 mass %. When the solids concentration is too low, the polishing rate may be reduced. Even when the solids concentration is too high to the contrary, the polishing rate is scarcely further increased, which may be uneconomical.

EXAMPLES

The present invention is described below by way of examples. The present invention should not be construed as being limited to these examples.

Experiment 1

Each measuring method and each testing method in Examples and Comparative Examples are first described in detail. Measurement results and testing results in each of Examples and Comparative Examples are shown in Tables 1 to 3.
[Component Analysis]
[Measurement of $SiO_2$ Content]

When the silica-based fine particle dispersion was made from a sodium silicate material, the $SiO_2$ content in the silica-based fine particle dispersion was determined by weighing after loss on ignition at 1,000° C. in the silica-based fine particle dispersion, assuming that the resulting product was all $SiO_2$. When the silica-based fine particle dispersion was made from an alkoxysilane material, the $SiO_2$ content was determined by weighing after drying the silica-based fine particle dispersion at 150° C. for 1 hour assuming that the resulting product was all $SiO_2$. The solids concentration in the silica-based fine particle dispersion can also be determined.

The $SiO_2$ content in the ceria-based composite fine particles was determined as follows: The solids mass was obtained after loss on ignition at 1,000° C. in the ceria-based composite fine particle dispersion; then the Ce content was determined by the standard addition method using an ICP plasma emission spectrometer (for example, SPS5520 manufactured by SII) in the same manner as in Al to Th to be described later, thereby calculating $CeO_2$ mass %, and the $SiO_2$ content was determined assuming that the component of the solids other than $CeO_2$ was $SiO_2$. The $SiO_2$ content, the $CeO_2$ content, and the parts by mass of ceria with respect to 100 parts by mass of silica were calculated based on the $CeO_2$ content and the $SiO_2$ content determined in the above process. The solids concentration in the ceria-based composite fine particle dispersion can also be determined.

In the measurement of the contents in the specific impurity group 1 and the specific impurity group 2 to be described below, the content of each component with respect to the dry amount was determined based on the solids mass obtained as described above.
[Component Analysis of Ceria-Based Composite Fine Particles or Silica-Based Fine Particles]

The element contents are measured by the method described below.

About 1 g of a sample (adjusted to a solids content of 20 mass %) which is made of ceria-based composite fine particles or a ceria-based composite fine particle dispersion is first placed in a platinum dish. Phosphoric acid (3 ml), nitric acid (5 ml) and hydrofluoric acid (10 ml) are added and heated on a sand bath. When dried, the sample is dissolved by addition of a small amount of water and nitric acid (50 ml) and is then placed in a 100 ml volumetric flask and the volume is adjusted to 100 ml by addition of water. Na and K in this solution are measured by an atomic absorption spectrometer (for example, Z-2310 manufactured by Hitachi, Ltd.). Next, a portion (10 ml) of the solution adjusted to 100 ml is placed in a 20 ml volumetric flask. This operation is repeated five times to obtain five 10 ml portions. The five portions are used to make measurement of Al, Ag, Ca, Cr, Cu, Fe, Mg, Ni, Ti, Zn, U, and Th by a standard addition method by means of an ICP plasma emission spectrometer (for example, SPS5520 manufactured by SII). A blank value is also measured by the same method and a measured value of each element is obtained by adjusting through subtraction of the blank value.

Then, the content of each component with respect to the dry amount was determined based on the solids mass obtained by the above-described method.

The anion contents are measured by the method described below.
<Cl>

Acetone is added to 20 g of a sample made of ceria-based composite fine particles or the ceria-based composite fine particle dispersion (and having a solids concentration adjusted to 20 mass %) to adjust the volume to 100 ml, and to the solution are added acetic acid (5 ml) and a 0.001 mol sodium chloride solution (4 ml). The mixture is analyzed with a 0.002 mol silver nitrate solution by potentiometric titration (potentiometric titrator AT-610 manufactured by Kyoto Electronics Manufacturing Co., Ltd.).

Separately as blank measurement, acetic acid (5 ml) and a 0.001 mol sodium chloride solution (4 ml) were added to acetone (100 ml) and titration was performed with a 0.002 mol silver nitrate solution. The titer in this titration was determined and was subtracted from the titer in the case of using the sample to obtain the titer of the sample.

Then, the content of each component with respect to the dry amount was determined based on the solids mass obtained by the above-described method.
<$NO_3$, $SO_4$, F>

A sample (5 g) made of ceria-based composite fine particles or a ceria-based composite fine particle dispersion (and having a solids content adjusted to 20 mass %) was diluted with water to 100 ml and centrifuged at 4,000 rpm for 20 minutes by a centrifuge (HIMAC CTO6E manufactured by Hitachi, Ltd.), and a solution obtained by removing the precipitated components was analyzed by ion chromatography (ICS-1100 manufactured by DIONEX).

Then, the content of each component with respect to the dry amount was determined based on the solids mass obtained by the above-described method.
[X-Ray Diffractometry, Measurement of Average Crystallite Size]

The ceria-based composite fine particle dispersion or the silica-based composite fine particles obtained in each of Examples and Comparative Examples were dried with a conventionally known dryer, and the resulting powder was pulverized with a mortar for 10 minutes and an X-ray diffraction pattern was obtained by an X-ray diffractometer (RINT 1400 manufactured by Rigaku Corporation) to thereby specify the crystal type.

Further, the above-described method was used to measure the full width at half maximum of a peak of a (111) plane (2θ=around 28°) in the resulting X-ray diffraction pattern when 2θ=around 28°, thereby determining the average crystallite size using the Scherrer equation.
<Average Particle Size>

The average particle size of the particles contained in each of the silica-based fine particle dispersions and the ceria-based composite fine particle dispersions obtained in Examples and Comparative Examples was measured by the image analysis method described above.
<Number of Coarse Particles>

The number of coarse particles in the ceria-based composite fine particles was measured using Accusizer 780APS manufactured by Particle Sizing System Inc. The measurement sample was diluted with pure water to adjust to 0.1 mass % and a 5 mL portion was poured into the measurement device to perform measurement under the conditions described below. After the measurement was performed three times, the average value of the number of coarse particles having a particle size of 0.51 µm or more in the resulting measurement data was calculated. The average value was further multiplied by 1000 to obtain the number of coarse particles on dry basis in the ceria-based composite fine particles. The measurement conditions are as follows:

<System Setup>
  Stir Speed Control/Low Speed Factor 1500/High Speed Factor 2500
<System Menu>
  Data Collection Time 60 Sec.
  Syringe Volume 2.5 ml
  Sample Line Number: Sum Mode
  Initial $2^{nd}$-Stage Dilution Factor 350
  Vessel Fast Flush Time 35 Sec.
  System Flush Time/Before Measurement 60 Sec./After Measurement 60 Sec.
  Sample Equilibration Time 30 Sec./Sample Flow Time 30 Sec.

[Method of Polishing Test]
<Polishing of $SiO_2$ Film>

The polishing abrasive grain dispersion containing the ceria-based composite fine particle dispersion obtained in each of Examples and Comparative Examples was prepared. The solids concentration was 0.6 mass %, and nitric acid was added to adjust the pH to 5.0.

Next, a substrate of an $SiO_2$ insulating film (thickness: 1 µm) made by a thermal oxidation technique was prepared as a substrate to be polished.

Next, the substrate to be polished was set on a polishing device (NF300 manufactured by Nano Factor Co., Ltd.) and polished by using a polishing pad (concentric circle type "IC-1000/SUBA400 manufactured by Nitta Haas Incorporated) and supplying the polishing abrasive grain dispersion for 1 minute at a rate of 50 ml/min under a substrate load of 0.5 MPa and at a table rotation speed of 90 rpm.

Then, a weight change of the substrate to be polished between before and after polishing was determined to calculate the polishing rate.

The smoothness (surface roughness Ra) of a surface of the polished substrate was measured using an atomic force microscope (AFM manufactured by Hitachi High-Tech Science Corporation). There is approximately a proportional relationship between smoothness and surface roughness and Table 3 shows therefore surface roughness.

As for the observation of flaws due to polishing, insulating film surfaces were observed with an optical microscope.
<Polishing of Aluminum Hard Disk>

The polishing abrasive grain dispersion containing the ceria-based composite fine particle dispersion obtained in each of Examples and Comparative Examples was prepared. The solids concentration was 9 mass %, and nitric acid was added to adjust the pH to 2.0.

A substrate for an aluminum hard disk was set on a polishing device (NF300 manufactured by Nano Factor Co., Ltd.), and polished by using a polishing pad (Polytex 012 manufactured by Nitta Haas Incorporated) and supplying the polishing slurry for 5 minutes at a rate of 20 ml/min under a substrate load of 0.05 MPa and at a table rotation speed of 30 rpm. Its whole surface was observed at a zoom factor of 15 by an ultrafine defect visualizing macro inspection system (trade name: Maicro-Max manufactured by Vision Psytec). The number of scratches (linear scratches) present at a 65.97 $cm^2$ polished substrate surface portion to was counted, and the substrate was evaluated according to the criteria shown below:

| Number of linear scratches | Evaluation |
|---|---|
| Less than 50 | "Few" |
| 50 or more but less than 80 | "A few" |
| 80 or more | "Many" |
| *At least 80 and the total number is so large that counting cannot be made | "*" |

Examples are described below. "Solids concentration" as simply used herein means concentration of fine particles dispersed in a solvent irrespective of chemical species.

Preparation Step 1

<Preparation of High Purity Silica-Based Fine Particle Dispersion (Average Particle Size of Silica-Based Fine Particles: 113 nm)>
<<Preparation of Silica-Based Fine Particle Dispersion (Average Particle Size of Silica-Based Fine Particles: 63 nm)>>

Ethanol (12,090 g) was mixed with ethyl orthosilicate (6,363.9 g) to obtain a mixed solution $a_1$.

Next, ultrapure water (6,120 g) was mixed with 29% ammonia water (444.9 g) to obtain a mixed solution $b_1$.

Next, ultrapure water (192.9 g) and ethanol (444.9 g) were mixed and used as heel water.

Then, the heel water was adjusted to 75° C. and the mixed solution $a_1$ and the mixed solution $b_1$ were simultaneously added to the heel water so that addition of each solution ended in 10 hours. After the end of addition, the solution was aged while keeping its temperature at 75° C. for 3 hours. Then, the solids concentration was adjusted to obtain silica sol (9,646.3 g) having an $SiO_2$ solids concentration of 19 mass % and having silica-based fine particles with an average particle size of 63 nm (according to the image analysis method) dispersed in a solvent.

<<Preparation of Silica-Based Fine Particle Dispersion (Average Particle Size of Silica-Based Fine Particles: 113 nm)>>

Methanol (2,733.3 g) was mixed with ethyl orthosilicate (1,822.2 g) to obtain a mixed solution $a_2$.

Next, ultrapure water (1,860.7 g) was mixed with 29% ammonia water (40.6 g) to obtain a mixed solution $b_2$.

Next, ultrapure water (59 g) and methanol (1,208.9 g) were mixed and used as heel water. To the heel water was added the silica sol (922.1 g) obtained in the previous step which contained the silica-based fine particles with an average particle size of 63 nm dispersed in a solvent.

Then, the heel water containing the silica sol was adjusted to 65° C. with stirring and the mixed solution $a_2$ and the mixed solution $b_2$ were simultaneously added to the heel water so that addition of each solution ended in 18 hours. After the end of addition, the solution was aged while keeping its temperature at 65° C. for 3 hours. After that, the solution was concentrated using an ultrafiltration membrane and a rotary evaporator to obtain a silica-based fine particle dispersion (3,600 g) having a solids concentration ($SiO_2$ solids concentration) adjusted to 19 mass % and having silica-based fine particles with an average particle size of 113 nm (according to the image analysis method) dispersed in a solvent.

Cation exchange resin (SK-1BH manufactured by Mitsubishi Chemical Corporation; 114 g) was gradually added to the resulting silica-based fine particle dispersion (1,053 g)

and the dispersion was stirred for 30 minutes to separate the resin. The pH at that time was 5.1.

Each of the contents of Na, Ag, Al, Ca, Cr, Cu, Fe, K, Mg, Ni, Ti, Zn, U, Th, Cl, $NO_3$, $SO_4$ and F in particles contained in the silica-based fine particle dispersion after the treatment using the cation exchange resin (contents of the respective components with respect to the silica dry amount) was 1 ppm or less.

Preparation Step 2

<Preparation of High-Purity Acidic Silicate Solution>

Pure water was added to an aqueous sodium silicate solution (silica concentration: 24.06 mass %; $Na_2O$ concentration: 7.97 mass %) to obtain an aqueous sodium silicate solution (silica concentration: 5 mass %).

The resulting aqueous sodium silicate solution (18 kg) was passed through a strong acid cation exchange resin (6 L; SK1BH manufactured by Mitsubishi Chemical Corporation) at a space velocity of 3.0 $h^{-1}$ to obtain an acidic silicate solution (18 kg; silica concentration: 4.6 mass %; pH: 2.7). Then, the resulting acidic silicate solution (18 kg) was passed through a chelate ion exchange resin (6 L; CR-11 manufactured by Mitsubishi Chemical Corporation) at a space velocity of 3.0 $h^{-1}$ to obtain a high-purity acidic silicate solution (18 kg; silica concentration: 4.5 mass %; pH: 2.7).

Example 1

Ultrapure water was added to the silica-based fine particle dispersion obtained in the above-described preparation step 1 to obtain a dispersion (6,000 g; $SiO_2$ dry amount: 180 g) having an $SiO_2$ solids concentration of 3 mass % (this dispersion is hereinafter referred to also as solution A).

Next, ion exchanged water was added to cerium(III) nitrate hexahydrate (4 N high-purity reagent manufactured by Kanto Chemical Co., Inc.) to obtain an aqueous cerium nitrate solution having a concentration of 3.0 mass % in terms of $CeO_2$ (this solution is hereinafter referred to also as solution B).

Next, the solution A (6,000 g) was maintained at 10° C. and the solution B (7,186.7 g; $CeO_2$ dry amount: 215.6 g) was added to the solution A with stirring over 18 hours. During this operation, the solution was maintained at a temperature of 10° C. and 3% ammonia water was optionally added to maintain the solution at a pH of 8.6 to 8.8. After the end of addition, the solution was aged at a solution temperature of 10° C. for 4 hours. During addition of the solution B and aging, mixing was performed while air was blown into the solution mixture, and the oxidation-reduction potential was kept at 100 to 200 mV.

Then, cleaning was performed while supplying ion exchanged water through an ultrafiltration membrane. The precursor particle dispersion obtained after the end of cleaning had a solids concentration of 4.7 mass %, a pH of 8.8 (at 25° C.) and an electric conductivity of 44 μs/cm (at 25° C.)

Next, the resulting precursor particle dispersion was dried in a dryer at 120° C. for 16 hours. After that, burning was performed for 2 hours using a muffle furnace at 1,030° C. to obtain a powder (burned body).

To the powder (burned body) (100 g) obtained after the burning was added ion exchanged water (300 g), and 3% aqueous ammonia solution was further used to adjust the pH to 9.2. After that, wet grinding (batch desktop sand mill manufactured by Kanpe Hapio Co., Ltd.) was performed for 120 minutes using quartz beads (diameter: 0.25 mm; manufactured by Daiken Chemical Co., Ltd.).

Then, the grinding was followed by separation of the beads through a 44 mesh wire. The resulting dispersion including a burned and ground body had a solids concentration of 3.1 mass % and a weight of 1,115 g. During the grinding, an aqueous ammonia solution was added to keep the pH at 9.2.

The dispersion after the grinding was further treated at 1,700 G for 102 seconds by a centrifuge (model CR21G manufactured by Hitachi Koki Co., Ltd.), and light liquid was collected to obtain a ceria-based composite fine particle dispersion. The resulting ceria-based composite fine particle dispersion was subjected to measurement of the average particle size. The measurement method is the image analysis method as described above. The measurement results of the average particle size are shown in Table 3. Further, the ceria-based composite fine particles were subjected to STEM-EDS analysis to observe the shape of the mother particles contained in the ceria-based composite fine particles. The mother particles had a shape having 5 to 25-nm projections.

Next, the resulting ceria-based composite fine particle dispersion was used to perform a polishing test.

The average particle size of the silica-based fine particles contained in the silica-based fine particle dispersion used as the material, and impurity contents are shown in Table 1. The silica content and the ceria content in the ceria-based composite fine particle dispersion (and parts by mass of ceria with respect to 100 parts by mass of silica), the burning temperature, the average crystallite size of the ceria-based composite fine particles, the crystal type, the specific surface area, the impurity content in the ceria-based composite fine particles (content of each component with respect to the dry amount), the average particle size of the ceria-based composite fine particles, and measurement results of the polishing performance are shown in Table 3. The same applies to Examples and Comparative Examples that follow.

Example 2

The same operation (preparation of the ceria-based fine particle dispersion) and evaluation as in Example 1 were performed except that burning was performed at a burning temperature of 1,078° C. instead of 1,030° C. at which burning was performed in Example 1.

Figure 4:
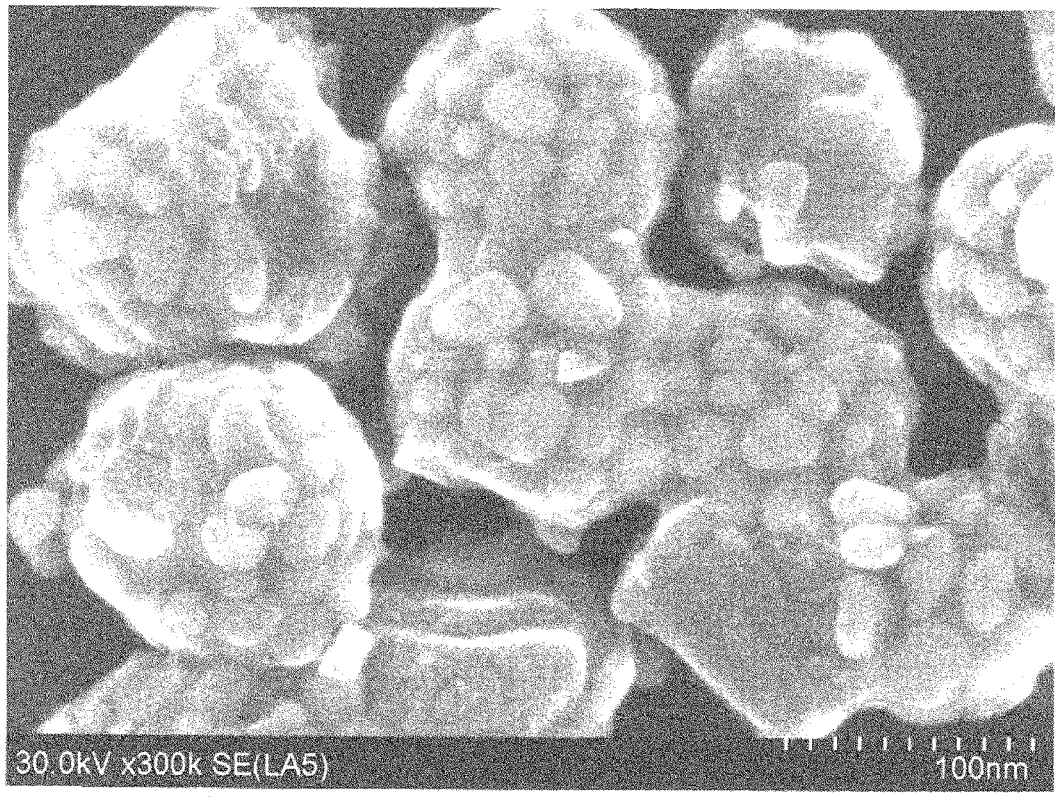
FIG. 4(a) is an SEM image of composite fine particles in Example 2.
FIG. 4(b) is a TEM image of the composite fine particles in Example 2.
Figure 4:
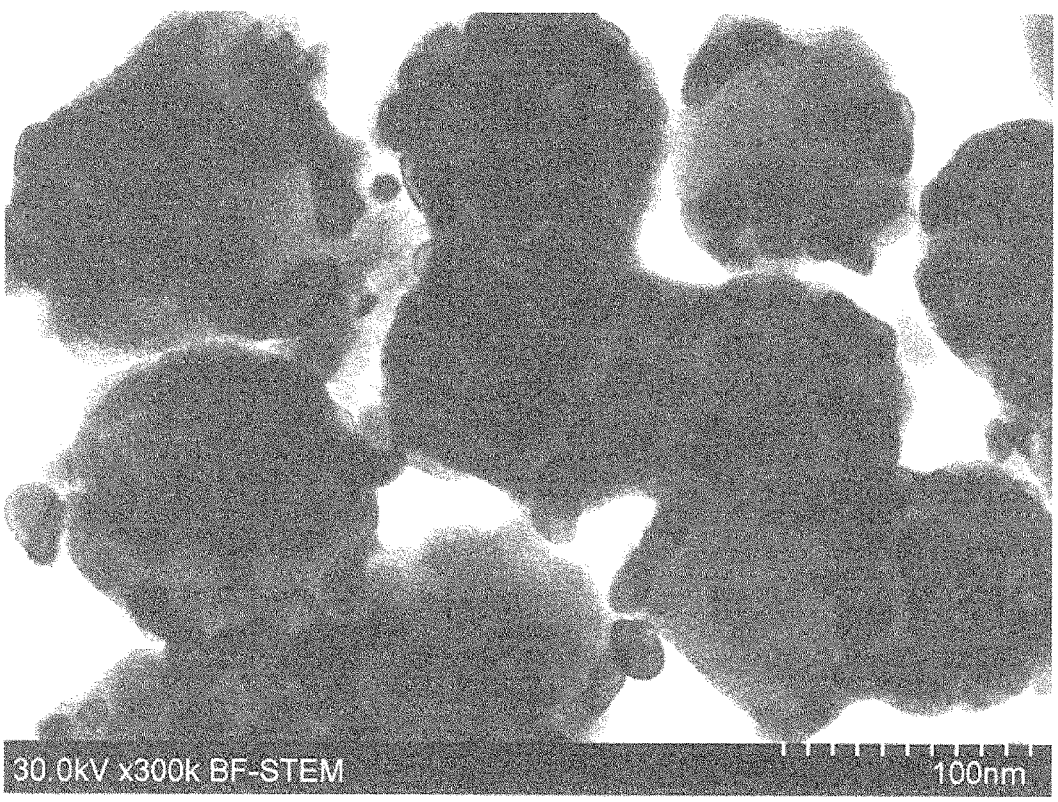

The ceria-based composite fine particles contained in the ceria-based composite fine particle dispersion obtained in Example 2 was observed using SEM and TEM. An SEM image and a TEM image are shown in FIG. 4(a) and FIG. 4(b), respectively. It was observed from FIG. 4 that a thin cerium-containing silica layer was present so as to cover the outermost surfaces of the ceria-based composite fine particles. It was also observed from the SEM image that the cerium-containing silica layer covered the surfaces of the mother particles made of silica and child particles were dispersed in the layer. Further, the ceria-based composite fine particles were subjected to STEM-EDS analysis to observe the shape of the mother particles contained in the ceria-based composite fine particles. The mother particles had a shape having 5 to 25-nm projections.

Figure 5:
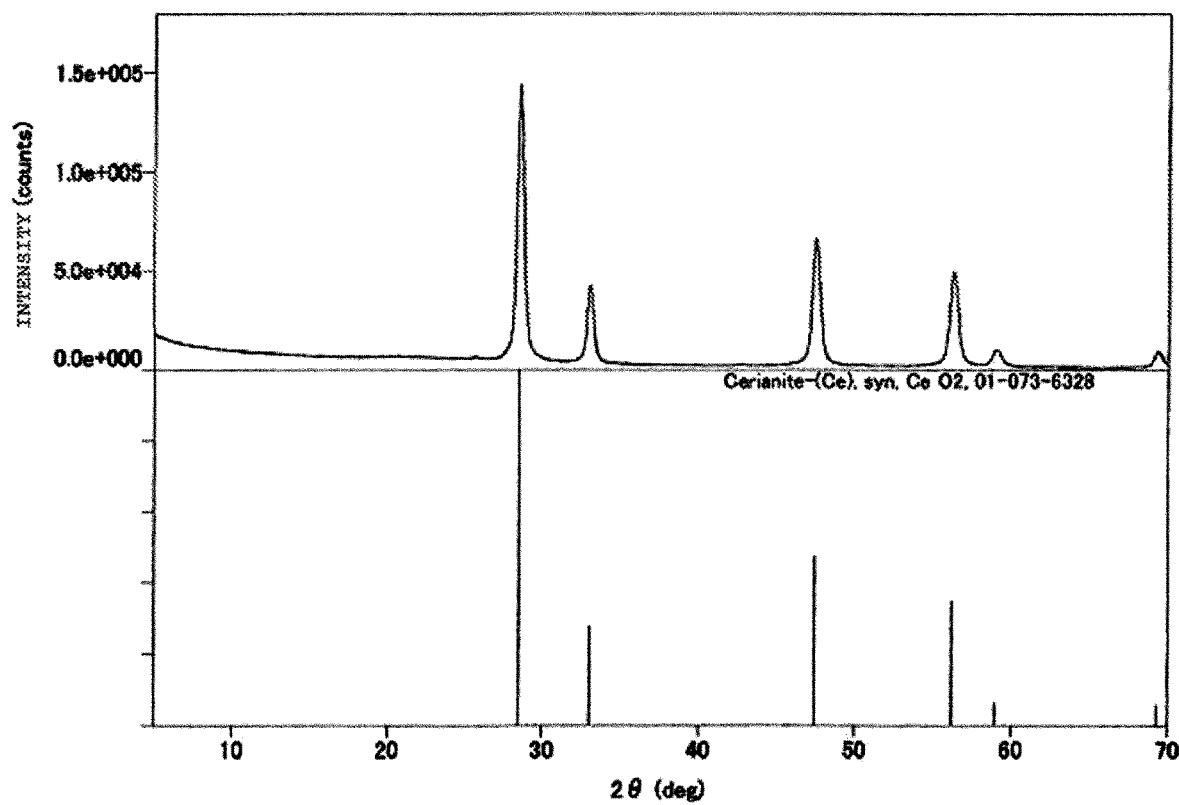
FIG. 5 is an X-ray diffraction pattern in Example 2.

Further, the ceria-based composite fine particles contained in the ceria-based composite fine particle dispersion obtained in Example 2 were measured by X-ray diffractometry. The resulting X-ray diffraction pattern is shown in FIG. 5. As shown in FIG. 5, a rather sharp Cerianite crystal pattern was observed in the X-ray diffraction pattern.

Example 3

The same operation (preparation of the ceria-based fine particle dispersion) and evaluation as in Example 1 were performed except that burning was performed at a burning temperature of 1,107° C. instead of 1,030° C. at which burning was performed in Example 1.

Figure 6:
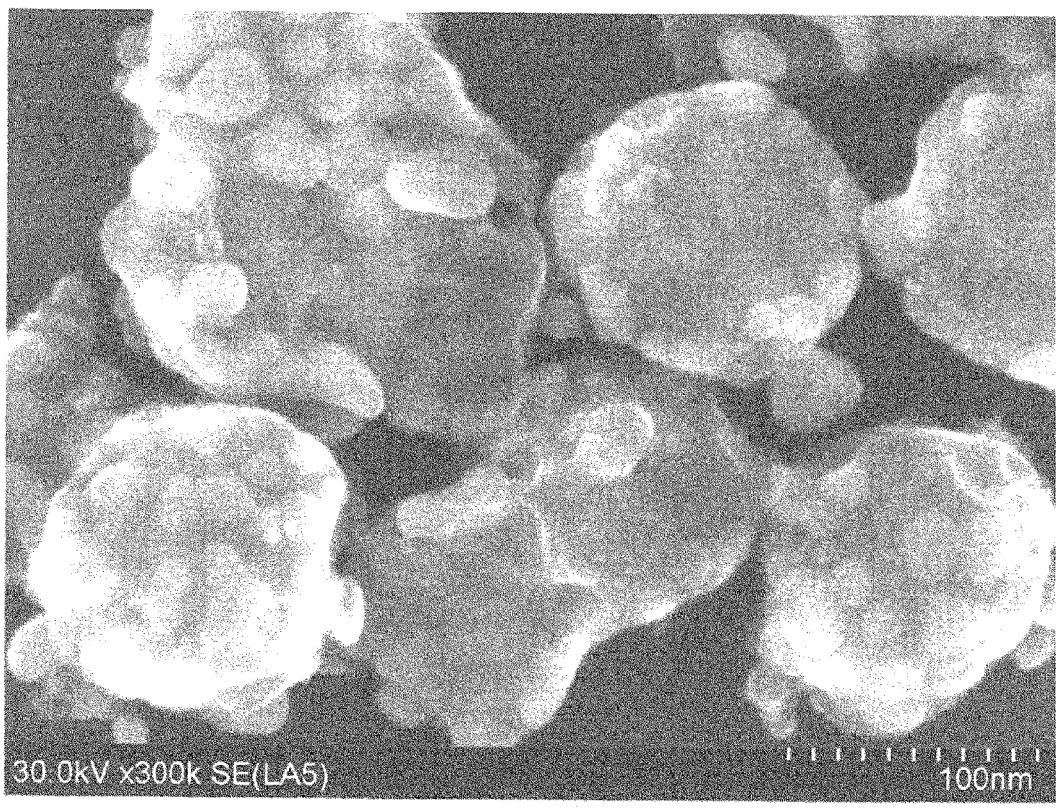
FIG. 6(a) is an SEM image of composite fine particles in Example 3.
FIG. 6(b) is a TEM image of the composite fine particles in Example 3.
Figure 6:
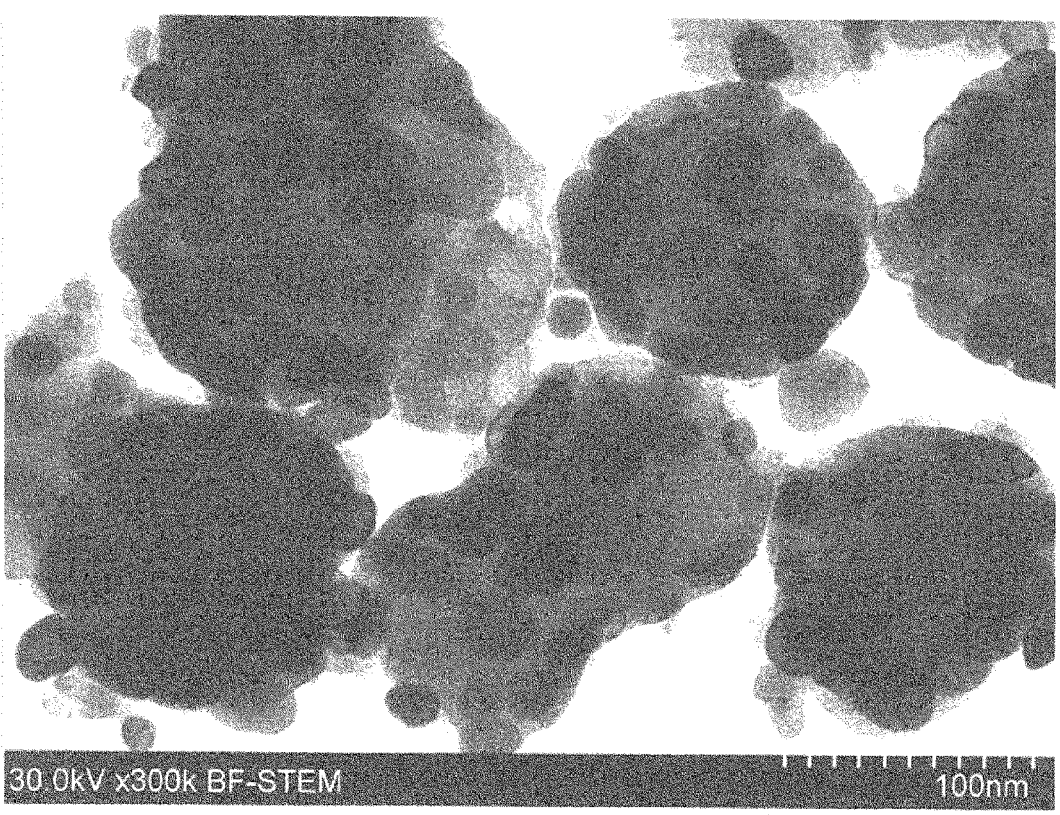

The ceria-based composite fine particles contained in the ceria-based composite fine particle dispersion obtained in Example 3 was observed using SEM and TEM. An SEM image and a TEM image are shown in FIG. 6(a) and FIG. 6(b), respectively. It was observed from FIG. 6 that a cerium-containing silica layer was present so as to cover the outermost surfaces of the ceria-based composite fine particles. It was also observed from the SEM image that the cerium-containing silica layer covered the surfaces of the mother particles made of silica and child particles were dispersed in the layer. Further, the ceria-based composite fine particles were subjected to STEM-EDS analysis to observe the shape of the mother particles contained in the ceria-based composite fine particles. The mother particles had a shape having 5 to 25-nm projections.

Figure 7:
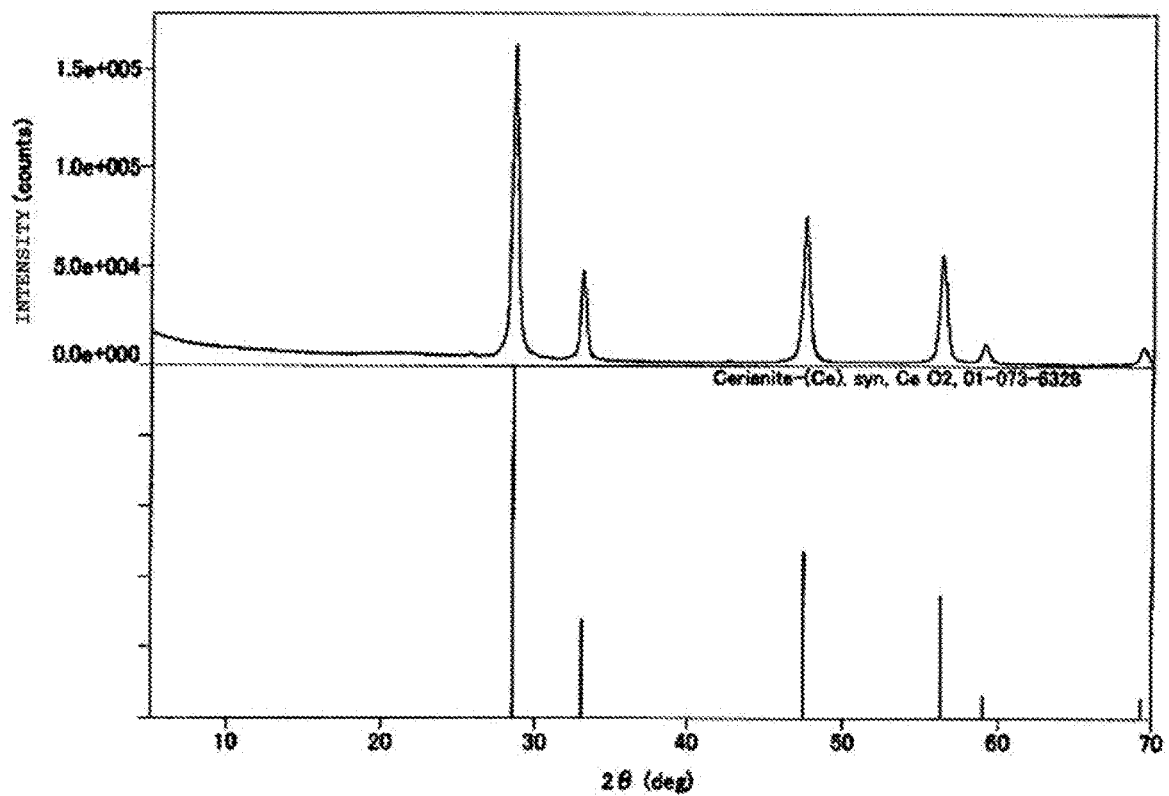
FIG. 7 is an X-ray diffraction pattern in Example 3.

Further, the ceria-based composite fine particles contained in the ceria-based composite fine particle dispersion obtained in Example 3 were measured by X-ray diffractometry. The resulting X-ray diffraction pattern is shown in FIG. 7. As shown in FIG. 7, a rather sharp Cerianite crystal pattern was observed in the X-ray diffraction pattern.

Example 4

In Example 1, the solution A (6,000 g) was maintained at 10° C. and the solution B (7,186.7 g) was added to the solution A with stirring over 18 hours, and during this operation, the solution was maintained at a temperature of 10° C. and 3% ammonia water was optionally added to maintain the solution at a pH of 8.6 to 8.8. In Example 4, however, the solution A (6,000 g) was maintained at 10° C. and the solution B (4,790.7 g) was added to the solution A with stirring over 12 hours, and after the end of addition, the mixture was aged at 10° C. for 2 hours. Then, the temperature was increased to 50° C. and after the temperature increase, the solution B (2,396 g) was added over 6 hours (total amount of the solution B: 7,186.7 g). During addition of the solution B, 3% ammonia water was optionally added so that the pH was kept at 8.9 to 9.1 during mixing at 10° C. and at 7.2 to 7.4 during mixing at 50° C. After the end of addition, the solution was aged at a solution temperature of 50° C. for 4 hours. During addition of the solution B and aging, mixing was performed while air was blown into the solution mixture, and the oxidation-reduction potential was kept at 100 to 200 mV.

Although burning was performed at a burning temperature of 1,030° C. in Example 1, burning was performed at 1,100° C. in Example 4.

Apart from these points, the same operation (preparation of the ceria-based fine particle dispersion) and evaluation as in Example 1 were performed.

The ceria-based composite fine particles were subjected to STEM-EDS analysis to observe the shape of the mother particles contained in the ceria-based composite fine particles. The mother particles had a shape having 5 to 25-nm projections.

Example 5

In Example 4, the temperature of the solution A was kept at 10° C., the predetermined amount of the solution B was added to the solution A with stirring, 3% ammonia water was added to maintain the solution at the predetermined pH, the mixture was then aged at 10° C. for 2 hours, the temperature was further increased to 50° C., 3% ammonia water was added while adding the predetermined amount of the solution B to keep the pH at the predetermined value, and the mixture was then aged at 50° C. for 4 hours. In Example 5, however, the temperature of the solution A was kept at 50° C., a predetermined amount of the solution B was added to the solution A with stirring, 3% ammonia water was added to keep the pH at 7.2 to 7.4, the mixture was then aged at 50° C. for 2 hours, the mixture was further cooled to 10° C., 3% ammonia water was added while adding a predetermined amount of the solution B to adjust the pH to 8.9 to 9.1 and the resulting mixture was then aged at 10° C. for 4 hours. Apart from these points, the same operation (preparation of the ceria-based fine particle dispersion) and evaluation as in Example 4 were performed.

The ceria-based composite fine particles were subjected to STEM-EDS analysis to observe the shape of the mother particles contained in the ceria-based composite fine particles. The mother particles had a shape having 5 to 25-nm projections.

Example 6

The same operation (preparation of the ceria-based fine particle dispersion) and evaluation as in Example 1 were performed except that an aqueous ammonia solution was added during the grinding to keep the pH at 9.2 in Example 1 but at 8.6 in Example 6.

The ceria-based composite fine particles were subjected to STEM-EDS analysis to observe the shape of the mother particles contained in the ceria-based composite fine particles. The mother particles had a shape having 5 to 25-nm projections.

Example 7

Pure water (16,654.2 g) was added while stirring the 3.1 mass % dispersion including the burned and ground body (3,225.8 g; dry amount: 100 g) obtained in the grinding step in Example 1. Then, a diluted high-purity acidic silicate solution (200 g; dry amount: 0.4 g) obtained by diluting the high-purity acidic silicate solution obtained in the preparation step 2 to 0.2% through addition of pure water was added (total weight: 20,080 g; total dry amount: 100.4 g). The addition was followed by aging with continued stirring at 50° C. for 24 hours. The aging was followed by concentration using a rotary evaporator to obtain a 3.0 mass % aged concentrate.

The resulting aged concentrate was treated at 1,700 G for 102 seconds by a centrifuge (model CR21G manufactured by Hitachi Koki Co., Ltd.), and light liquid was collected to obtain a ceria-based composite fine particle dispersion. Then, the same operation (preparation of the ceria-based fine particle dispersion) and evaluation as in Example 1 were performed.

The ceria-based composite fine particles were subjected to STEM-EDS analysis to observe the shape of the mother particles contained in the ceria-based composite fine particles. The mother particles had a shape having 5 to 25-nm projections.

Comparative Example 1

Cation exchange resin (SK-1BH manufactured by Mitsubishi Chemical Corporation; 114 g) was gradually added to the silica-based fine particle dispersion (1,053 g) obtained in the preparation step 1 and the dispersion was stirred for 30 minutes to separate the resin. The pH at that time was 5.1.

Next, ultrapure water was added to the silica-based fine particle dispersion to obtain a dispersion (6,000 g; $SiO_2$ dry amount: 180 g) having an $SiO_2$ solids concentration of 3 mass % (this dispersion is hereinafter referred to also as solution A-1).

Next, ion exchanged water was added to cerium(III) nitrate hexahydrate (4 N high-purity reagent manufactured by Kanto Chemical Co., Inc.) to obtain an aqueous cerium nitrate solution having a concentration of 2.5 mass % in terms of $CeO_2$ (this solution is hereinafter referred to also as solution B-1).

Next, the temperature of the solution A-1 (6,000 g) was increased to 50° C. and the solution B-1 (8,120 g, 112.8 parts by mass of $CeO_2$ was contained with respect to 100 parts by mass of $SiO_2$) was added to the solution A-1 with stirring over 18 hours. During this operation, the solution was maintained at a temperature of 50° C. and 3% ammonia water was optionally added to keep the pH at 7.85. During addition of the solution B-1 and aging, mixing was performed while air was blown into the solution mixture, and the oxidation-reduction potential was kept at a positive value.

After the end of addition of the solution B-1, the temperature of the solution was increased to 93° C. and the solution was aged for 4 hours. After the end of aging, the solution was allowed to stand indoors and cool to room temperature, and thereafter cleaning was performed while supplying ion exchanged water through an ultrafiltration membrane. The precursor particle dispersion obtained after the end of cleaning had a solids concentration of 7 mass %, a pH of 9.1 (at 25° C.) and an electric conductivity of 67 µs/cm (at 25° C.)

Next, a 5 mass % aqueous acetic acid solution was added to the resulting precursor particle dispersion to adjust the pH to 6.5 and the mixture was dried in a dryer at 100° C. for 16 hours. After that, burning was performed for 2 hours using a muffle furnace at 1,088° C. to obtain a powder.

The powder (310 g) obtained after the burning and ion exchanged water (430 g) were placed in a 1 L handle beaker and 3% aqueous ammonia solution was added. The mixture was exposed to ultrasonic irradiation with stirring for 10 minutes in an ultrasonic bath to obtain a suspension having a pH of 10 (temperature: 25° C.)

Next, quartz beads (595 g) having a diameter of 0.25 mm were introduced into a grinder (LMZ06 manufactured by Ashizawa Finetech Ltd.) that had previously been subjected to equipment cleaning and water operation. The above-described suspension was further charged into a charge tank of the grinder (filling factor: 85%). The concentration during the grinding is 25 mass % in consideration of the ion exchanged water remaining in the grinding chamber and piping of the grinder. Then, wet grinding was performed under conditions of a disk circumferential velocity in the grinder of 12 m/s, a number of passes of 25, and a retention time per pass of 0.43 minutes. For each path, 3% aqueous ammonia solution was added so as to maintain the suspension during the grinding at a pH of 10. A ceria-based composite fine particle dispersion having a solids concentration of 22 mass % was thus obtained.

Next, the resulting fine particle dispersion was centrifuged at a relative centrifugal acceleration of 675 G for 1 minute by a centrifuge (model CR21G manufactured by Hitachi Koki Co., Ltd.) and precipitated components were removed to obtain a ceria-based composite fine particle dispersion.

Figure 8:
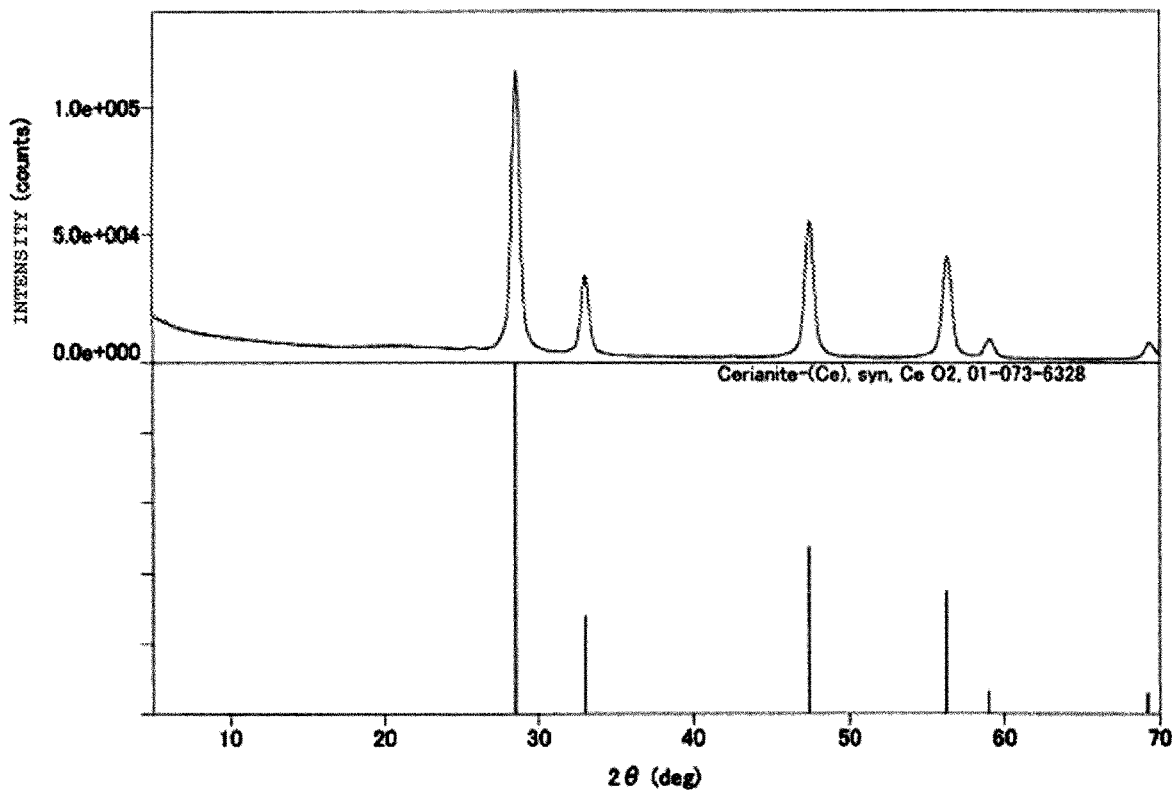
FIG. 8 is an X-ray diffraction pattern in Comparative Example 1.

Ceria-based composite fine particles contained in the ceria-based composite fine particle dispersion obtained in Comparative Example 1 were measured by X-ray diffractometry. The resulting X-ray diffraction pattern is shown in FIG. 8.

Comparative Example 2

The same operation (preparation of the ceria-based fine particle dispersion) and evaluation as in Comparative Example 1 were performed except that the dry powder obtained in Comparative Example 1 by drying in the dryer at 100° C. for 16 hours was burned at 1,205° C.

Example 8

The same operation (preparation of the ceria-based fine particle dispersion) and evaluation as in Example 1 were performed except that the grinding time applied in Example 1 to grind the suspension containing the burned powder and adjusted to a pH of 9.2 was 120 minutes but the grinding time applied in Example 8 was 600 minutes.

The ceria-based composite fine particles were subjected to STEM-EDS analysis to observe the shape of the mother particles contained in the ceria-based composite fine particles. The mother particles had a shape having 5 to 25-nm projections.

TABLE 1

| | Measurement target | | Unit | Example 1 | Example 2 | Example 3 | Example 4 | Example 5 |
|---|---|---|---|---|---|---|---|---|
| Silica-based fine particles | Average particle size of silica-based fine particles | | nm | 113 | 113 | 113 | 113 | 113 |
| | Percentage of number of particles having ratio between shorter diameter and longer diameter of 0.8 or less in silica-based fine particles | | % | 0 | 0 | 0 | 0 | 0 |
| | Impurity contents in silica-based fine particles (with respect to silica dry amount) | Na | ppm | 1 ppm or less | 1 ppm or less | 1 ppm or less | 1 ppm or less | 1 ppm or less |
| | | Ag | ppm | 1 ppm or less | 1 ppm or less | 1 ppm or less | 1 ppm or less | 1 ppm or less |
| | | Al | ppm | 1 ppm or less | 1 ppm or less | 1 ppm or less | 1 ppm or less | 1 ppm or less |
| | | Ca | ppm | 1 ppm or less | 1 ppm or less | 1 ppm or less | 1 ppm or less | 1 ppm or less |
| | | Cr | ppm | 1 ppm or less | 1 ppm or less | 1 ppm or less | 1 ppm or less | 1 ppm or less |
| | | Cu | ppm | 1 ppm or less | 1 ppm or less | 1 ppm or less | 1 ppm or less | 1 ppm or less |
| | | Fe | ppm | 1 ppm or less | 1 ppm or less | 1 ppm or less | 1 ppm or less | 1 ppm or less |

TABLE 1-continued

|  |  |  | Example 1 | Example 2 | Example 3 | Example 4 | Example 5 |
|---|---|---|---|---|---|---|---|
|  | K | ppm | 1 ppm or less | 1 ppm or less | 1 ppm or less | 1 ppm or less | 1 ppm or less |
|  | Mg | ppm | 1 ppm or less | 1 ppm or less | 1 ppm or less | 1 ppm or less | 1 ppm or less |
|  | Ni | ppm | 1 ppm or less | 1 ppm or less | 1 ppm or less | 1 ppm or less | 1 ppm or less |
|  | Ti | ppm | 1 ppm or less | 1 ppm or less | 1 ppm or less | 1 ppm or less | 1 ppm or less |
|  | Zn | ppm | 1 ppm or less | 1 ppm or less | 1 ppm or less | 1 ppm or less | 1 ppm or less |
|  | U | ppm | 1 ppm or less | 1 ppm or less | 1 ppm or less | 1 ppm or less | 1 ppm or less |
|  | Th | ppm | 1 ppm or less | 1 ppm or less | 1 ppm or less | 1 ppm or less | 1 ppm or less |
|  | $SO_4$ | ppm | 1 ppm or less | 1 ppm or less | 1 ppm or less | 1 ppm or less | 1 ppm or less |
|  | $NO_3$ | ppm | 1 ppm or less | 1 ppm or less | 1 ppm or less | 1 ppm or less | 1 ppm or less |
|  | Cl | ppm | 1 ppm or less | 1 ppm or less | 1 ppm or less | 1 ppm or less | 1 ppm or less |
|  | F | ppm | 1 ppm or less | 1 ppm or less | 1 ppm or less | 1 ppm or less | 1 ppm or less |

| Measurement target | | Unit | Example 6 | Example 7 | Example 8 | Comparative Example 1 | Comparative Example 2 |
|---|---|---|---|---|---|---|---|
| Silica-based fine particles | Average particle size of silica-based fine particles | nm | 113 | 113 | 113 | 113 | 113 |
|  | Percentage of number of particles having ratio between shorter diameter and longer diameter of 0.8 or less in silica-based fine particles | % | 0 | 0 | 0 | 0 | 0 |
| Impurity contents in silica-based fine particles (with respect to silica dry amount) | Na | ppm | 1 ppm or less | 1 ppm or less | 1 ppm or less | 1 ppm or less | 1 ppm or less |
|  | Ag | ppm | 1 ppm or less | 1 ppm or less | 1 ppm or less | 1 ppm or less | 1 ppm or less |
|  | Al | ppm | 1 ppm or less | 1 ppm or less | 1 ppm or less | 1 ppm or less | 1 ppm or less |
|  | Ca | ppm | 1 ppm or less | 1 ppm or less | 1 ppm or less | 1 ppm or less | 1 ppm or less |
|  | Cr | ppm | 1 ppm or less | 1 ppm or less | 1 ppm or less | 1 ppm or less | 1 ppm or less |
|  | Cu | ppm | 1 ppm or less | 1 ppm or less | 1 ppm or less | 1 ppm or less | 1 ppm or less |
|  | Fe | ppm | 1 ppm or less | 1 ppm or less | 1 ppm or less | 1 ppm or less | 1 ppm or less |
|  | K | ppm | 1 ppm or less | 1 ppm or less | 1 ppm or less | 1 ppm or less | 1 ppm or less |
|  | Mg | ppm | 1 ppm or less | 1 ppm or less | 1 ppm or less | 1 ppm or less | 1 ppm or less |
|  | Ni | ppm | 1 ppm or less | 1 ppm or less | 1 ppm or less | 1 ppm or less | 1 ppm or less |
|  | Ti | ppm | 1 ppm or less | 1 ppm or less | 1 ppm or less | 1 ppm or less | 1 ppm or less |
|  | Zn | ppm | 1 ppm or less | 1 ppm or less | 1 ppm or less | 1 ppm or less | 1 ppm or less |
|  | U | ppm | 1 ppm or less | 1 ppm or less | 1 ppm or less | 1 ppm or less | 1 ppm or less |
|  | Th | ppm | 1 ppm or less | 1 ppm or less | 1 ppm or less | 1 ppm or less | 1 ppm or less |
|  | $SO_4$ | ppm | 1 ppm or less | 1 ppm or less | 1 ppm or less | 1 ppm or less | 1 ppm or less |
|  | $NO_3$ | ppm | 1 ppm or less | 1 ppm or less | 1 ppm or less | 1 ppm or less | 1 ppm or less |
|  | Cl | ppm | 1 ppm or less | 1 ppm or less | 1 ppm or less | 1 ppm or less | 1 ppm or less |
|  | F | ppm | 1 ppm or less | 1 ppm or less | 1 ppm or less | 1 ppm or less | 1 ppm or less |

TABLE 2

| Measurement target | | | Unit | Example 1 | Example 2 | Example 3 | Example 4 | Example 5 |
|---|---|---|---|---|---|---|---|---|
| Ceria-based composite fine particles | Impurity contents in ceria-based composite fine particles (with respect to dry amount) | Na | ppm | 1 ppm or less | 1 ppm or less | 1 ppm or less | 1 ppm or less | 1 ppm or less |
|  |  | Ag | ppm | 1 ppm or less | 1 ppm or less | 1 ppm or less | 1 ppm or less | 1 ppm or less |
|  |  | Al | ppm | 1 ppm or less | 1 ppm or less | 1 ppm or less | 1 ppm or less | 1 ppm or less |
|  |  | Ca | ppm | 1 ppm or less | 1 ppm or less | 1 ppm or less | 1 ppm or less | 1 ppm or less |
|  |  | Cr | ppm | 1 ppm or less | 1 ppm or less | 1 ppm or less | 1 ppm or less | 1 ppm or less |
|  |  | Cu | ppm | 1 ppm or less | 1 ppm or less | 1 ppm or less | 1 ppm or less | 1 ppm or less |
|  |  | Fe | ppm | 1 ppm or less | 1 ppm or less | 1 ppm or less | 1 ppm or less | 1 ppm or less |
|  |  | K | ppm | 1 ppm or less | 1 ppm or less | 1 ppm or less | 1 ppm or less | 1 ppm or less |
|  |  | Mg | ppm | 1 ppm or less | 1 ppm or less | 1 ppm or less | 1 ppm or less | 1 ppm or less |
|  |  | Ni | ppm | 1 ppm or less | 1 ppm or less | 1 ppm or less | 1 ppm or less | 1 ppm or less |
|  |  | Ti | ppm | 1 ppm or less | 1 ppm or less | 1 ppm or less | 1 ppm or less | 1 ppm or less |
|  |  | Zn | ppm | 1 ppm or less | 1 ppm or less | 1 ppm or less | 1 ppm or less | 1 ppm or less |
|  |  | U | ppm | 1 ppm or less | 1 ppm or less | 1 ppm or less | 1 ppm or less | 1 ppm or less |
|  |  | Th | ppm | 1 ppm or less | 1 ppm or less | 1 ppm or less | 1 ppm or less | 1 ppm or less |
|  |  | $SO_4$ | ppm | 1 ppm or less | 1 ppm or less | 1 ppm or less | 1 ppm or less | 1 ppm or less |
|  |  | $NO_3$ | ppm | 1 ppm or less | 1 ppm or less | 1 ppm or less | 1 ppm or less | 1 ppm or less |
|  |  | Cl | ppm | 1 ppm or less | 1 ppm or less | 1 ppm or less | 1 ppm or less | 1 ppm or less |
|  |  | F | ppm | 1 ppm or less | 1 ppm or less | 1 ppm or less | 1 ppm or less | 1 ppm or less |

| Measurement target | | | Unit | Example 6 | Example 7 | Example 8 | Comparative Example 1 | Comparative Example 2 |
|---|---|---|---|---|---|---|---|---|
| Ceria-based composite fine particles | Impurity contents in ceria-based composite fine particles (with respect to dry amount) | Na | ppm | 1 ppm or less | 1 ppm or less | 1 ppm or less | 1 ppm or less | 1 ppm or less |
|  |  | Ag | ppm | 1 ppm or less | 1 ppm or less | 1 ppm or less | 1 ppm or less | 1 ppm or less |
|  |  | Al | ppm | 1 ppm or less | 1 ppm or less | 1 ppm or less | 1 ppm or less | 1 ppm or less |
|  |  | Ca | ppm | 1 ppm or less | 1 ppm or less | 1 ppm or less | 1 ppm or less | 1 ppm or less |
|  |  | Cr | ppm | 1 ppm or less | 1 ppm or less | 1 ppm or less | 1 ppm or less | 1 ppm or less |
|  |  | Cu | ppm | 1 ppm or less | 1 ppm or less | 1 ppm or less | 1 ppm or less | 1 ppm or less |
|  |  | Fe | ppm | 1 ppm or less | 1 ppm or less | 1 ppm or less | 1 ppm or less | 1 ppm or less |
|  |  | K | ppm | 1 ppm or less | 1 ppm or less | 1 ppm or less | 1 ppm or less | 1 ppm or less |
|  |  | Mg | ppm | 1 ppm or less | 1 ppm or less | 1 ppm or less | 1 ppm or less | 1 ppm or less |

TABLE 2-continued

| | | | | | | |
|---|---|---|---|---|---|---|
| Ni | ppm | 1 ppm or less | 1 ppm or less | 1 ppm or less | 1 ppm or less | 1 ppm or less |
| Ti | ppm | 1 ppm or less | 1 ppm or less | 1 ppm or less | 1 ppm or less | 1 ppm or less |
| Zn | ppm | 1 ppm or less | 1 ppm or less | 1 ppm or less | 1 ppm or less | 1 ppm or less |
| U | ppm | 1 ppm or less | 1 ppm or less | 1 ppm or less | 1 ppm or less | 1 ppm or less |
| Th | ppm | 1 ppm or less | 1 ppm or less | 1 ppm or less | 1 ppm or less | 1 ppm or less |
| $SO_4$ | ppm | 1 ppm or less | 1 ppm or less | 1 ppm or less | 1 ppm or less | 1 ppm or less |
| $NO_3$ | ppm | 1 ppm or less | 1 ppm or less | 1 ppm or less | 1 ppm or less | 1 ppm or less |
| Cl | ppm | 1 ppm or less | 1 ppm or less | 1 ppm or less | 1 ppm or less | 1 ppm or less |
| F | ppm | 1 ppm or less | 1 ppm or less | 1 ppm or less | 1 ppm or less | 1 ppm or less |

TABLE 3

| | Measurement target | Unit | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|---|---|
| Ceria-based composite fine particles | $SiO_2$ content in ceria-based composite fine particles | Mass % | 45.5 | 45.5 | 45.5 | 45.5 | 45.5 | 45.5 | 45.7 | 45.5 | 47.0 | 47.0 |
| | $CeO_2$ content in ceria-based composite fine particles | Mass % | 54.5 | 54.5 | 54.5 | 54.5 | 54.5 | 54.5 | 54.3 | 54.5 | 53.0 | 53.0 |
| | Parts by mass of ceria with respect to 100 parts by mass of silica | Parts by mass | 119.8 | 119.8 | 119.8 | 119.8 | 119.8 | 119.8 | 118.8 | 119.8 | 112.8 | 112.8 |
| | Burning temperature | °C. | 1030 | 1078 | 1107 | 1100 | 1100 | 1030 | 1030 | 1030 | 1088 | 1205 |
| | Crystallite size | nm | 15.2 | 18.4 | 20.8 | 20.4 | 20.6 | 15.2 | 15.2 | 15.1 | 15.2 | 26.2 |
| | Average particle size of child particles | nm | 17.1 | 23.2 | 24.6 | 20.6 | 21.6 | 17.1 | 17.1 | 17.1 | 17.6 | 27.6 |
| | Standard deviation of ceria child particle size | nm | 3.6 | 5.8 | 5.3 | 5.3 | 5.7 | 3.7 | 3.6 | 3.7 | 2.4 | 5.3 |
| | Coefficient of variation of ceria child particle size | % | 21.1 | 25.0 | 21.5 | 25.7 | 26.4 | 21.6 | 21.1 | 21.6 | 13.6 | 19.2 |
| | Specific surface area of ceria-based composite fine particles | $m^2/g$ | 27 | 27 | 27 | 32 | 32 | 27 | 27 | 36 | 37 | 28 |
| | Crystal type | — | Cerianite | Cerianite | Cerianite | Cerianite | Cerianite | Cerianite | Cerianite | Cerianite | Cerianite | Cerianite Cristobalite |
| | Average particle size of ceria-based composite fine particles | nm | 133 | 153 | 166 | 174 | 172 | 135 | 134 | 128 | 149 | 181 |
| | Percentage of number of particles having ratio between shorter diameter and longer diameter of less than 0.8 | % | 52 | 56 | 76 | 73 | 75 | 54 | 51 | 44 | 59 | 92 |
| | Percentage of number of particles having ratio between shorter diameter and longer diameter of 0.8 or more | % | 48 | 44 | 24 | 27 | 25 | 46 | 49 | 56 | 41 | 8 |
| | Number of coarse particles having particle size af 0.51μ or more counted on dry basis | One million particles/cc | 29 | 67 | 52 | 43 | 56 | 32 | 30 | 40 | 170 | 8900 |
| Evaluation of polishing | $SiO_2$ film Polishing rate | nm/min | 630 | 670 | 730 | 706 | 710 | 600 | 648 | 582 | 430 | 361 |
| | Surface Roughness | nm | 0.10 | 0.11 | 0.12 | 0.12 | 0.12 | 0.10 | 0.10 | 0.09 | 0.13 | Number of flaws is too large to be measured exactly |
| | Flaws due to Polishing | — | Flaws due to Polishing are definitely not seen | Flaws due to Polishing are definitely not seen | Flaws due to Polishing are definitely not seen | Flaws due to Polishing are definitely not seen | Flaws due to Polishing are definitely not seen | Flaws due to Polishing are definitely not seen | Flaws due to Polishing are definitely not seen | Flaws due to Polishing are definitely not seen | Flaws due to Polishing are definitely not seen | Flaws due to Polishing are immerble |
| | Aluminum hard disk Scratches | — | Few | Few | Few | Few | Few | Few | Few | Few | A few | Too numerous to count |

Experiment 2

[Measurement of State of Si Solid Solution]

The ceria-based composite fine particle dispersions prepared in Example 1 and Comparative Example 2 were subjected to measurement of X-ray absorption spectra at CeL III absorption edge (5,727 eV) using an X-ray absorption spectrometer (R-XAS Looper manufactured by Rigaku Corporation) to obtain EXAFS vibrations appearing on the X-ray absorption spectra. Software REX-2000 manufactured by Rigaku Corporation was used for analysis and the average coordination numbers N of oxygen and cerium atoms on the periphery of cerium and the average bond lengths R were obtained. The results are shown in Table 4.

It was confirmed from the results in Table 4 that in Example 1, oxygen, silicon, and cerium are present on the periphery of cerium, the interatomic distance between cerium and oxygen is 2.4 Å, and the interatomic distance between cerium and cerium is 3.8 Å, whereas the interatomic distance between cerium and silicon is 3.1 Å. It is deemed from the XRD analysis results that since cerium is present as $CeO_2$ in the crystal type of Cerianite, Si enters into solid solution in cerium oxide. In contrast, an Si coordination having a Ce center was not detected in Comparative Example 2.

TABLE 4

| | Unit | Element | Example 1 | Comparative Example 2 |
|---|---|---|---|---|
| coordination number (N) from Ce center | — | Ce | 8 | 7.9 |
| | — | Si | 1.2 | Detection limit or less |
| Distance (R) from Ce | Å | O | 2.4 | 2.3 |
| | | Ce | 3.8 | 3.7 |
| | | Si | 3.1 | — |

Experiment 3

Each measuring method and each testing method in Examples and Comparative Examples were the same as those in Experiment 1.

However, $SiO_2$, $CeO_2$, and silica as the component of the projections were measured as described below.

Measurement results and testing results in Examples and Comparative Examples are shown in Tables 5, 6, and 7.

Unless otherwise specified, "silica concentration" means silica solids concentration. "Solids concentration" as simply used herein means concentration of fine particles dispersed in a solvent irrespective of chemical species.

Synthesis Example 1

Preparation of Dispersion of Silica-Based Fine Particles a Having Projections

Ion exchanged water was added to dilute a dispersion having silica fine particles dispersed therein (Cataloid SI-80P manufactured by JGC Catalysts and Chemicals Ltd.; average particle size: 80 nm; silica concentration: 40 wt %; pH: 10.2), thereby obtaining a silica fine particle dispersion (750 g) diluted to a silica concentration of 21 mass %. After that, a cation exchange resin (Duolite manufactured by Rohm and Haas Company; 150 g) was mixed and the mixture was stirred for 0.5 hours.

Then, after separation of the cation exchange resin, an anion exchange resin (SUNNUP-C manufactured by Mitsubishi Chemical Corporation; 135 g) was mixed and the mixture was stirred for 0.5 hours. Then, the anion exchange resin was separated to prepare a purified silica fine particle dispersion (750 g) having a silica concentration of 20 mass %.

Then, polyaluminum chloride (Takibine #1000 manufactured by Taki Chemical Co., Ltd.; alumina concentration: 23.55 mass %; 5.1 g) was added to the purified silica fine particle dispersion (750 g) and the mixture was stirred at room temperature for 0.5 hours. Then, pure water (2,903 g) was added for dilution to prepare a dispersion (3,659 g; pH: 3.7) of metal oxide particles (A-2) for use in substrate which had a silica concentration of 4.1 mass %.

Then, into the dispersion (3,659 g) of the metal oxide fine particles (A-2) for use in substrate, was mixed a silica ultrafine particle dispersion (Cataloid SN-350 manufactured by JGC Catalysts and Chemicals Ltd.; particle size calculated in terms of specific surface area: 7 nm; particle size under TEM observation: 9 nm; silica concentration: 16.6 mass %; pH: 3.7; 367 g), thereby obtaining a mixed dispersion (silica concentration: 4.8 mass %; pH: 3.5).

Then, an anion exchange resin (SUNNUP-C manufactured by Mitsubishi Chemical Corporation; 135 g) was mixed into the mixed dispersion and the mixture was stirred for 0.5 hours. Then, the anion exchange resin was separated. The dispersion was further aged at 93° C. for 3 hours and cooled. After that, an aqueous acetic acid solution having a concentration of 3 mass % was added to adjust the pH of the solution to 5.5. After that, the solution was dried at 120° C. for 15 hours and burned at 1,000° C. for 2 hours.

Powder obtained by burning was dispersed in pure water to obtain a silica-based fine particle dispersion having a silica concentration of 10 wt %. The dispersion was ground at 2,160 rpm for 180 minutes using a sand mill (glass beads manufactured by Shinmaru Enterprises Corporation; diameter: 0.5 mm; 1,100 g). Then, the glass beads were separated to obtain a silica fine particle dispersion.

To the silica fine particle dispersion were added ion exchanged water and hydrochloric acid to dilute the dispersion so that the solids concentration was 3.0% and the hydrochloric acid concentration was 3.0%. The dispersion was increased to a temperature of 60° C. and aged at the temperature kept at 60° C. for 6 hours. The dispersion was allowed to stand at room temperature and cool. After that, an anion exchange resin was added and the mixture was stirred at room temperature for 1 hour. Then, the ion exchange resin was separated. Further, a cation exchange resin was added and the mixture was stirred at room temperature for 1 hour. Then, the ion exchange resin was separated. The same operations were repeated, and after that, the dispersion after the separation was further subjected to centrifugation at 2,000 rpm for 3 minutes using a centrifuge (High-Speed Refrigerated Centrifuge manufactured by Hitachi, Ltd.). Supernatant was separated, and the resulting supernatant was concentrated by a rotary evaporator to prepare a dispersion of silica-based fine particles A having projections (silica concentration: 10 mass %).

As a result of observation of an image of the silica-based fine particles A magnified 300,000 times using a transmission electron microscope, it could be confirmed that the silica-based fine particles A had a crenated shape. Further, the width of any 50 projections was measured, and its average value (namely the width of the projections) was 9 nm.

Synthesis Example 2

Preparation of Dispersion of Silica-Based Fine Particles B Having Projections

[Preparation of purified silica-based fine particle dispersion]

Ultrapure water (3,050 g) was added to silica sol manufactured by JGC Catalysts and Chemicals Ltd.: trade name: Cataloid SI-80P (particle size calculated in terms of specific surface area: 80 nm; silica concentration: 40.5 mass %; 1,000 g) to obtain silica sol (4,050 g) having a silica concentration of 10 mass %. Then, a cation exchange resin (SK1BH manufactured by Mitsubishi Chemical Corporation; 500 g) was gradually added with stirring. After the addition, the mixture was increased to a temperature of 80° C., maintained at that temperature for 6 hours, and cooled. After that, the resin was separated. The resulting silica fine particle dispersion was concentrated by a rotary evaporator to obtain a purified silica fine particle dispersion (silica concentration: 40.5 mass %).

[Preparation of Acidic Silicate Solution]

Pure water was added to an aqueous sodium silicate solution (silica concentration: 24.06 mass %; $Na_2O$ concentration: 7.97 mass %) to obtain an aqueous sodium silicate solution (silica concentration: 5 mass %).

The resulting aqueous sodium silicate solution (18 kg) was passed through a strong acid cation exchange resin (6 L; SK1BH manufactured by Mitsubishi Chemical Corporation) at a space velocity of 3.0 $h^{-1}$ to obtain an acidic silicate solution (18 kg; silica concentration: 4.6 mass %; pH: 2.7).

[Preparation of Diluted Sodium Aluminate Solution]

Ultrapure water (324.2 g) was added to sodium aluminate (13.8 g; alumina concentration: 22 mass %) to obtain a diluted sodium aluminate solution (alumina concentration: 0.9 mass %).

[Preparation of Silica-Based Fine Particles B Having Projections]

Ultrapure water (11,432 g) was added to the purified silica fine particle dispersion (1,300 g) to dilute the dispersion to a silica concentration of 4.1 mass %. The temperature of the dispersion was increased to 98° C. with stirring. After that, the diluted sodium aluminate solution (alumina concentration: 0.9 mass %) was added over 5 minutes. After the addition, the solution was held at 98° C. for 1 hour.

An aqueous sodium silicate solution (silica concentration: 24.31 mass %; $Na_2O$ concentration: 8.00 mass %; 102.5 g) was further added over 10 minutes, and the mixture was aged for 1 hour while keeping the temperature at 98° C.

Subsequently, the acidic silicate solution (silica concentration: 4.6 mass %; 1,849 g) was added over 7 hours. After the end of addition, the mixture was aged for 1 hour while keeping the temperature at 98° C. After the end of aging, the mixture was allowed to stand at room temperature and cool to obtain a silica fine particle dispersion (solids concentration: 4.25 mass %).

To the resulting silica fine particle dispersion were added ion exchanged water and hydrochloric acid to dilute the dispersion so that the solids content was 3.0% and the hydrochloric acid concentration was 3.0%. The temperature of the dispersion was increased to 60° C. and the dispersion was aged for 6 hours at the temperature kept at 60° C. The dispersion was allowed to stand at room temperature and cool. After that, an anion exchange resin was added and the mixture was stirred at room temperature for 1 hour. Then, the ion exchange resin was separated. Further, a cation exchange resin was added and the mixture was stirred at room temperature for 1 hour. Then, the ion exchange resin was separated. The same operations were repeated, and after that, the dispersion after the separation was further subjected to centrifugation at 2,000 rpm for 3 minutes using a centrifuge (High-Speed Refrigerated Centrifuge manufactured by Hitachi, Ltd.). Supernatant was separated, and the resulting supernatant was concentrated by a rotary evaporator to prepare a dispersion of silica-based fine particles B having projections (silica concentration: 10 mass %).

As a result of observation of an image of the silica-based fine particles B magnified 300,000 times using a transmission electron microscope, it could be confirmed that the silica-based fine particles B had a crenated shape. The width of any 50 projections was measured, and its average value (namely the width of the projections) was 8 nm.

Synthesis Example 3

Preparation of Dispersion of Silica-Based Fine Particles C Having Projections

[Preparation of silica-based fine particle dispersion (average particle size of silica fine particles: 63 nm)]

A mixed solution A1, a mixed solution B1, and heel water (1) were prepared as described below.

Mixed solution A-3: Ethanol (12,090 g) was mixed with ethyl orthosilicate (6,363.9 g) to obtain the mixed solution A-3.

Mixed solution B-3: Ultrapure water (6,120 g) was mixed with 29% ammonia water (444.9 g) to obtain the mixed solution B-3.

Heel water (1): Ultrapure water (192.9 g) and ethanol (444.9 g) were mixed and used as the heel water (1).

Then, the heel water (1) was heated with stirring to adjust the temperature to 75° C. and the mixed solution A-3 and the mixed solution B-3 were simultaneously added so that addition of each solution ended in 10 hours. After the end of addition, the solution was aged while keeping the temperature at 75° C. for 3 hours. After that, the solids concentration was adjusted to obtain a silica fine particle dispersion (9,646.3 g) having a silica concentration of 19 mass % and having silica-based fine particles with an average particle size of 63 nm (according to the image analysis method) dispersed in a solvent.

[Preparation of Silica-Based Fine Particle Dispersion (Average Particle Size of Silica-Based Fine Particles: 113 nm)]

A mixed solution A-4, a mixed solution B-4, and heel water (2) were prepared as described below.

Mixed solution A-4: Methanol (2,733.3 g) was mixed with ethyl orthosilicate (1,822.2 g) to obtain the mixed solution A-4.

Mixed solution B-4: Ultrapure water (1,860.7 g) was mixed with 29% ammonia water (40.6 g) to obtain the mixed solution B-4.

Heel water (2): Ultrapure water (59 g) and methanol (1,208.9 g) were mixed and used as the heel water (2).

To the heel water (2) was added the silica-based fine particle dispersion (922.1 g) obtained as described above and containing the silica-based fine particles with an average particle size of 63 nm dispersed in a solvent. The mixture was adjusted to 65° C. with stirring, and the mixed solution A-4 and the mixed solution B-4 were simultaneously added so that addition of each solution ended in 18 hours. After the end of addition, the solution was aged while keeping the temperature at 65° C. for 3 hours. Then, the silica concentration was adjusted to obtain a high purity silica-based fine particle dispersion (3,600 g; silica concentration: 19 mass %; average particle size as measured by the image analysis method: 113 nm).

[Preparation of Dispersion of Silica-Based Fine Particles C Having Projections]

Ultrapure water was added to the high purity silica-based fine particle dispersion (silica concentration: 19 mass %) to prepare a diluted solution (4,000 g; containing 296 g of silica solids) having a silica concentration adjusted to 7.4 mass %. To the diluted solution was added ammonia water (ammonia concentration: 28 mass %) to adjust the pH to 11.2. The temperature of this solution was increased to 65° C. Subsequently, a solution of methyltrimethoxysilane diluted with methanol (obtained by diluting 1.63 g of KBM-13S manufactured by Shin-Etsu Chemical Co., Ltd. with 8.32 g of methanol) was added over 60 minutes. The mixture was further aged for 1 hour while keeping the temperature at 65° C. After the end of aging, the mixture was cooled to obtain a solution.

Ultrapure water was added to this solution to dilute the solution to a silica concentration of 3.0 mass %. The temperature of the diluted solution (8,000 g; containing 240 g of silica solids) was increased to 65° C. To this dispersion were added a mixed solution of tetraethoxysilane (ethyl orthosilicate manufactured by Tama Chemicals Co., Ltd.; 253.6 g) and methanol (481.5 g) and a mixed solution of ultrapure water (343 g) and 28% ammonia water (19 g) over 10 hours to perform hydrolysis. After the end of addition, the mixture was further aged at a temperature kept at 65° C. for 3 hours. Subsequently, the mixture was concentrated to a solids concentration of 12 mass % through an ultrafiltration membrane (SIP-1013 manufactured by Asahi Kasei Corporation). Further, methanol was approximately completely removed by a rotary evaporator to further concentrate the mixture to a solids concentration of 20 mass %, thereby obtaining a dispersion of silica-based fine particles C having 5-nm projections.

The amounts of Na, Ag, Al, Ca, Cr, Cu, Fe, K, Mg, Ni, Ti, Zn, Zr, U, Th, Cl, $NO_3$, $SO_4$, and F in the particles contained in the dispersion were 1 ppm or less, respectively.

Example 9

Ion exchanged water was added to cerium(III) nitrate hexahydrate (4 N high-purity reagent manufactured by Kanto Chemical Co., Inc.) to obtain an aqueous cerium nitrate solution having a concentration of 2.5 mass % in terms of $CeO_2$ (this solution is hereinafter referred to as solution B-5).

To the dispersion of the silica-based fine particles A having projections that had been obtained in Synthesis Example 1, was added ion exchanged water to prepare a dispersion (6,000 g; hereinafter referred to as solution A-5) having a silica concentration of 3.0 mass %.

Next, the temperature of the solution A-5 was kept at 15° C. and the solution B-5 (8,453 g, 117.4 parts by mass of $CeO_2$ was contained with respect to 100 parts by mass of $SiO_2$) was added to the solution A-5 with vigorously stirring over 18 hours. During this operation, the temperature of the solution was kept at 15° C. and 3% ammonia water was optionally added to keep the pH at 7.85. During addition of the solution B-5 and aging, mixing was performed while air was blown into the solution mixture, and the oxidation-reduction potential was kept at 100 to 200 mV.

After the end of addition of the solution B-5, the temperature of the solution was kept at 15° C. and the solution was aged for 4 hours. After the end of aging, cleaning was performed by supplying ion exchanged water through an ultrafiltration membrane. A precursor particle dispersion obtained after the end of cleaning had a solids concentration of 7 mass %.

Next, a 5 acetic acid solution was added to the resulting precursor particle dispersion to adjust the pH to 6.5 and the mixture was dried in a dryer at 100° C. for 16 hours. After that, burning was performed at 960° C. for 2 hours using a muffle furnace to obtain a powder (burned body).

The powder (burned body) (310 g) obtained after the burning and ion exchanged water (430 g) were placed in a 1 L handle beaker and 3% aqueous ammonia solution was added. The mixture was exposed to ultrasonic irradiation with stirring for 10 minutes in an ultrasonic bath to obtain a suspension having a pH of 10 (temperature: 25° C.).

Next, quartz beads (595 g) having a diameter of 0.25 mm were introduced into a grinder (LMZ06 manufactured by Ashizawa Finetech Ltd.) that had previously been subjected to equipment cleaning and water operation. The above-described suspension was further charged into a charge tank of the grinder (filling factor: 85%). The concentration during grinding is 25 mass % in consideration of the ion exchanged water remaining in the grinding chamber and piping of the grinder. Then, wet grinding was performed at a disk circumferential velocity in the grinder of 12 m/s. For each path, 3% aqueous ammonia solution was added so as to maintain the suspension during the grinding at a pH of 10. A dispersion including a burned and ground body and having a solids concentration of 22 mass % was thus obtained.

Next, the resulting dispersion including the burned and ground body was centrifuged at a relative centrifugal acceleration of 675 G for 1 minute by a centrifuge (model CR21G manufactured by Hitachi Koki Co., Ltd.) and precipitated components were removed to obtain a ceria-based composite fine particle dispersion.

Next, the ceria-based composite fine particle dispersion was used to perform a polishing test.

The average particle size of the silica-based fine particles A contained in the dispersion of the silica-based fine particles A used as the material, and impurity contents are shown in Table 5. The silica content and the ceria content in the ceria-based composite fine particles (and parts by mass of ceria with respect to 100 parts by mass of silica), the burning temperature at the time of preparing the ceria-based composite fine particles, the crystallite size, the crystal type, and the specific surface area of the ceria-based composite fine particles, the impurity contents in the ceria-based composite fine particles, the average particle size of the ceria-based composite fine particles, and measurement results of the polishing performance are shown in Tables 6 and 7. The same applies to Examples and Comparative Examples that follow.

The ceria-based composite fine particles contained in the ceria-based composite fine particle dispersion obtained in Example 9 was observed using SEM-EDS and TEM. It was observed that a thin cerium-containing silica layer was present so as to cover the outermost surfaces of the ceria-based composite fine particles. Further, child particles formed on projections of mother particles, child particles formed in portions other than the projections, and child particles each formed in an area including a projection and its surrounding portion were observed. It was further observed from the TEM and SEM images that the cerium-containing silica layer covered the silica surfaces and child particles were dispersed in the layer.

The ceria-based composite fine particles contained in the ceria-based composite fine particle dispersion obtained in Example 9 were measured by X-ray diffractometry. A rather sharp Cerianite crystal pattern was observed in the resulting X-ray diffraction pattern.

Example 10

Example 9 was repeated except that the dispersion of the silica-based fine particles A having projections was replaced by a dispersion of the silica-based fine particles B having projections to prepare a dispersion (6,000 g) having a silica concentration of 3.0 mass %, thereby preparing a ceria-based composite fine particle dispersion. The resulting ceria-based composite fine particle dispersion was measured in the same manner as in Example 9 and measurement results are shown in Table 5 to Table 7.

The ceria-based composite fine particles were subjected to STEM-EDS analysis to observe the shape of the mother particles contained in the ceria-based composite fine particles. The mother particles had a shape having 5 to 25-nm projections.

Example 11

Example 9 was repeated except that the dispersion of the silica-based fine particles A having projections was replaced by a dispersion of the silica-based fine particles C having projections to prepare a dispersion (6,000 g) having a silica concentration of 3.0 mass %, thereby preparing a ceria-based composite fine particle dispersion. The resulting ceria-based composite fine particle dispersion was measured in the same manner as in Example 9 and measurement results are shown in Table 5 to Table 7.

The ceria-based composite fine particles were subjected to STEM-EDS analysis to observe the shape of the mother particles contained in the ceria-based composite fine particles. The mother particles had a shape having 5 to 25-nm projections.

Comparative Example 3

The dispersion of the silica-based fine particles A having projections that had been prepared in Synthesis Example 1 was measured in the same manner as in Example 9. The results are shown in Table 5 to Table 7.

Comparative Example 4

The dispersion of the silica-based fine particles B having projections that had been prepared in Synthesis Example 2 was measured in the same manner as in Example 9. The results are shown in Table 5 to Table 7.

Comparative Example 5

The dispersion of the silica-based fine particles C having projections that had been prepared in Synthesis Example 3 was measured in the same manner as in Example 9. The results are shown in Table 5 to Table 7.

Comparative Example 6

Example 9 was repeated except that the dispersion of the silica-based fine particles A having projections was replaced by the high purity silica-based fine particle dispersion (average particle size: 108 nm; silica-based fine particle dispersion having a silica concentration of 19 mass % and having no projections) prepared in Synthesis Example 3 to prepare a dispersion (6,000 g) having a silica concentration of 3.0 mass %, the mixing temperature was adjusted to 50° C., and the burning temperature was adjusted to 1,090° C., thereby preparing a ceria-based composite fine particle dispersion. The resulting ceria-based composite fine particle dispersion was measured in the same manner as in Example 9 and measurement results are shown in Table 5 to Table 7.

TABLE 5

| Measurement target | | Unit | Example 9 | Example 10 | Example 11 | Comparative Example 3 |
|---|---|---|---|---|---|---|
| Silica-based fine particles | Average particle size of silica-based fine particles | nm | 122 | 111 | 118 | 122 |
| | Impurity contents in silica-based fine particles (as dry amount) Na | ppm | 68 | 85 | 1 ppm or less | 1980 |
| | Ag | ppm | 1 ppm or less | 1 ppm or less | 1 ppm or less | 1 ppm or less |
| | Al | ppm | 77 | 96 | 1 ppm or less | 1130 |
| | Ca | ppm | 1 ppm or less | 1 ppm or less | 1 ppm or less | 1 ppm or less |
| | Cr | ppm | 1 ppm or less | 1 ppm or less | 1 ppm or less | 1 ppm or less |
| | Cu | ppm | 1 ppm or less | 1 ppm or less | 1 ppm or less | 1 ppm or less |
| | Fe | ppm | 1 ppm or less | 1 ppm or less | 1 ppm or less | 1 ppm or less |
| | K | ppm | 1 ppm or less | 1 ppm or less | 1 ppm or less | 1 ppm or less |
| | Mg | ppm | 1 ppm or less | 1 ppm or less | 1 ppm or less | 1 ppm or less |
| | Ni | ppm | 1 ppm or less | 1 ppm or less | 1 ppm or less | 1 ppm or less |
| | Ti | ppm | 78 | 80 | 1 ppm or less | 98 |
| | Zn | ppm | 1 ppm or less | 1 ppm or less | 1 ppm or less | 1 ppm or less |
| | Zr | ppm | 1 ppm or less | 1 ppm or less | 1 ppm or less | 1 ppm or less |
| | U | ppm | 1 ppm or less | 1 ppm or less | 1 ppm or less | 1 ppm or less |
| | Th | ppm | 1 ppm or less | 1 ppm or less | 1 ppm or less | 1 ppm or less |
| | SO$_4$ | ppm | 1 ppm or less | 1 ppm or less | 1 ppm or less | 1 ppm or less |
| | NO$_3$ | ppm | 1 ppm or less | 1 ppm or less | 1 ppm or less | 1 ppm or less |
| | Cl | ppm | 1 ppm or less | 1 ppm or less | 1 ppm or less | 1 ppm or less |
| | F | ppm | 1 ppm or less | 1 ppm or less | 1 ppm or less | 1 ppm or less |

| Measurement target | | Unit | Comparative Example 4 | Comparative Example 5 | Comparative Example 6 |
|---|---|---|---|---|---|
| Silica-based fine particles | Average particle size of silica-based fine particles | nm | 111 | 118 | 113 |
| | Impurity contents in silica-based fine particles (as dry amount) Na | ppm | 5300 | 1 ppm or less | 1 ppm or less |
| | Ag | ppm | 1 ppm or less | 1 ppm or less | 1 ppm or less |
| | Al | ppm | 2360 | 1 ppm or less | 1 ppm or less |
| | Ca | ppm | 1 ppm or less | 1 ppm or less | 1 ppm or less |
| | Cr | ppm | 1 ppm or less | 1 ppm or less | 1 ppm or less |

TABLE 5-continued

|  |  |  |  |  |  |  |
|---|---|---|---|---|---|---|
|  |  | Cu | ppm | 1 ppm or less | 1 ppm or less | 1 ppm or less |
|  |  | Fe | ppm | 1 ppm or less | 1 ppm or less | 1 ppm or less |
|  |  | K | ppm | 1 ppm or less | 1 ppm or less | 1 ppm or less |
|  |  | Mg | ppm | 1 ppm or less | 1 ppm or less | 1 ppm or less |
|  |  | Ni | ppm | 1 ppm or less | 1 ppm or less | 1 ppm or less |
|  |  | Ti | ppm | 102 | 1 ppm or less | 1 ppm or less |
|  |  | Zn | ppm | 1 ppm or less | 1 ppm or less | 1 ppm or less |
|  |  | Zr | ppm | 1 ppm or less | 1 ppm or less | 1 ppm or less |
|  |  | U | ppm | 1 ppm or less | 1 ppm or less | 1 ppm or less |
|  |  | Th | ppm | 1 ppm or less | 1 ppm or less | 1 ppm or less |
|  |  | $SO_4$ | ppm | 1 ppm or less | 1 ppm or less | 1 ppm or less |
|  |  | $NO_3$ | ppm | 1 ppm or less | 1 ppm or less | 1 ppm or less |
|  |  | Cl | ppm | 1 ppm or less | 1 ppm or less | 1 ppm or less |
|  |  | F | ppm | 1 ppm or less | 1 ppm or less | 1 ppm or less |

TABLE 6

| Measurement target | | | Unit | Example 9 | Example 10 | Example 11 | Comparative Example 3 |
|---|---|---|---|---|---|---|---|
| Ceria-based composite fine particles | Impurity contents in ceria-based composite fine particles (as dry amount) | Na | ppm | 31 | 39 | 1 ppm or less | 1980 |
| | | Ag | ppm | 1 ppm or less | 1 ppm or less | 1 ppm or less | 1 ppm or less |
| | | Al | ppm | 35 | 44 | 1 ppm or less | 1130 |
| | | Ca | ppm | 1 ppm or less | 1 ppm or less | 1 ppm or less | 1 ppm or less |
| | | Cr | ppm | 1 ppm or less | 1 ppm or less | 1 ppm or less | 1 ppm or less |
| | | Cu | ppm | 1 ppm or less | 1 ppm or less | 1 ppm or less | 1 ppm or less |
| | | Fe | ppm | 1 ppm or less | 1 ppm or less | 1 ppm or less | 1 ppm or less |
| | | K | ppm | 1 ppm or less | 1 ppm or less | 1 ppm or less | 1 ppm or less |
| | | Mg | ppm | 1 ppm or less | 1 ppm or less | 1 ppm or less | 1 ppm or less |
| | | Ni | ppm | 1 ppm or less | 1 ppm or less | 1 ppm or less | 1 ppm or less |
| | | Ti | ppm | 36 | 37 | 1 ppm or less | 98 |
| | | Zn | ppm | 1 ppm or less | 1 ppm or less | 1 ppm or less | 1 ppm or less |
| | | Zr | ppm | 1 ppm or less | 1 ppm or less | 1 ppm or less | 1 ppm or less |
| | | U | ppm | 1 ppm or less | 1 ppm or less | 1 ppm or less | 1 ppm or less |
| | | Th | ppm | 1 ppm or less | 1 ppm or less | 1 ppm or less | 1 ppm or less |
| | | $SO_4$ | ppm | 1 ppm or less | 1 ppm or less | 1 ppm or less | 1 ppm or less |
| | | $NO_3$ | ppm | 1 ppm or less | 1 ppm or less | 1 ppm or less | 1 ppm or less |
| | | Cl | ppm | 1 ppm or less | 1 ppm or less | 1 ppm or less | 1 ppm or less |
| | | F | ppm | 1 ppm or less | 1 ppm or less | 1 ppm or less | 1 ppm or less |

| Measurement target | | | Unit | Comparative Example 4 | Comparative Example 5 | Comparative Example 6 |
|---|---|---|---|---|---|---|
| Ceria-based composite fine particles | Impurity contents in ceria-based composite fine particles (as dry amount) | Na | ppm | 5300 | 1 ppm or less | 1 ppm or less |
| | | Ag | ppm | 1 ppm or less | 1 ppm or less | 1 ppm or less |
| | | Al | ppm | 2360 | 1 ppm or less | 1 ppm or less |
| | | Ca | ppm | 1 ppm or less | 1 ppm or less | 1 ppm or less |
| | | Cr | ppm | 1 ppm or less | 1 ppm or less | 1 ppm or less |
| | | Cu | ppm | 1 ppm or less | 1 ppm or less | 1 ppm or less |
| | | Fe | ppm | 1 ppm or less | 1 ppm or less | 1 ppm or less |
| | | K | ppm | 1 ppm or less | 1 ppm or less | 1 ppm or less |
| | | Mg | ppm | 1 ppm or less | 1 ppm or less | 1 ppm or less |
| | | Ni | ppm | 1 ppm or less | 1 ppm or less | 1 ppm or less |
| | | Ti | ppm | 102 | 1 ppm or less | 1 ppm or less |
| | | Zn | ppm | 1 ppm or less | 1 ppm or less | 1 ppm or less |
| | | Zr | ppm | 1 ppm or less | 1 ppm or less | 1 ppm or less |
| | | U | ppm | 1 ppm or less | 1 ppm or less | 1 ppm or less |
| | | Th | ppm | 1 ppm or less | 1 ppm or less | 1 ppm or less |
| | | $SO_4$ | ppm | 1 ppm or less | 1 ppm or less | 1 ppm or less |
| | | $NO_3$ | ppm | 1 ppm or less | 1 ppm or less | 1 ppm or less |
| | | Cl | ppm | 1 ppm or less | 1 ppm or less | 1 ppm or less |
| | | F | ppm | 1 ppm or less | 1 ppm or less | 1 ppm or less |

TABLE 7

| Measurement target | | Unit | Example 9 | Example 10 | Example 11 | Comparative Example 3 |
|---|---|---|---|---|---|---|
| Ceria-based composite fine particles | $SiO_2$ content in ceria-based composite fine particles | Mass % | 46.1 | 46.1 | 46.1 | 100 |
| | $CeO_2$ content in ceria-based composite fine particles | Mass % | 53.9 | 53.9 | 53.9 | 0 |
| | Parts by mass of ceria with respect to 100 parts by mass of silica | Parts by mass | 117.4 | 117.4 | 117.4 | — |
| | Burning temperature | ° C. | 980 | 980 | 1090 | — |

TABLE 7-continued

| | Measurement target | | Unit | | | | |
|---|---|---|---|---|---|---|---|
| | | Crystallite size | nm | 15 | 15 | 15 | — |
| | | Average particle size of child particles | nm | 18 | 17 | 18 | — |
| | | Coefficient of variation of ceria child particles | % | 20.8 | 20.9 | 21.5 | — |
| | | Specific surface area of composite fine particles | $m^2/g$ | 42 | 43 | 40 | 38 |
| | | Crystal type | — | Cerianite | Cerianite | Cerianite | Amorphous |
| | | Average particle size of ceria-based composite fine particles | μm | 0.161 | 0.146 | 0.151 | 0.136 |
| Evaluation of polishing | Thermally oxidized film | Polishing rate | nm/min | 640 | 620 | 600 | 65 |
| | | Surface roughness | nm | 0.10 | 0.10 | 0.10 | 0.12 |
| | | Flaws due to polishing | — | Definitely not seen | Definitely not seen | Definitely not seen | Definitely not seen |
| | Al-HD | Scratches | — | Few | Few | Few | Few |

| | Measurement target | | Unit | Comparative Example 4 | Comparative Example 5 | Comparative Example 6 |
|---|---|---|---|---|---|---|
| Ceria-based composite fine particles | $SiO_2$ content in ceria-based composite fine particles | | Mass % | 100 | 100 | 46.1 |
| | $CeO_2$ content in ceria-based composite fine particles | | Mass % | 0 | 0 | 53.9 |
| | Parts by mass of ceria with respect to 100 parts by mass of silica | | Parts by mass | — | — | 117.4 |
| | Burning temperature | | °C. | — | — | 1090 |
| | Crystallite size | | nm | — | — | 15 |
| | Average particle size of child particles | | nm | — | — | 18 |
| | Coefficient of variation of ceria child particles | | % | — | — | 12.8 |
| | Specific surface area of composite fine particles | | $m^2/g$ | 43 | 39 | 37 |
| | Crystal type | | — | Amorphous | Amorphous | Cerianite |
| | Average particle size of ceria-based composite fine particles | | μm | 0.123 | 0.131 | 0.142 |
| Evaluation of polishing | Thermally oxidized film | Polishing rate | nm/min | 60 | 55 | 430 |
| | | Surface roughness | nm | 0.12 | 0.12 | 0.11 |
| | | Flaws due to polishing | — | Definitely not seen | Definitely not seen | Definitely not seen |
| | Al-HD | Scratches | — | Few | Few | A few |

INDUSTRIAL APPLICABILITY

The ceria-based composite fine particles contained in the dispersion of the invention contain no coarse particles and therefore cause few scratches and has a high polishing rate. Therefore, the polishing abrasive grain dispersion containing the dispersion of the invention can be preferably used to polish surfaces of semiconductor devices such as semiconductor substrates and circuit boards. More specifically, the polishing abrasive grain dispersion can be preferably used to flatten semiconductor substrates having a silica film formed thereon.

The invention claimed is:

1. A ceria-based composite fine particle dispersion comprising ceria-based composite fine particles having an average particle size of 50 to 350 nm and having characteristic features of [1] to [5]:

[1] each of the ceria-based composite fine particles comprises a mother particle having a core particle, a cerium-containing silica layer on a surface of the mother particle, and child particles dispersed inside the cerium-containing silica layer but with at least some amount of the child particles having portions of the surfaces thereof exposed to outside of the cerium-containing silica layer of the composite fine particle, the core particle is primarily composed of amorphous silica, and the child particles are primarily composed of crystalline ceria;

[2] the child particles have a coefficient of variation (CV value) of 14 to 40% in their particle size distribution;

[3] the ceria-based composite fine particles have a mass ratio between silica and ceria of 100:11 to 316;

[4] only a ceria crystal phase is detected when the ceria-based composite fine particles are subjected to X-ray diffractometry; and

[5] an average crystallite size of the crystalline ceria, as measured by subjecting the ceria-based composite fine particles to X-ray diffractometry, is 10 to 25 nm.

2. The ceria-based composite fine particle dispersion according to claim 1 comprising the ceria-based composite fine particles further having a characteristic feature of [6]:

[6] silicon atoms enter into solid solution in the crystalline ceria included in the child particles.

3. The ceria-based composite fine particle dispersion according to claim 2, wherein as for cerium atoms and silicon atoms included in the child particles, a relationship of $R_1 < R_2$ (where $R_1$ is a distance between cerium and silicon atoms, and $R_2$ is a distance between cerium atoms) is satisfied.

4. The ceria-based composite fine particle dispersion according to claim 1, wherein the ceria-based composite fine particles include coarse particles having a size of 0.51 μm or more, whose number measured on dry basis is 100,000,000 particles/cc or less.

5. The ceria-based composite fine particle dispersion according to claim 1, wherein impurities are contained in the ceria-based composite fine particles in amounts shown in (a) and (b):

(a) Na, Ag, Al, Ca, Cr, Cu, Fe, K, Mg, Ni, Ti, and Zn are contained in amounts of 100 ppm or less, respectively; and (b) U, Th, Cl, $NO_3$, $SO_4$, and F are contained in amounts of 5 ppm or less, respectively.

6. The ceria-based composite fine particle dispersion according to claim 1, wherein the mother particle has the core particle and projections on its surface, the projections are primarily composed of silica, and the projections have a width of 5 to 25 nm and a height of 5 to 25 nm.

7. The ceria-based composite fine particle dispersion according to claim 6, wherein each of the projections contained in the mother particle has a width of 5 to 25 nm.

8. The ceria-based composite fine particle dispersion according to claim 1, wherein when cation colloidal titration is performed, a streaming potential curve in which a ratio ($\Delta PCD/V$) between an amount of streaming potential change ($\Delta PCD$) and an amount of cation colloidal titrant added at a knick (V) as expressed by formula (1) is in a range of −110.0 to −15.0 is obtained:

$$\Delta PCD/V = (I-C)/V \quad \text{formula (1)}$$

C: streaming potential (mV) at the knick
I: streaming potential (mV) at a starting point of the streaming potential curve; and
V: amount of the cation colloidal titrant added at the knick (ml).

9. A polishing abrasive grain dispersion comprising the ceria-based composite fine particle dispersion according to claim 1.

10. The polishing abrasive grain dispersion according to claim 9, wherein the polishing abrasive grain dispersion is used for flattening a semiconductor substrate having a silica film formed thereon.

11. A method of manufacturing a ceria-based composite fine particle dispersion comprising Steps 1 to 3:
Step 1: a step which comprises stirring a silica-based fine particle dispersion containing silica-based fine particles dispersed in a solvent; and continuously or discontinuously adding a cerium metal salt while keeping a temperature at 0 to 20° C., a pH at 7.0 to 9.0 and an oxidation-reduction potential at 50 to 500 mV, respectively, thereby obtaining a precursor particle dispersion containing precursor particles;
Step 2: a step which comprises drying the precursor particle dispersion; burning the dried precursor particle dispersion at 950 to 1,200° C. to obtain a burned body; and subjecting the resulting burned body to wet grinding at a pH of 8.6 to 10.8 after addition of a solvent to the burned body, thereby obtaining a dispersion including a burned and ground body: and Step 3: a step which comprises subjecting the dispersion including the burned and ground body to centrifugation at a relative centrifugal acceleration of 300 G or more; and subsequently removing precipitated components to obtain the ceria-based composite fine particle dispersion.

12. The method of manufacturing the ceria-based composite fine particle dispersion according to claim 11, wherein Step 1 is a step which comprises stirring the silica-based fine particle dispersion; continuously or discontinuously adding the cerium metal salt while keeping the temperature at 0 to 20° C., the pH at 7.0 to 9.0 and the oxidation-reduction potential at 50 to 500 mV, respectively; and thereafter continuously or discontinuously adding the cerium metal salt while keeping the temperature at 20° C. or more but 98° C. or less, the pH at 7.0 to 9.0 and the oxidation-reduction potential at 50 to 500 mV, respectively, thereby obtaining the precursor particle dispersion.

13. The method of manufacturing the ceria-based composite fine particle dispersion according to claim 11, wherein Step 1 is a step which comprises stirring the silica-based fine particle dispersion; continuously or discontinuously adding the cerium metal salt while keeping the temperature at 20° C. or more but 98° C. or less, the pH at 7.0 to 9.0 and the oxidation-reduction potential at 50 to 500 mV, respectively; and thereafter continuously or discontinuously adding the cerium metal salt while keeping the temperature at 0 to 20° C., the pH at 7.0 to 9.0 and the oxidation-reduction potential at 50 to 500 mV, respectively, thereby obtaining the precursor particle dispersion.

14. The method of manufacturing the ceria-based composite fine particle dispersion according to claim 11, wherein impurities are contained in the silica-based fine particles in Step 1 in amounts shown in (a) and (b):
(a) Na, Ag, Al, Ca, Cr, Cu, Fe, K, Mg, Ni, Ti, and Zn are contained in amounts of 100 ppm or less, respectively; and
(b) U, Th, Cl, $NO_3$, $SO_4$, and F are contained in amounts of 5 ppm or less, respectively.

15. The method of manufacturing the ceria-based composite fine particle dispersion according to claim 11,
wherein Step 1 is a step which comprises stirring the silica-based fine particle dispersion containing the silica-based fine particles having projections with a width of 5 to 25 nm on their surfaces and dispersed in a solvent; and continuously or discontinuously adding the cerium metal salt while keeping the temperature at 3 to 20° C., the pH at 7.0 to 9.0 and the oxidation-reduction potential at 50 to 500 mV, respectively, thereby obtaining the precursor particle dispersion containing the precursor particles and in which a ceria-based composite fine particle dispersion comprising ceria-based composite fine particles having an average particle size of 50 to 350 nm and having characteristic features of [1] to [5]:
[1] each of the ceria-based composite fine particles comprises a mother particle having a core particle, a cerium-containing silica layer on a surface of the mother particle, and child particles dispersed inside the cerium-containing silica layer, the core particle is primarily composed of amorphous silica, and the child particles are primarily composed of crystalline ceria, the mother particle having the core particle and projections on its surface, and the projections being primarily composed of silica;
[2] the child particles have a coefficient of variation (CV value) of 14 to 40% in their particle size distribution;
[3] the ceria-based composite fine particles have a mass ratio between silica and ceria of 100:11 to 316;
[4] a ceria crystal phase is only detected when the ceria-based composite fine particles are subjected to X-ray diffractometry; and
[5] an average crystallite size of the crystalline ceria, as measured by subjecting the ceria-based composite fine particles to X-ray diffractometry, is 10 to 25 nm is obtained.

16. The method of manufacturing the ceria-based composite fine particle dispersion according to claim 15, wherein each of the projections contained in the mother particle has a width of 5 to 25 nm.

* * * * *